(12) United States Patent
Hampden-Smith et al.

(10) Patent No.: US 7,354,471 B2
(45) Date of Patent: ***Apr. 8, 2008

(54) COATED SILVER-CONTAINING PARTICLES, METHOD AND APPARATUS OF MANUFACTURE, AND SILVER-CONTAINING DEVICES MADE THEREFROM

(75) Inventors: Mark J. Hampden-Smith, Albuquerque, NM (US); Toivo T. Kodas, Albuquerque, NM (US); Quint H. Powell, Albuquerque, NM (US); Daniel J. Skamser, Albuquerque, NM (US); James Caruso, Albuquerque, NM (US); Clive D. Chandler, Portland, OR (US)

(73) Assignee: Cabot Corporation, Boston, MA (US)

( * ) Notice: Subject to any disclaimer, the term of this patent is extended or adjusted under 35 U.S.C. 154(b) by 571 days.

This patent is subject to a terminal disclaimer.

(21) Appl. No.: 10/949,601

(22) Filed: Sep. 24, 2004

(65) Prior Publication Data

US 2005/0061107 A1    Mar. 24, 2005

Related U.S. Application Data

(60) Continuation of application No. 10/774,791, filed on Feb. 9, 2004, now Pat. No. 7,004,994, which is a division of application No. 09/668,805, filed on Sep. 22, 2000, now Pat. No. 6,689,186, which is a division of application No. 09/028,277, filed on Feb. 24, 1998, now Pat. No. 6,277,169.

(60) Provisional application No. 60/039,450, filed on Feb. 24, 1997, provisional application No. 60/038,258, filed on Feb. 24, 1997.

(51) Int. Cl.
*B22F 9/06* (2006.01)

(52) U.S. Cl. .................. 75/332; 75/351; 75/355; 75/360

(58) Field of Classification Search ............ 75/332, 75/351, 355, 360
See application file for complete search history.

(56) References Cited

U.S. PATENT DOCUMENTS 3,510,292 A    5/1970   Hardy et al.

(Continued)

FOREIGN PATENT DOCUMENTS

EP    0 537 502    4/1993

(Continued)

OTHER PUBLICATIONS

U.S. Appl. No. 10/904,237 by Kodas et al.; filed Oct. 29, 2004; entitled "Coated Copper-Containing Powders, Methods and Apparatus for Producing Such Powders and Copper-Containing Devices Fabricated From Same".

(Continued)

*Primary Examiner*—George Wyszomierski
(74) *Attorney, Agent, or Firm*—Marsh Fischmann & Breyfogle LLP

(57) ABSTRACT

Provided are silver-containing powders and a method and apparatus for manufacturing the silver-containing particles of high quality, of a small size and narrow size distribution. An aerosol is generated from liquid feed and sent to a furnace, where liquid in droplets in the aerosol is vaporized to permit formation of the desired particles, which are then collected in a particle collector. The aerosol generation involves preparation of a high quality aerosol, with a narrow droplet size distribution, with close control over droplet size and with a high droplet loading suitable for commercial applications.

63 Claims, 51 Drawing Sheets

U.S. PATENT DOCUMENTS

| | | | |
|---|---|---|---|
| 3,620,713 A | 11/1971 | Short | |
| 3,620,714 A | 11/1971 | Short | |
| 3,711,274 A | 1/1973 | Montino et al. | |
| 3,717,481 A | 2/1973 | Short | |
| 3,725,035 A | 4/1973 | Short et al. | |
| 3,748,118 A | 7/1973 | Montino et al. | |
| 3,768,994 A | 10/1973 | Daiga | |
| 3,785,801 A | 1/1974 | Benjamin | |
| 3,816,097 A | 6/1974 | Daiga | |
| 3,830,435 A | 8/1974 | Hill | |
| 3,846,345 A | 11/1974 | Mason et al. | |
| 3,850,612 A | 11/1974 | Montino et al. | |
| 3,865,744 A | 2/1975 | Parker et al. | |
| 3,881,914 A | 5/1975 | Heidelberg | |
| 3,882,050 A | 5/1975 | Niebylski | |
| 3,885,955 A | 5/1975 | Lutz et al. | |
| 3,902,102 A | 8/1975 | Burn | |
| 3,966,463 A | 6/1976 | Fraioli et al. | |
| 3,988,651 A | 10/1976 | Hertz | |
| 4,020,206 A | 4/1977 | Beil | |
| 4,023,961 A | 5/1977 | Douglas et al. | |
| 4,036,634 A | 7/1977 | Fraioli et al. | |
| 4,044,193 A | 8/1977 | Petrow et al. | |
| 4,072,771 A | 2/1978 | Grier, Sr. | |
| 4,089,676 A | 5/1978 | Grundy | |
| 4,096,316 A | 6/1978 | Tamai et al. | |
| 4,115,493 A | 9/1978 | Sakabe et al. | |
| 4,122,232 A | 10/1978 | Kuo | |
| 4,130,671 A | 12/1978 | Nagesh et al. | |
| 4,136,059 A | 1/1979 | Jalan et al. | |
| 4,140,817 A | 2/1979 | Brown | |
| 4,146,957 A | 4/1979 | Toenshoff | |
| 4,223,369 A | 9/1980 | Burn | |
| 4,252,558 A | 2/1981 | Touboul et al. | |
| 4,274,877 A | 6/1981 | Collier et al. | |
| 4,326,889 A | 4/1982 | Sperner | |
| 4,383,852 A | 5/1983 | Yoshizawa | |
| 4,396,420 A | 8/1983 | Schmidberger et al. | |
| 4,396,899 A | 8/1983 | Ohno | |
| 4,409,135 A | 10/1983 | Akimune et al. | |
| 4,410,457 A | 10/1983 | Fujimura et al. | |
| 4,450,188 A | 5/1984 | Kawasumi | |
| 4,464,420 A | 8/1984 | Taguchi et al. | |
| 4,477,296 A | 10/1984 | Nair | |
| 4,517,018 A | 5/1985 | Tadashi et al. | |
| 4,539,041 A | 9/1985 | Figlarz et al. | |
| 4,578,114 A | 3/1986 | Rangaswamy et al. | |
| 4,600,604 A | 7/1986 | Siuta | |
| 4,612,048 A | 9/1986 | German et al. | |
| 4,613,371 A | 9/1986 | Cheney et al. | |
| 4,645,532 A | 2/1987 | Mackiw et al. | |
| 4,670,047 A | 6/1987 | Kopatz et al. | |
| 4,687,511 A | 8/1987 | Paliwal et al. | |
| 4,689,075 A | 8/1987 | Uda et al. | |
| 4,721,524 A | 1/1988 | Sheldon et al. | |
| 4,728,359 A | 3/1988 | Huther et al. | |
| 4,731,110 A | 3/1988 | Kopatz et al. | |
| 4,778,517 A | 10/1988 | Kopatz et al. | |
| 4,781,980 A | 11/1988 | Yoshitake et al. | |
| 4,802,933 A | 2/1989 | Rabinkin | |
| 4,804,167 A | 2/1989 | Kock et al. | |
| 4,810,285 A | 3/1989 | Otsuka et al. | |
| 4,832,912 A | 5/1989 | Yabuki et al. | |
| 4,857,233 A | 8/1989 | Teichmann et al. | |
| 4,863,510 A | 9/1989 | Tamemasa et al. | |
| 4,897,110 A | 1/1990 | Kock et al. | |
| 4,913,731 A | 4/1990 | Kopatz et al. | |
| 4,915,733 A | 4/1990 | Schutz et al. | |
| 4,948,739 A | 8/1990 | Charmot | |
| 4,954,926 A | 9/1990 | Pepin et al. | |
| 5,039,552 A | 8/1991 | Riemer | |
| 5,063,021 A | 11/1991 | Anand et al. | |
| 5,073,409 A | 12/1991 | Anderson et al. | |
| 5,102,452 A | 4/1992 | Taskinen et al. | |
| 5,122,182 A | 6/1992 | Dorfman et al. | |
| 5,126,915 A | 6/1992 | Pepin et al. | |
| 5,139,891 A | 8/1992 | Cowie et al. | |
| 5,147,484 A | 9/1992 | Chance et al. | |
| 5,167,869 A | 12/1992 | Nebe et al. | |
| 5,236,523 A | 8/1993 | Shibata | |
| 5,250,229 A | 10/1993 | Hara et al. | |
| 5,283,104 A | 2/1994 | Aoude et al. | |
| 5,288,430 A | 2/1994 | Amemiya | |
| 5,296,189 A | 3/1994 | Kang et al. | |
| 5,338,330 A | 8/1994 | Polizzotti et al. | |
| 5,350,727 A | 9/1994 | Tsurumi et al. | |
| 5,356,842 A | 10/1994 | Yamakawa et al. | |
| 5,358,585 A | 10/1994 | Shibata | |
| 5,399,432 A | 3/1995 | Schleifstein et al. | |
| 5,402,305 A | 3/1995 | Asada et al. | |
| 5,405,707 A | 4/1995 | Tani et al. | |
| 5,418,193 A | 5/1995 | Tani et al. | |
| 5,420,744 A | 5/1995 | Asada et al. | |
| 5,421,854 A | 6/1995 | Kodas et al. | |
| 5,424,140 A | 6/1995 | Rabinkin | |
| 5,429,657 A | 7/1995 | Glicksman et al. | |
| 5,429,670 A | 7/1995 | Miyoshi | |
| 5,439,502 A | 8/1995 | Kodas et al. | |
| 5,470,373 A | 11/1995 | Edelstein et al. | |
| 5,495,386 A | 2/1996 | Kulkarni | |
| 5,505,991 A | 4/1996 | Schmid et al. | |
| 5,512,379 A | 4/1996 | Kawasumi et al. | |
| 5,523,006 A | 6/1996 | Strumban | |
| 5,545,360 A | 8/1996 | Yang | |
| 5,588,983 A | 12/1996 | Tani et al. | |
| 5,614,346 A | 3/1997 | Adel et al. | |
| 5,616,165 A | 4/1997 | Glicksman et al. | |
| 5,623,725 A | 4/1997 | Disam et al. | |
| 5,728,362 A | 3/1998 | Greuter et al. | |
| 5,741,522 A | 4/1998 | Violante et al. | |
| 5,759,939 A | 6/1998 | Klabunde et al. | |
| 5,763,106 A | 6/1998 | Blanchard et al. | |
| 5,770,126 A | 6/1998 | Singh et al. | |
| 5,852,768 A | 12/1998 | Jacobsen et al. | |
| 5,853,451 A | 12/1998 | Ishikawa | |
| 5,861,136 A | 1/1999 | Glicksman et al. | |
| 5,882,802 A | 3/1999 | Ostolski | |
| 5,928,405 A | 7/1999 | Ranade et al. | |
| 5,958,361 A | 9/1999 | Laine et al. | |
| 5,964,918 A | 10/1999 | Asada et al. | |
| 5,981,069 A | 11/1999 | Tani et al. | |
| 6,007,743 A | 12/1999 | Asada et al. | |
| 6,103,393 A | 8/2000 | Kodas et al. | |
| 6,159,267 A | 12/2000 | Hampden-Smith et al. | |
| 6,165,247 A | 12/2000 | Kodas et al. | |
| 6,277,169 B1 | 8/2001 | Hampden-Smith et al. | |
| 6,316,100 B1 | 11/2001 | Kodas et al. | |
| 6,338,809 B1 | 1/2002 | Hampden-Smith et al. | |
| 6,565,774 B2 | 5/2003 | Ohashi et al. | |
| 6,635,348 B1 | 10/2003 | Hampden-Smith et al. | |
| 6,679,937 B1 | 1/2004 | Kodas et al. | |
| 6,689,186 B1 | 2/2004 | Hampden-Smith et al. | |
| 6,699,304 B1 | 3/2004 | Hampden-Smith et al. | |
| 6,780,350 B1 | 8/2004 | Kodas et al. | |
| 6,830,823 B1 | 12/2004 | Kodas et al. | |
| 7,083,747 B2 * | 8/2006 | Hampden-Smith et al. | .... 264/7 |

FOREIGN PATENT DOCUMENTS

| | | |
|---|---|---|
| EP | 0 540 054 | 5/1993 |
| EP | 0 593 167 | 4/1994 |
| EP | 0 776 717 | 6/1997 |
| JP | 59-103301 | 6/1984 |
| JP | 62-2404 | 1/1987 |

| | | |
|---|---|---|
| JP | 63-31522 | 6/1988 |
| JP | 6-172802 | 6/1994 |
| JP | 8-170112 | 7/1996 |

OTHER PUBLICATIONS

U.S. Appl. No. 10/904,254 by Kodas et al.; filed on Nov. 1, 2004; entitled "Coated Nickel-Containing Powders, Methods and Apparatus for Producing Such Powders and Devices Fabricated From Same".

U.S. Appl. No. 10/904,257 by Kodas et al.; filed on Nov. 1, 2004; entitled Aerosol Method and Apparatus, Coated Particulate Products, and Electronic Devices Made Therefrom.

U.S. Appl. No. 09/991,270 by Kodas et al.; filed on Nov. 9, 2001; entitled "Nickel Powders, Methods for Producing Powders and Devices Fabricated From Same".

U.S. Appl. No. 10/653,722 by Hampden-Smith et al.; filed on Sep. 2, 2003; entitled "Aerosol Method and Apparatus, Particulate Products, And Electronic Devices Made Therefrom".

Ahmadi et al., "Shape-Controlled Synthesis of Colloidal Platinum Nanoparticles", SCIENCE, vol. 272, pp. 1924-1925, Jun. 28, 1996.

Champion et al., "Preparation and Characterization of Nanocrystalline Copper Powders", Scripta Materialia, vol. 35, No. 4, pp. 517-522 (1996).

Che, Shenglei et al., "Evolution of Particle Structure During the Formation of Single-Crystal Spherical Palladium Particles by Spray Pyrolysis" J. Ceram. Soc. Japan, vol. 105, No. 4 (1997), pp. 299-303.

Che, Shenglei et al. "Preparation and Formation Mechanism of Silica-Encapsulated Palladium Particles by Spray Pyrolysis," J. Ceram. Soc. Japan, vol. 105, No. 3 (1997), pp. 269-271 [Japanese text with English Abstract].

Che, Shenglei et al., "Effects of Starting Materials on the Preparation of Spherical Pd Powders by Ultrasonic Spray Pyrolysis," J. Ceram. Soc. Japan, Int. Ed. vol. 104, (1996), pp. 39-44.

Che, Shenglei et al., "Effect of Calcium Modification on the Microstructure and Oxidation Property of Submicron Spherical Palladium Powders," J. Mater. Res., vol. 12, No. 2 (Feb. 1997), pp. 392-397.

Ducamp-Sanguesa, C. et al., "Synthesis and Characterization of Fine and Monodisperse Silver Particles of Uniform Shape," J. Solid State Chem., 100 (1992), pp. 272-280.

Fievet, F. et al., Homogenous and Heterogeneous Nucleations in the Polyol Process For the Preparation of Micron and Submicron Size Metal Particles, Solid State Ionics 32/33, pp. 198-205 (1989).

Fievet et al., "Preparing Monodisperse Metal Powders in Micrometer and Submicrometer Sizes by the Polyol Process", MRS Bulletin, pp. 29-34, Dec. 1989.

Fievet et al., "Controlled Nucleation and Growth of Micrometresize Copper Particles Prepared by the Polyol Process", J. Mater. Chem., vol. 3, pp. 627-632 (1993).

Getty et al., "High Performance Thick Film Gold Conductors", International Journal for Hybrid Microelectronics, vol. 5, No. 2, pp. 487-495, Nov. 1982.

Gurav, Abhijit et al., "Aerosol Processing of Materials," Aerosol Sci. & Tech., vol. 19 (1993), pp. 411-452.

Hsu et al., "Preparation and Characterization of Uniform Particles of Pure and Coated Metallic Copper", Powder Technology, vol. 63, pp. 265-275 (1990).

Jain, Sanjeev et al., "In Situ Formation of Coated and Composite Palladium Particles via Spray Pyrolysis," J. Electrochem. Soc., vol. 143, No. 11 (Nov. 1996), pp. 3762-3770.

Kang, Yun Chan and Seung Bin Park, "Morphology and Size of Fine Silver Particles Prepared By Using the Filter Expansion Aerosol Generator," J. Korean Institute of Chemical Engineers, vol. 34, No. 2 (Apr. 1996), pp. 183-187 [Korean Text, with English Abstract].

Majumdar et al., "Gold Particle Generation by Spray Pyrolysis", Adv. Mater., vol. 8, No. 12., pp. 1020-1022, 1996.

Nagashima et al., "Preparation of Fine, Spherical Copper Particles By Spray-Pyrolysis Technique", Nippon Kagaku Kaishi, vol. 1, pp. 17-24 (1990) (translation missing every other page).

Nagashima et al., "Preparation of Fine Ni Particles by the Spray-Pyrolysis Technique and Their Film Forming Properties in the Thick Film Method", Journal of Materials Research, vol. 5, No. 12, (1990) pp. 2828-2834.

Nagashima, K. et al., "Properties of Conductive Films Made From Fine Spherical Silver-Palladium Alloy Particles," J. Mater. Sci., 26 (1991), pp. 2477-2482.

Park, Seung Bin et al., "Preparation of Fine Silver Particles by Decomposing Droplets Produced From Filter Expansion Aerosol Generator," J. Aerosol Sci, vol. 26, Suppl. 1 (1995), pp. S605-S606.

Pluym, Tammyh C. et al., "Silver-Palladium Alloy Particle Production By Spray Pyrolysis," J. Mater. Res., vol. 10, No. 7 (Jul. 1995), pp. 1661-1673.

Pluym, T.C. et al., "Solid Silver Particle Production by Spray Pyrolysis," J. Aerosol Sci., vol. 24, No. 3 (1993), pp. 383-392.

Seshadri et al., "Preparation of Monodispersed, Submicron Gold Particles", Materials Research Bulletin, vol. 29, No. 7, pp. 795-799, 1994.

Silvert et al., "Synthesis of Monodisperse Submicronic Gold Particles by the Polyol Process", Solid State Ionics, vol. 82 (1995), pp. 53-60.

Stopic et al., "Preparation of Nickel Submicron Powder by Ultrasonic Spray Pyrolysis", The International Journal of Powder Metallurgy, vol. 32, No. 1, pp. 59-65, (1996).

Viau et al., "Preparation and Microwave Characterization of Spherical and Monodisperse Co-Ni Particles", Journal of Magnetism and Magnetic Materials, vol. 140-144; pp. 377-378, (1995).

Van Rheenan et al., "Synthesis and Characterization of Small Platinum Particles Formed by the Chemical Reduction of Chloroplatinic Acid", J. of Solid State Chemistry, vol. 67, Issue 1, Mar. 1987 (Abstract only).

Wang, Sea Fue et al., "Silver-Palladium Thick-Film Conductors," J. Am. Ceram. Soc., vol. 77, No. 12 (1994), pp. 3051-3072.

"Researchers Succeed in Controllings Size and Shape of Colloidal Platinum Nanoparticles", Georgia Tech Research News, Jun. 28, 1996.

* cited by examiner

102 → | AEROSOL GENERATOR 106 | →108→ | FURNACE 110 | →112→ | PARTICLE COLLECTOR 114 | →116

102 → AEROSOL GENERATOR 106 → 108 → AEROSOL CONCENTRATOR 236 → 240 → FURNACE 110 → 112 → PARTICLE COLLECTOR 114 → 116

104 → (into Aerosol Generator)

238 ← (from Aerosol Concentrator)

FIG. 25

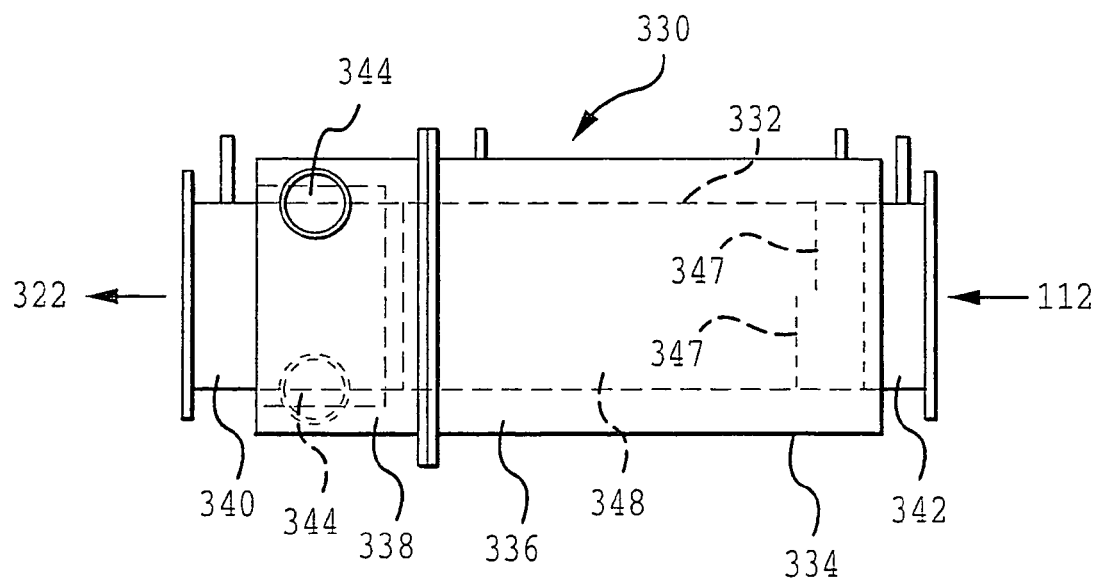
FIG. 41
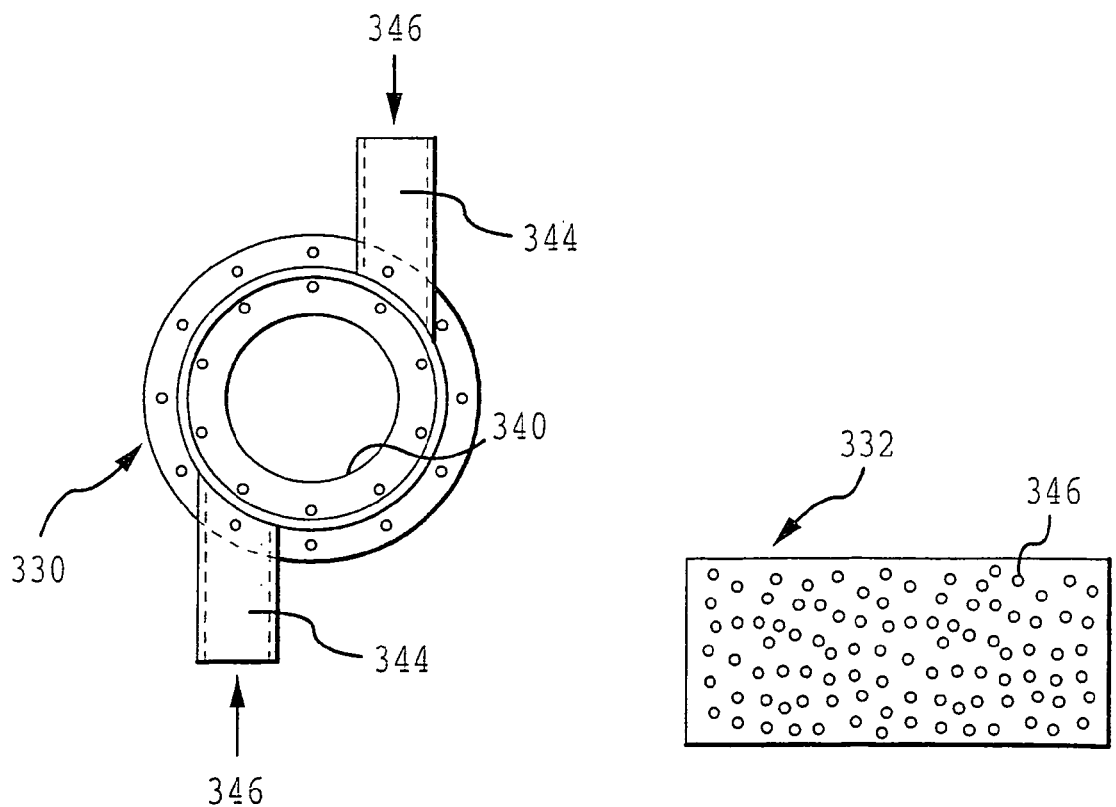
FIG. 42
FIG. 43

104 →

AEROSOL GENERATOR 106 →108→ FURNACE 110 →112→ PARTICLE COATER 350 →352→ PARTICLE COLLECTOR 114 →116

FIG. 45

AEROSOL GENERATOR 106 → 108 → FURNACE 110 → 112 → PARTICLE MODIFIER 360 → 362 → PARTICLE COLLECTOR 114 → 116

102 → AEROSOL GENERATOR 106 → 108 → 119 → FURNACE 110 → 112 → PARTICLE COLLECTOR 114 → 116

COATED SILVER-CONTAINING PARTICLES, METHOD AND APPARATUS OF MANUFACTURE, AND SILVER-CONTAINING DEVICES MADE THEREFROM

CROSS-REFERENCE TO RELATED APPLICATIONS

This application is a continuation of U.S. patent application Ser. No. 10/774,791 filed on Feb. 9, 2004, now U.S. Pat. No. 7,004,994 which is a divisional of U.S. patent application Ser. No. 09/668,805 filed on Sep. 22, 2000, now U.S. Pat. No. 6,689,186, which is a divisional of U.S. patent application Ser. No. 09/028,277, now U.S. Pat. No 6,277, 169, filed on Feb. 24, 1998, which claims priority to U.S. Provisional Patent Application No. 60/039,450 filed Feb. 24, 1997 and to U.S. Provisional Patent Application No. 60/038, 258, filed Feb. 24, 1997. Each of the foregoing referenced patent applications is incorporated by reference herein as if set forth below in its entirety.

STATEMENT REGARDING FEDERALLY-SPONSORED RESEARCH/DEVELOPMENT

This invention was made with Government support under contracts N00014-95-C-0278 and N00014-96-C-0395 awarded by the Office of Naval Research. The Government has certain rights in the invention.

FIELD OF THE INVENTION

The present invention involves an aerosol method for producing silver-containing particulate materials, powders including silver-containing particles producible by the method, uses of the powders in the manufacture of electronic and other devices and the devices so manufactured.

BACKGROUND OF THE INVENTION

Silver particles are widely used in the manufacture of electrically conductive thick films for electronic devices and for other uses. Examples of thick film applications or silver particles include to make internal electrodes in multi-layer capacitors; interconnections in multi-chip components; conductive lines in auto defoggers/deicers, photovoltaic modules, resistors, inductors, antennas and membrane switches; electromagnetic shielding (such as in cellular telephones); thermally conductive films; light reflecting films; and conducting adhesives. A trend continues, however, to produce ever smaller particles for these and other applications. Generally, desirable features in such small particles include a small particle size; a narrow particle size distribution; a dense, spherical particle morphology; and a crystalline grain structure. Existing technology for manufacturing silver-containing particles could, however, be improved with respect to attaining all, or substantially all, of these desired features for particles used in thick film applications.

One method that has been used to make small particles is to precipitate the particles from a liquid medium. Such liquid precipitation techniques are often difficult to control to produce particles with the desired characteristics. It is especially difficult by the liquid precipitation route to obtain particles having dense, spherical particle morphology and with good crystallinity.

Aerosol methods have also been used to make small silver particles. One aerosol method for making small particles is spray pyrolysis, in which an aerosol spray is generated and then converted in a reactor to the desired particles. Spray pyrolysis systems involving silver have, however, been mostly experimental, and unsuitable for commercial particle production. Furthermore, control of particle size distribution is a concern with spray pyrolysis. Also, spray pyrolysis systems are often inefficient in the use of carrier gasses that suspend and carry liquid droplets of the aerosol. This inefficiency is a major consideration for commercial applications of spray pyrolysis systems.

There is a need for improved silver-containing powders, for improved methods of manufacturing silver-containing powders and for improved products incorporating or made using improved silver-containing powders.

SUMMARY OF THE INVENTION

The present invention provides high quality, micro-size silver-containing particles of a variety of compositions and particle morphologies, and with carefully controlled particle size and size distribution, and an aerosol method for producing the particles. The particles are useful for making a variety of products.

Through careful control of the aerosol generation, and particularly when used in combination with other features of the present invention, the present invention permits preparation of very high quality powders of silver-containing particles that preferably have a weight average size in a range of from about 0.1 micron to about 4 microns, and for many applications with a range of from about 0.5 micron to about 2 microns in size. The powders have a narrow size distribution such that typically at least about 90 weight percent of the particles are smaller than about twice the weight average size of the particles. Furthermore, typically less than about 10 weight percent, and preferably less than about 5 weight percent, of the particles are smaller than about one-half the weight average size.

The invention includes both single-phase and multi-phase, or composite, particles useful for a variety of product applications, including for use as catalysts and in the preparation of thick film paste formulations, such as are used for depositing silver-containing films during manufacture of various electronic and other products. Multi-phase materials may be in a variety of morphological forms, for example in an intimate mixture of two or more phases or with one phase forming a surface coating over a core including another phase.

One preferred class of multi-phase particles includes a metallic silver-containing phase and a nonmetallic phase, which frequently includes a ceramic material. The nonmetallic phase could be in the form of a coating around a core of the metallic phase, in the form of small domains dispersed in a matrix of the metallic phase, or in some other form. A variety of ceramic materials can be used to effect a variety of beneficial modifications to particle properties, such as a modification of densification/sintering properties for improved compatibility and bonding with ceramic layers used in electronic devices, and especially when the silver-containing powder is used to make internal electrodes in multi-layer capacitors. An important use of these multi-phase particles is to reduce or delay film shrinkage during firing in the manufacture of electronic devices. One preferred group of ceramic materials for use in the multi-phase particles are titanates, as are frequently used in dielectric layers of multi-layer capacitors. Another preferred group of ceramic materials for use in multi-phase particles includes silica, alumina, titania and zirconia.

The silver in the powder, whether in single phase or multi-phase particles, is typically present in a metallic phase. In one embodiment, the particles in the powder include a high quality silver alloy, with one preferred alloy being with palladium. It has been found that the quality of the alloy is highly dependent upon the manner in which the process is carried out and the specific processing conditions. When preparing particles including a silver/palladium alloy, the reactor temperatures should preferably be in the range of from about 900° C. to about 1200° C., with even narrower temperature ranges being more preferred.

The process of the present invention for making the silver-containing particles involves processing of a high quality aerosol including a silver-containing precursor. The aerosol includes droplets of controlled size suspended in and carried by a carrier gas. In a thermal reactor, typically a furnace reactor, the liquid of the droplets is vaporized, permitting formation of the desired particles in an aerosol state. According to one embodiment of the present invention, an aerosol at a high droplet loading and at a high volumetric flow rate is fed to a reactor, where particles are formed. In addition to the high droplet loading and high volumetric flow rate, the aerosol also includes a narrow size distribution of droplets such that the particles exiting the reactor also have a narrow size distribution, with preferably at least about 75 weight percent, and more preferably at least 90 weight percent, of the particles being smaller than about twice the weight average particle size.

With the process, and accompanying apparatus, of the present invention, it is possible to produce high quality silver-containing powders at a high production rate using spray pyrolysis. This represents a significant advancement relative to the small laboratory-scale processes currently used.

An important aspect of the method of the present invention is aerosol generation, in which a high quality aerosol is produced having a controlled droplet size and narrow droplet size distribution, but at a high volumetric flow rate and with high droplet loading. An ultrasonic generator design is provided for generation of the high quality aerosol at a high generation rate.

The aerosol generation is particularly advantageous for producing aerosol droplets having a weight average size of from about 1 micron to about 5 microns, preferably with no greater than about 30 weight percent of the droplets being larger than about two times the average droplet size.

High quality aerosol production is accomplished also with high droplet loading in the aerosol. The droplet loading is preferably greater than about $5\times10^6$ droplets per cubic centimeter of the aerosol. Furthermore, the aerosol typically includes greater than about 0.083 milliliters of droplets in the aerosol per liter of carrier gas in the aerosol. This high droplet loading is also accomplished at a high aerosol production rate, which is typically at a rate of greater than about 25 milliliters of droplets of liquid feed per hour per ultrasonic transducer. Total aerosol flow rates are typically larger than about 0.5 liter per hour of liquid droplets at the high droplet loading and with the narrow droplet size distribution.

Aerosol generation for particle manufacture of the present invention is believed to represent a significant improvement relative to current powder manufacture operations, which are mainly for experimental purposes. These laboratory-scale processes typically use aerosols at only low rates and normally without a high aerosol density. With the aerosol generator of the present invention, however, high rates of droplet production are possible with efficient use of carrier gas. In one embodiment, the aerosol generator includes a plurality of ultrasonic transducers underlying a reservoir of liquid feed that is ultrasonically energized during operation. The aerosol generator includes multiple gas delivery outlets, or ports, for delivering the carrier gas to different portions of a liquid feed reservoir, so that droplets generated from the different portions of the reservoir are efficiently swept away to form the aerosol. A preferred embodiment includes at least one gas delivery outlet per ultrasonic transducer.

The process and the apparatus of the present invention are also capable of producing silver-containing powder at a high rate without high losses of silver in the system. This is accomplished through careful control of process equipment and operating parameters in a manner to reduce system residence times to inhibit high production losses. An important aspect of the process of the present invention is operation of a pyrolysis furnace at high flow rates and in a manner to reduce the potential for losses of silver. When operating at the high Reynolds numbers typically encountered in the furnace with the present invention, it is important to carefully control the furnace temperature and temperature profile. For example, it is important to operate the furnace so that both the average maximum stream temperature and the maximum furnace wall temperature are low enough to avoid undesirable volatilization of silver or other components.

In a further embodiment aspect of the process and apparatus of the invention, the particles may be advantageously cooled for collection in a manner to reduce potential for silver losses. The particle cooling may advantageously be accomplished with a very short residence time by radial feed of a quench gas into a cooling conduit through which the particle-containing aerosol stream flows. In this manner, a cool gas buffer is developed around the inner walls of the cooling conduit, thereby reducing thermophoretic losses of particles during cooling.

Also, the particle manufacturing process of the present invention is versatile and may be adapted for preparation of a variety of silver-containing particulate materials for a variety of applications. In that regard, one embodiment of the present invention includes concentration of the aerosol by at least a factor of about two, and more preferably by a factor of greater than about five, before introduction of the aerosol into the reactor. In this manner, substantial savings may be obtained through lower heating requirements in the reactor, lower cooling requirements for product streams from the reactor and smaller process equipment requirements.

In another embodiment, the process of the present invention involves classification by size of the droplets in the aerosol prior to introduction into the pyrolysis furnace. Preferably, droplets larger than about three times the average droplet size are removed, and even more preferably droplets larger than about two times the average droplet size are removed.

In yet another embodiment of the present invention, the particles are modified following manufacture, while still dispersed in an aerosol stream, prior to particle collection. In one aspect, the particles may be subjected to a coating following manufacture, such as by chemical vapor deposition or gas-to-particle conversion processes. Preferred coating processes include chemical vapor deposition and physical vapor deposition. In a further aspect, the particle modification may involve a structural modification, such as a post manufacture anneal to improve crystallinity or to alter particle morphology, and without agglomeration of the particles.

The present invention also includes thick film paste formulations including the silver-containing particles of the present invention and processes of manufacturing films from formulations. Also included in the present invention are methods for making electronic and other products using the palladium-containing particles. The present invention provides a variety of products made using powder of the present invention. These products include electronic devices, such as multi-layer capacitors and multi-chip modules, and other products, such as catalysts, electrochemical cells and others. Also, the powders are particularly useful for making high definition patterned circuit lines with a close line spacing.

BRIEF DESCRIPTION OF THE DRAWINGS

FIG. 1 is a process block diagram showing one embodiment of the process of the present invention.

FIG. 25 is a process block diagram of one embodiment in the present invention including an aerosol concentrator.

FIG. 49 is a block diagram of one embodiment of the process of the present invention including the addition of a dry gas between the aerosol generator and the furnace.

DETAILED DESCRIPTION OF THE INVENTION

Figure 2:
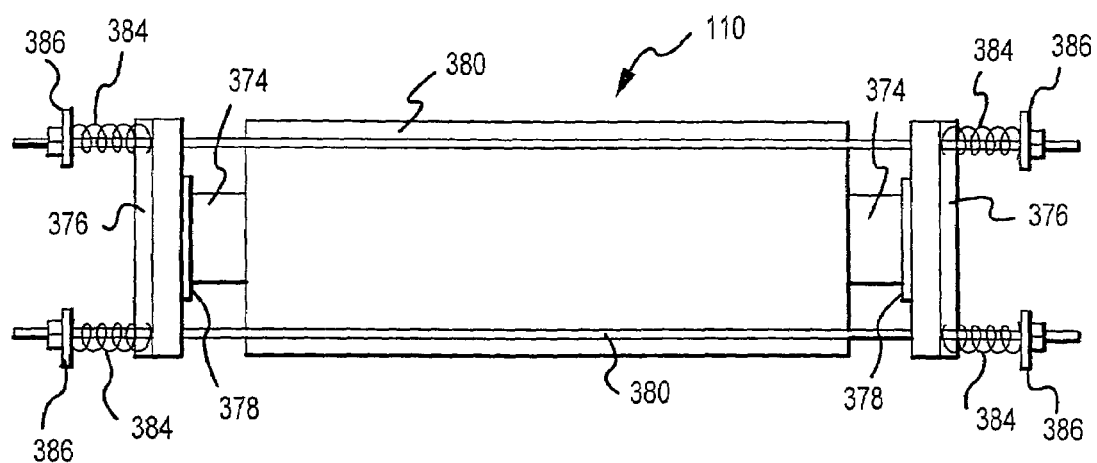
FIG. 2 is a side view of a furnace and showing one embodiment of the present invention for sealing the end of a furnace tube.

In one aspect, the present invention provides a method for preparing silver-containing particulate product, and particularly silver-containing particulate product with a small size average particle size and narrow size distribution. A feed of liquid-containing, flowable medium, including a silver-containing precursor, is converted to aerosol form, with droplets of the medium being dispersed in and suspended by a carrier gas. Liquid from the droplets in the aerosol is then removed to permit formation in a dispersed state of the desired silver-containing particles. The liquid may be removed by vaporization at an elevated temperature. Alternatively, the liquid may be removed by mixing the aerosol with a dry gas, causing vaporization of the liquid to humidify the dry gas. In one embodiment, the silver-containing particles are subjected, while still in a dispersed state, to compositional or structural modification, if desired. Compositional modification may include, for example, coating the silver-containing particles. Structural modification may include, for example, crystallization, recrystallization or morphological alteration of the silver-containing particles. The term powder is often used herein to refer to the particulate product of the present invention. The use of the term powder does not indicate, however, that the particulate product must be dry or in any particular environment. The particulate product may be in a wet environment, such as in a slurry, or in a dry environment.

The process of the present invention is particularly well suited for the production of particulate products of finely divided silver-containing particles, with the particles having a weight average size, for most applications, in a range having a lower limit of about 0.1 micron, preferably about 0.3 micron, more preferably about 0.5 micron and most preferably about 0.8 micron; and having an upper limit of about 4 microns, preferably about 3 microns, more preferably about 2.5 microns and more preferably about 2 microns. A particularly preferred range for many applications is a weight average size of from about 0.5 micron to about 3 microns, and more particularly from about 0.5 micron to about 2 microns. For some applications, however, other weight average particle sizes may be particularly preferred.

In addition to making particles within a desired range of weight average particle size, with the present invention the silver-containing particles may be produced with a desirably narrow size distribution, thereby providing size uniformity that is desired for many applications involving the use of silver-containing powder, especially for thick film applications in microelectronic products.

In addition to control over particle size and size distribution, the method of the present invention provides significant flexibility for producing silver-containing particles of varying composition, crystallinity and morphology. For example, the present invention may be used to produce homogeneous particles involving only a single, silver-containing metallic phase, or multi-phase particles including one or more material phase in addition to a silver-containing metallic phase. In the case of multi-phase particles, the phases may be present in a variety of morphologies. For example, one phase may be uniformly dispersed throughout a matrix of another phase. Alternatively, one phase may form an interior core while another phase forms a coating that surrounds the core. Other morphologies are also possible, as discussed more fully below.

Referring now to FIG. 1, one embodiment of the process of the present invention is described. A liquid feed 102, including a silver-containing precursor, and a carrier gas 104 are fed to an aerosol generator 106 where an aerosol 108 is produced. The aerosol 108 is then fed to a furnace 110 where liquid in the aerosol 108 is removed to produce silver-containing particles 112 that are dispersed in and suspended by gas exiting the furnace 110. The particles 112 are then collected in a particle collector 114 to produce a silver-containing particulate product 116.

As used herein, the liquid feed 102 is a feed that includes one or more flowable liquids as the major constituent(s), such that the feed is a flowable medium. The liquid feed 102 need not comprise only liquid constituents. The liquid feed 102 may comprise only constituents in one or more liquid phase, or it may also include particulate material suspended in a liquid phase. The liquid feed 102 must, however, be capable of being atomized to form droplets of sufficiently small size for preparation of the aerosol 108. Therefore, if the liquid feed 102 includes suspended particles, those particles should be relatively small in relation to the size of droplets in the aerosol 108. Such suspended particles should typically be smaller than about 1 micron in size, preferably smaller than about 0.5 micron in size, and more preferably smaller than about 0.3 micron in size and most preferably smaller than about 0.1 micron in size. Most preferably, the suspended particles should be able to form a colloid. The suspended particles could be finely divided particles, or could be agglomerate masses comprised of agglomerated smaller primary particles. For example, 0.5 micron particles could be agglomerates of nanometer-sized primary particles. When the liquid feed 102 includes suspended particles, the particles typically comprise no greater than about 25 to 50 weight percent of the liquid feed.

As noted, the liquid feed 102 includes at least one silver-containing precursor for preparation of the particles 112. The silver-containing precursor may be a substance in either a liquid or solid phase of the liquid feed 102. Typically, the silver-containing precursor will be a silver-containing material, such as a salt, dissolved in a liquid solvent of the liquid feed 102. The precursor may undergo one or more chemical reactions in the furnace 110 to assist in production of the particles 112. Alternatively, the precursor material may contribute to formation of the particles 112 without undergoing chemical reaction. This could be the case, for example, when the liquid feed 102 includes, as a precursor material, suspended particles that are not chemically modified in the furnace 110. In any event, the particles 112 comprise silver originally contributed by the silver-containing precursor of the liquid feed 102.

The liquid feed 102 may include multiple precursor materials, which may be present together in a single phase or separately in multiple phases. For example, the liquid feed 102 may include multiple precursors in solution in a single liquid vehicle. Alternatively, one precursor material could be in a solid particulate phase and a second precursor material could be in a liquid phase. Also, one precursor material could be in one liquid phase and a second precursor material could be in a second liquid phase, such as could be the case when the liquid feed 102 comprises an emulsion. When the liquid feed 102 includes multiple precursors, more than one of the precursors may contain silver, or one or more of the precursors may contain a component other than silver that is contributed to the particles 112. Different components contributed by different precursors may be present in the particles together in a single material phase, or the different components may be present in different material phases when the particles 112 are composites of multiple phases. Preferred silver precursors include silver salts, such as nitrate and acetate salts, which are soluble in aqueous liquids.

When the liquid feed 102 includes a soluble silver precursor, the silver precursor solution should be unsaturated to avoid the formation of precipitates. Solutions of silver salts will typically be used in concentrations in a range to provide a solution including from about 1 to about 50 weight percent silver. Most often, the liquid feed will include a solution with from about 5 weight percent to about 40 weight percent dissolved silver, and more preferably to about 30 weight percent silver. Preferably the solvent is aqueous-based for ease of operation, although other solvents, such as toluene or other organic solvents, may be desirable for specific materials. The use of organic solvents, however, can sometimes lead to undesirable carbon contamination in the silver-containing particles. The pH of the aqueous-based solutions can be adjusted to alter the solubility characteristics of the precursor or precursors in the solution.

The carrier gas 104 may comprise any gaseous medium in which droplets produced from the liquid feed 102 may be dispersed in aerosol form. Also, the carrier gas 104 may be inert, in that the carrier gas 104 does not participate in formation of the particles 112. Alternatively, the carrier gas may have one or more active component(s), such as hydrogen gas, that contribute to formation of the particles 112. In that regard, the carrier gas may include one or more reactive components that react in the furnace 110 to contribute to formation of the particles 112.

The aerosol generator 106 atomizes the liquid feed 102 to form droplets in a manner to permit the carrier gas 104 to sweep the droplets away to form the aerosol 108. The droplets comprise liquid from the liquid feed 102. The droplets may, however, also include nonliquid material, such as one or more small particles held in the droplet by the liquid. For example, when the particles 112 are composite, or multi-phase, particles, one phase of the composite may be provided in the liquid feed 102 in the form of suspended precursor particles and a second phase of the composite may be produced in the furnace 110 from one or more precursors in the liquid phase of the liquid feed 102. Furthermore the precursor particles could be included in the liquid feed 102, and therefore also in droplets of the aerosol 108, for the purpose only of dispersing the particles for subsequent compositional or structural modification during or after processing in the furnace 110.

An important aspect of the present invention is generation of the aerosol 108 with droplets of a small average size, narrow size distribution. In this manner, the silver-containing particles 112 may be produced at a desired small size with a narrow size distribution, which are advantageous for use in thick film deposition and other applications.

The aerosol generator 106 is capable of producing the aerosol 108 such that it includes droplets having a weight average size in a range having a lower limit of about 1 micron and preferably about 2 microns; and an upper limit of about 10 microns, preferably about 7 microns, more preferably about 5 microns and most preferably about 4 microns. A weight average droplet size in a range of from about 2 microns to about 4 microns is more preferred for most applications, with a weight average droplet size of about 3 microns being particularly preferred for some applications. The aerosol generator is also capable of producing the aerosol 108 such that it includes droplets in a narrow size distribution. Preferably, the droplets in the aerosol are such that at least about 70 percent (more preferably at least about 80 weight percent and most preferably at least about 85 weight percent) of the droplets are smaller than about 10 microns and more preferably at least about 70 weight percent (more preferably at least about 80 weight percent and most preferably at least about 85 weight percent) are smaller than about 5 microns. Furthermore, preferably no greater than about 30 weight percent, more preferably no greater than about 25 weight percent and most preferably no greater than about 20 weight percent, of the droplets in the aerosol 108 are larger than about twice the weight average droplet size.

Another important aspect of the present invention is that the aerosol 108 may be generated without consuming excessive amounts of the carrier gas 104. The aerosol generator 106 is capable of producing the aerosol 108 such that it has a which loading, or high concentration, of the liquid feed 102 in droplet form. In that regard, the aerosol 108 preferably includes greater than about $1 \times 10^6$ droplets per cubic centimeter of the aerosol 108, more preferably greater than about $5 \times 10^6$ droplets per cubic centimeter, still more preferably greater than about $1 \times 10^7$ droplets per cubic centimeter, and most preferably greater than about $5 \times 10^7$ droplets per cubic centimeter. That the aerosol generator 106 can produce such a heavily loaded aerosol 108 is particularly surprising considering the high quality of the aerosol 108 with respect to small average droplet size and narrow droplet size distribution. Typically, droplet loading in the aerosol is such that the volumetric ratio of liquid feed 102 to carrier gas 104 in the aerosol 108 is larger than about 0.04 milliliters of liquid feed 102 per liter of carrier gas 104 in the aerosol 108, preferably larger than about 0.083 milliliters of liquid feed 102 per liter of carrier gas 104 in the aerosol 108, more preferably larger than about 0.167 milliliters of liquid feed 102 per liter of carrier gas 104, still more preferably larger than about 0.25 milliliters of liquid feed 102 per liter of carrier gas 104, and most preferably larger than about 0.333 milliliters of liquid feed 102 per liter of carrier gas 104.

This capability of the aerosol generator 106 to produce a heavily loaded aerosol 108 is even more surprising given the high droplet output rate of which the aerosol generator 106 is capable, as discussed more fully below. It will be appreciated that the concentration of liquid feed 102 in the aerosol 108 will depend upon the specific components and attributes of the liquid feed 102 and, particularly, the size of the droplets in the aerosol 108. For example, when the average droplet size is from about 2 microns to about 4 microns, the droplet loading is preferably larger than about 0.15 milliliters of aerosol feed 102 per liter of carrier gas 104, more preferably larger than about 0.2 milliliters of liquid feed 102 per liter of carrier gas 104, even more preferably larger than about 0.2 milliliters of liquid feed 102 per liter of carrier gas 104, and most preferably larger than about 0.3 milliliters of liquid feed 102 per liter of carrier gas 104. When reference is made herein to liters of carrier gas 104, it refers to the volume that the carrier gas 104 would occupy under conditions of standard temperature and pressure.

The furnace 110 may be any suitable device for heating the aerosol 108 to evaporate liquid from the droplets of the aerosol 108 and thereby permit formation of the particles 112. For most applications, maximum average stream temperatures in the furnace 110 will generally be in a range of from about 800° C. to about 1500° C., and preferably in the range of from about 900° C. to about 1300° C. The maximum average stream temperature refers to the maximum average temperature that an aerosol stream attains while flowing through the furnace. This is typically determined by a temperature probe inserted into the furnace. Maximum average stream temperatures are preferably in a range having a lower limit of about 900° C., more preferably about 950° C. and most preferably about 975° C.; and having an upper limit of about 1200° C., more preferably about 1100° C. and most preferably about 1050° C. It has been found that the use of maximum average stream temperatures in the furnace 110 in the preferred ranges results in particularly high quality particles 112.

Although longer residence times are possible, residence time in the heating zone of the furnace 110 of shorter than about 4 seconds is typical, with shorter than 2 seconds being preferred, shorter than about 1 second being more preferred and shorter than about 0.5 second being most preferred. The residence time should be long enough, however, to assure that the particles 112 attain the desired maximum average stream temperature for a given heat transfer rate. In that regard, with extremely short residence times, higher furnace temperatures could be used to increase the rate of heat transfer so long as the particles 112 attain a maximum average temperature within the desired stream temperature range. That mode of operation, however, is not preferred. Also, it is preferred that the maximum average stream temperature not be attained in the furnace 110 until substantially at the end of the heating zone in the furnace 110. For example, the heating zone will often include a plurality of heating sections that are each independently controllable. The maximum average stream temperature should preferably not be attained until the final heating section, and more preferably until substantially at the end of the last heating section. This is important to reduce the potential for thermophoretic losses of material. Also, it is noted that, when used herein, residence time refers to the actual time for a material to pass through the relevant process equipment. In the case of the furnace, this includes the effect of increasing velocity with gas expansion on heating.

Typically, the furnace 110 will be a tube-shaped furnace, so that the aerosol 108 moving into and through the furnace does not encounter sharp edges on which droplets could collect. Loss of droplets to collection at sharp surfaces results in a lower yield of particles 112. More important, however, the accumulation of liquid at sharp edges can result in re-release of undesirably large droplets back into the aerosol 108, which can cause contamination of the particulate product 116 with undesirably large particles. Also, over time, such liquid collection at sharp surfaces can cause fouling of process equipment, impairing process performance.

The furnace 110 may include a heating tube made of any suitable material. The tube material may be a ceramic material, for example, mullite, silica or alumina. Alternatively, the tube may be metallic. Advantages of using a metallic tube are a low cost, ability to withstand steep temperature gradients and large thermal shocks, machinability and weldability, and ease of providing a seal between the tube and other process equipment. Disadvantages of using a metallic tube include limited operating temperature and increased reactivity in some reaction systems.

When a metallic tube is used in the furnace 110, it is preferably a high nickel content stainless steel alloy, such as a 330 stainless steel, or a nickel-based super alloy. As noted, one of the major advantages of using a metallic tube is that the tube is relatively easy to seal with other process equipment. In that regard, flange fittings may be welded directly to the tube for connecting with other process equipment. Metallic tubes are generally preferred for making particles that do not require a maximum tube wall temperature of higher than about 1100° C. during manufacture. Thus metallic tubes are suitable, and preferred, for making most silver-containing powders.

When higher temperatures are required, ceramic tubes are typically used. One major problem with ceramic tubes, however, s that the tubes can be difficult to seal with other process equipment, especially when the ends of the tubes are maintained at relatively high temperatures, as is often the case with the present invention.

Figure 3:
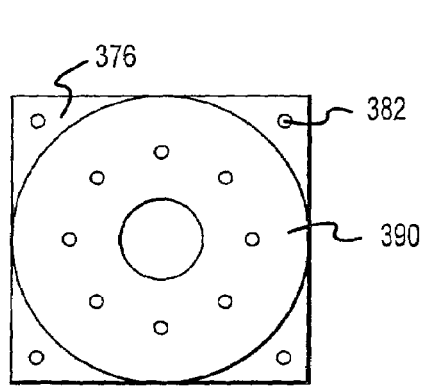
FIG. 3 is a view of the side of an end cap that faces away from the furnace shown in FIG. 2.
Figure 4:
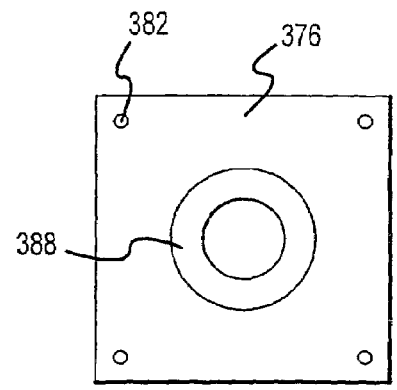
FIG. 4 is a view of the side of an end cap that faces toward the furnace shown in FIG. 2.

One configuration for sealing a ceramic tube is shown in FIGS. 2, 3 and 4. The furnace 110 includes a ceramic tube 374 having an endcap 376 fitted to each end of the tube 374, with a gasket 378 disposed between corresponding ends of the ceramic tube 374 and the endcaps 376. The gasket may be of any suitable material for sealing at the temperature encountered at the ends of the tubes 374. Examples of gasket materials for sealing at temperatures below about 250° C. include silicone, TEFLON™ and VITON™. Examples of gasket materials for higher temperatures include graphite, ceramic paper, thin sheet metal, and combinations thereof. Tension rods 380 extend over the length of the furnace 110 and through rod holes 382 through the endcaps 376. The tension rods 380 are held in tension by the force of springs 384 bearing against bearing plates 386 and the endcaps 376. The tube 374 is, therefore, in compression due to the force of the springs 384. The springs 384 may be compressed any desired amount to form a seal between the endcaps 376 and the ceramic tube 374 through the gasket 378. As will be appreciated, by using the springs 384, the tube 374 is free to move to some degree as it expands upon heating and contracts upon cooling. To form the seal between the endcaps 384 and the ceramic tube 374, one of the gaskets 378 is seated in a gasket seat 388 on the side of each endcap 376 facing the tube 374. A mating face 390 on the side of each of the endcaps 376 faces away from the tube 374, for mating with a flange surface for connection with an adjacent piece of equipment.

Also, although the present invention is described with primary reference to a furnace reactor, which is preferred, it should be recognized that, except as noted, any other thermal reactor, including a flame reactor or a plasma reactor, could be used instead. A furnace reactor is, however, preferred, because of the generally even heating characteristic of a furnace for attaining a uniform stream temperature.

The particle collector 114, may be any suitable apparatus for collecting particles 112 to produce the particulate product 116. One preferred embodiment of the particle collector 114 uses one or more filter to separate the particles 112 from gas. Such a filter may be of any type, including a bag filter. Another preferred embodiment of the particle collector uses one or more cyclone to separate the particles 112. Other apparatus that may be used in the particle collector 114 includes an electrostatic precipitator. Also, collection should normally occur at a temperature above the condensation temperature of the gas stream in which the particles 112 are suspended. Also, collection should normally be at a temperature that is low enough to prevent significant agglomeration of the particles 112.

The process and apparatus of the present invention are well-suited for producing commercial-size batches of extremely high quality silver-containing particles. In that regard, the process and the accompanying apparatus provide versatility for preparing powder including a wide variety of materials, and easily accommodate shifting of production between different specialty batches of silver-containing particles.

Figure 5:
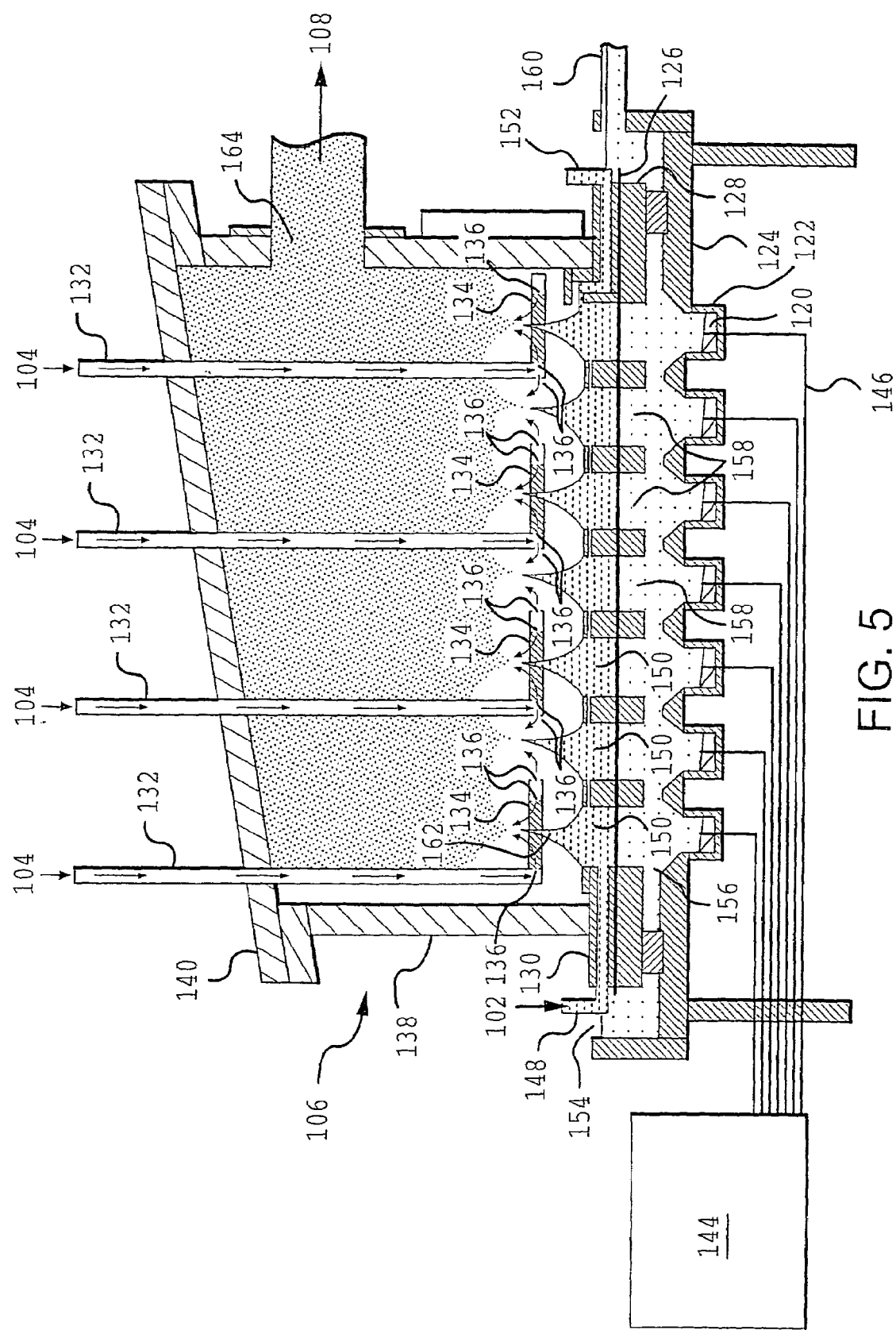
FIG. 5 is a side view in cross section of one embodiment of aerosol generator of the present invention.
Figure 6:
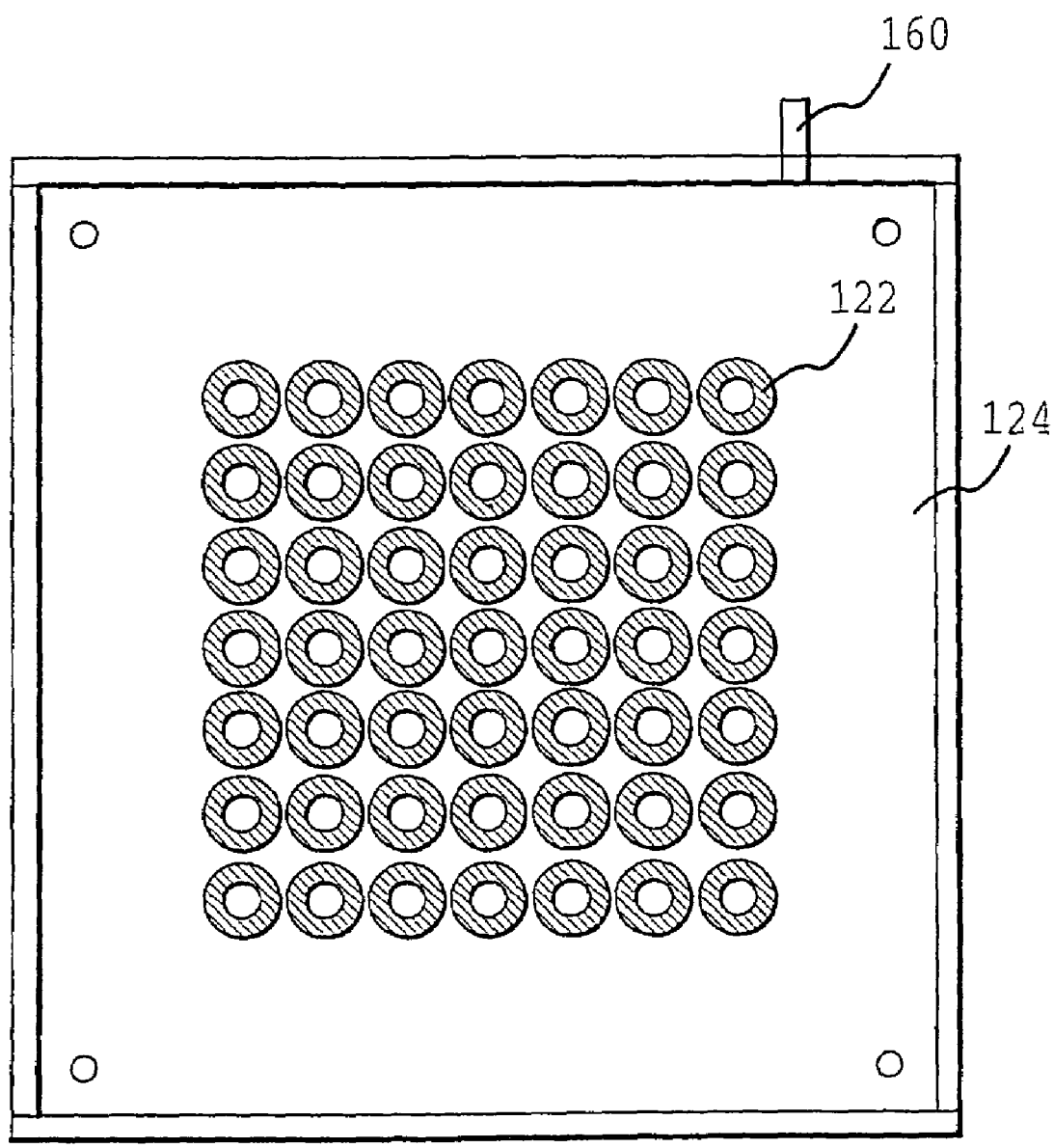
FIG. 6 is a top view of a transducer mounting plate showing a 49 transducer array for use in an aerosol generator of the present invention.

Of significant importance to the operation of the process of the present invention is the aerosol generator 106, which must be capable of producing a high quality aerosol with high droplet loading, as previously noted. With reference to FIG. 5, one embodiment of an aerosol generator 106 of the present invention is described. The aerosol generator 106 includes a plurality of ultrasonic transducer discs 120 that are each mounted in a transducer housing 122. The transducer housings 122 are mounted to a transducer mounting plate 124, creating an array of the ultrasonic transducer discs 120. Any convenient spacing may be used for the ultrasonic transducer discs 120. Center-to-center spacing of the ultrasonic transducer discs 120 of about 4 centimeters is often adequate. The aerosol generator 106, as shown in FIG. 5, includes forty-nine transducers in a 7×7 array. The array configuration is as shown in FIG. 6, which depicts the locations of the transducer housings 122 mounted to the transducer mounting plate 124.

With continued reference to FIG. 5, a separator 126, in spaced relation to the transducer discs 120, is retained between a bottom retaining plate 128 and a top retaining plate 130. Gas delivery tubes 132 are connected to gas distribution manifolds 134, which have gas delivery ports 136. The gas distribution manifolds 134 are housed within a generator body 138 that is covered by generator lid 140. A transducer driver 144, having circuitry for driving the transducer discs 120, is electronically connected with the transducer discs 120 via electrical cables 146.

During operation of the aerosol generator 106, as shown in FIG. 5, the transducer discs 120 are activated by the transducer driver 144 via the electrical cables 146. The transducers preferably vibrate at a frequency of from about 1 MHz to about 5 MHz, more preferably from about 1.5 MHz to about 3 MHz. Frequently used frequencies are at about 1.6 MHz and about 2.4 MHz. Furthermore, all of the transducer discs 110 should be operating at substantially the same frequency when an aerosol with a narrow droplet size distribution is desired. This is important because commercially available transducers can vary significantly in thickness, sometimes by as much as 10%. It is preferred, however, that the transducer discs 120 operate at frequencies within a range of 5% above and below the median transducer frequency, more preferably within a range of 2.5%, and most preferably within a range of 1%. This can be accomplished by careful selection of the transducer discs 120 so that they all preferably have thicknesses within 5% of the median transducer thickness, more preferably within 2.5%, and most preferably within 1%.

Liquid feed 102 enters through a feed inlet 148 and flows through flow channels 150 to exit through feed outlet 152. An ultrasonically transmissive fluid, typically water, enters through a water inlet 154 to fill a water bath volume 156 and flow through flow channels 158 to exit through a water outlet 160. A proper flow rate of the ultrasonically transmissive fluid is necessary to cool the transducer discs 120 and to prevent overheating of the ultrasonically transmissive fluid. Ultrasonic signals from the transducer discs 120 are transmitted, via the ultrasonically transmissive fluid, across the water bath volume 156, and ultimately across the separator 126, to the liquid feed 102 in flow channels 150.

The ultrasonic signals from the ultrasonic transducer discs 120 cause atomization cones 162 to develop in the liquid feed 102 at locations corresponding with the transducer discs 120. Carrier gas 104 is introduced into the gas delivery tubes 132 and delivered to the vicinity of the atomization cones 162 via gas delivery ports 136. Jets of carrier gas exit the gas delivery ports 136 in a direction so as to impinge on the atomization cones 162, thereby sweeping away atomized droplets of the liquid feed 102 that are being generated from the atomization cones 162 and creating the aerosol 108, which exits the aerosol generator 106 through an aerosol exit opening 164.

Efficient use of the carrier gas 104 is an important aspect of the aerosol generator 106. The embodiment of the aerosol generator 106 shown in FIG. 5 includes two gas exit ports per atomization cone 162, with the gas ports being positioned above the liquid medium 102 over troughs that develop between the atomization cones 162, such that the exiting carrier gas 104 is horizontally directed at the surface of the atomization cones 162, thereby efficiently distributing the carrier gas 104 to critical portions of the liquid feed 102 for effective and efficient sweeping away of droplets as they form about the ultrasonically energized atomization cones 162. Furthermore, it is preferred that at least a portion of the opening of each of the gas delivery ports 136, through which the carrier gas exits the gas delivery tubes, should be located below the top of the atomization cones 162 at which the carrier gas 104 is directed. This relative placement of the gas delivery ports 136 is very important to efficient use of carrier gas 104. Orientation of the gas delivery ports 136 is also important. Preferably, the gas delivery ports 136 are positioned to horizontally direct jets of the carrier gas 104 at the atomization cones 162. The aerosol generator 106 permits generation of the aerosol 108 with heavy loading with droplets of the carrier liquid 102, unlike aerosol generator designs that do not efficiently focus gas delivery to the locations of droplet formation.

Another important feature of the aerosol generator 106, as shown in FIG. 5, is the use of the separator 126, which protects the transducer discs 120 from direct contact with the liquid feed 102, which is often highly corrosive. The height of the separator 126 above the top of the transducer discs 120 should normally be kept as small as possible, and is often in the range of from about 1 centimeter to about 2 centimeters. The top of the liquid feed 102 in the flow channels above the tops of the ultrasonic transducer discs 120 is typically in a range of from about 2 centimeters to about 5 centimeters, whether or not the aerosol generator includes the separator 126, with a distance of about 3 to 4 centimeters being preferred. Although the aerosol generator 106 could be made without the separator 126, in which case the liquid feed 102 would be in direct contact with the transducer discs 120, the highly corrosive nature of the liquid feed 102 can often cause premature failure of the transducer discs 120. The use of the separator 126, in combination with use of the ultrasonically transmissive fluid in the water bath volume 156 to provide ultrasonic coupling, significantly extending the life of the ultrasonic transducers 120. One disadvantage of using the separator 126, however, is that the rate of droplet production from the atomization cones 162 is reduced, often by a factor of two or more, relative to designs in which the liquid feed 102 is in direct contact with the ultrasonic transducer discs 102. Even with the separator 126, however, the aerosol generator 106 used with the present invention is capable of producing a high quality aerosol with heavy droplet loading, as previously discussed. Suitable materials for the separator 126 include, for example, polyamides (such as Kapton™ membranes from DuPont) and other polymer materials, glass, and plexiglass. The main requirements for the separator 126 are that it be ultrasonically transmissive, corrosion resistant and impermeable.

One alternative to using the separator 126 is to bind a corrosion-resistant protective coating onto the surface of the ultrasonic transducer discs 120, thereby preventing the liquid feed 102 from contacting the surface of the ultrasonic transducer discs 120. When the ultrasonic transducer discs 120 have a protective coating, the aerosol generator 106 will typically be constructed without the water bath volume 156 and the liquid feed 102 will flow directly over the ultrasonic transducer discs 120. Examples of such protective coating materials include platinum, gold, Teflon™, epoxies and various plastics. Such coating typically significantly extends transducer life. Also, when operating without the separator 126, the aerosol generator 106 will typically produce the aerosol 108 with a much higher droplet loading than when the separator 126 is used.

One surprising finding with operation of the aerosol generator 106 of the present invention is that the droplet loading in the aerosol may be affected by the temperature of the liquid feed 102. It has been found that when the liquid feed 102 includes an aqueous liquid at an elevated temperature, the droplet loading increases significantly. The temperature of the liquid feed 102 is preferably higher than about 30° C., more preferably higher than about 35° C. and most preferably higher than about 40° C. If the temperature becomes too high, however, it can have a detrimental effect on droplet loading in the aerosol 108. Therefore, the temperature of the liquid feed 102 from which the aerosol 108 is made should generally be lower than about 50° C., and preferably lower than about 45° C. The liquid feed 102 may be maintained at the desired temperature in any suitable fashion. For example, the portion of the aerosol generator 106 where the liquid feed 102 is converted to the aerosol 108 could be maintained at a constant elevated temperature. Alternatively, the liquid feed 102 could be delivered to the aerosol generator 106 from a constant temperature bath maintained separate from the aerosol generator 106. When the ultrasonic generator 106 includes the separator 126, the ultrasonically transmissive fluid adjacent the ultrasonic transducer disks 120 are preferably also be at an elevated temperature in the ranges just discussed for the liquid feed 102.

The design for the aerosol generator 106 based on an array of ultrasonic transducers is versatile and is easily modified to accommodate different generator sizes for different specialty applications. The aerosol generator 106 may be designed to include a plurality of ultrasonic transducers in any convenient number. Even for smaller scale production, however, the aerosol generator 106 preferably has at least nine ultrasonic transducers, more preferably at least 16 ultrasonic transducers, and even more preferably at least 25 ultrasonic transducers. For larger scale production, however, the aerosol generator 106 includes at least 40 ultrasonic transducers, more preferably at least 100 ultrasonic transducers, and even more preferably at least 400 ultrasonic transducers. In some large volume applications, the aerosol generator may have at least 1000 ultrasonic transducers.

Figure 7:
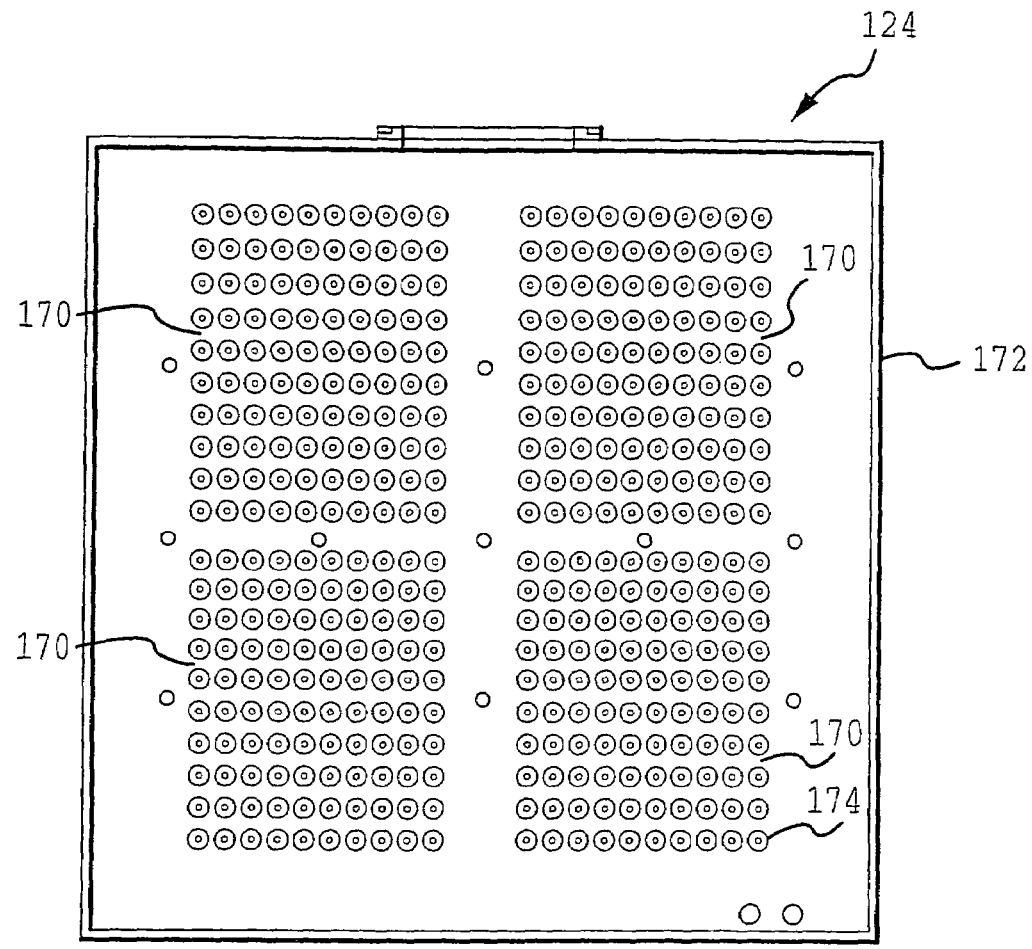
FIG. 7 is a top view of a transducer mounting plate for a 400 transducer array for use in an ultrasonic generator of the present invention.
Figure 8:
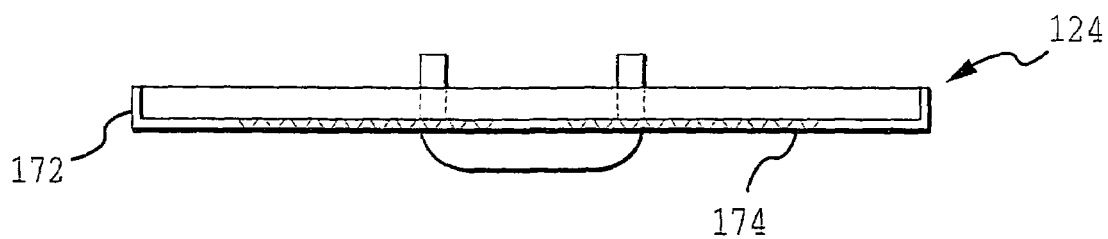
FIG. 8 is a side view of the transducer mounting plate shown in FIG. 7.

FIGS. 7-24 show component designs for an aerosol generator 106 including an array of 400 ultrasonic transducers. Referring first to FIGS. 7 and 8, the transducer mounting plate 124 is shown with a design to accommodate an array of 400 ultrasonic transducers, arranged in four subarrays of 100 ultrasonic transducers each. The transducer mounting plate 124 has integral vertical walls 172 for containing the ultrasonically transmissive fluid, typically water, in a water bath similar to the water bath volume 156 described previously with reference to FIG. 5.

Figure 9:
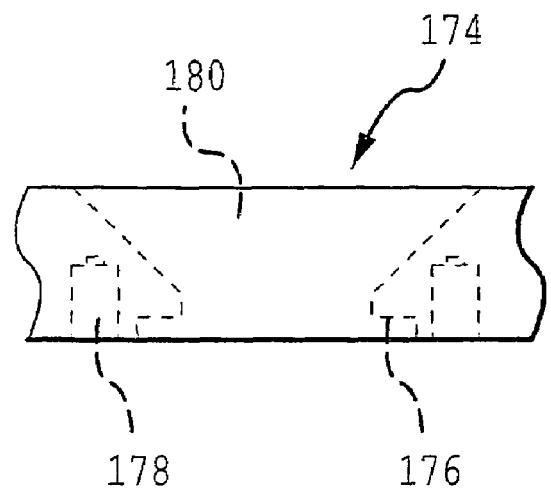
FIG. 9 is a partial side view showing the profile of a single transducer mounting receptacle of the transducer mounting plate shown in FIG. 7.

As shown in FIGS. 7 and 8, four hundred transducer mounting receptacles 174 are provided in the transducer mounting plate 124 for mounting ultrasonic transducers for the desired array. With reference to FIG. 9, the profile of an individual transducer mounting receptacle 174 is shown. A mounting seat 176 accepts an ultrasonic transducer for mounting, with a mounted ultrasonic transducer being held in place via screw holes 178. Opposite the mounting receptacle 176 is a flared opening 180 through which an ultrasonic signal may be transmitted for the purpose of generating the aerosol 108, as previously described with reference to FIG. 5.

Figure 10:
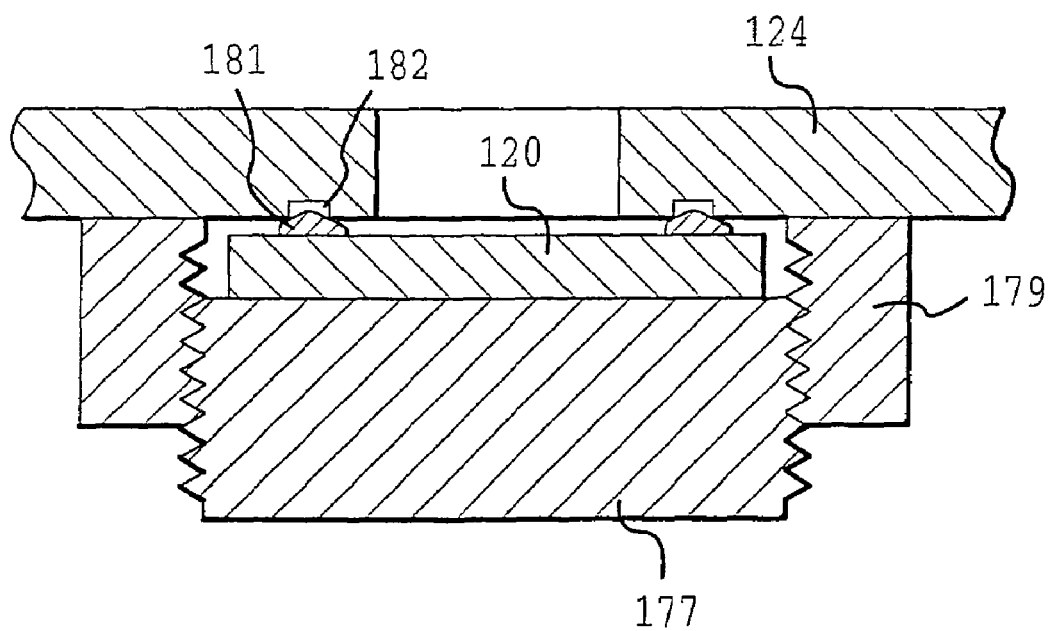
FIG. 10 is a partial side view in cross-section showing an alternative embodiment for mounting an ultrasonic transducer.

A preferred transducer mounting configuration, however, is shown in FIG. 10 for another configuration for the transducer mounting plate 124. As seen in FIG. 10, an ultrasonic transducer disc 120 is mounted to the transducer mounting plate 124 by use of a compression screw 177 threaded into a threaded receptacle 179. The compression screw 177 bears against the ultrasonic transducer disc 120, causing an o-ring 181, situated in an o-ring seat 182 on the transducer mounting plate, to be compressed to form a seal between the transducer mounting plate 124 and the ultrasonic transducer disc 120. This type of transducer mounting is particularly preferred when the ultrasonic transducer disc 120 includes a protective surface coating, as discussed previously, because the seal of the o-ring to the ultrasonic transducer disc 120 will be inside of the outer edge of the protective seal, thereby preventing liquid from penetrating under the protective surface coating from the edges of the ultrasonic transducer disc 120.

Figure 11:
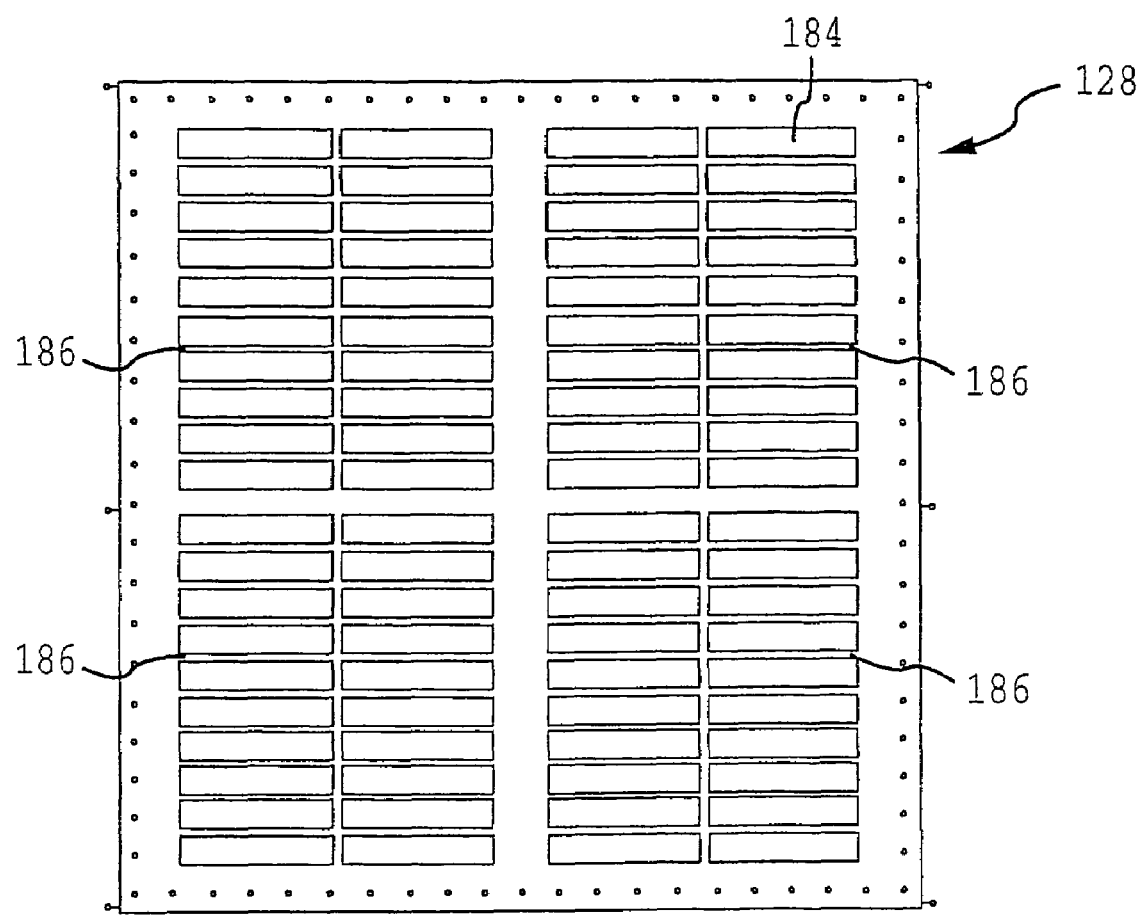
FIG. 11 is a top view of a bottom retaining plate for retaining a separator for use in an aerosol generator of the present invention.

Referring now to FIG. 11, the bottom retaining plate 128 for a 400 transducer array is shown having a design for mating with the transducer mounting plate 124 (shown in FIGS. 7-8). The bottom retaining plate 128 has eighty openings 184, arranged in four subgroups 186 of twenty openings 184 each. Each of the openings 184 corresponds with five of the transducer mounting receptacles 174 (shown in FIGS. 7 and 8) when the bottom retaining plate 128 is mated with the transducer mounting plate 124 to create a volume for a water bath between the transducer mounting plate 124 and the bottom retaining plate 128. The openings 184, therefore, provide a pathway for ultrasonic signals generated by ultrasonic transducers to be transmitted through the bottom retaining plate.

Figure 12:
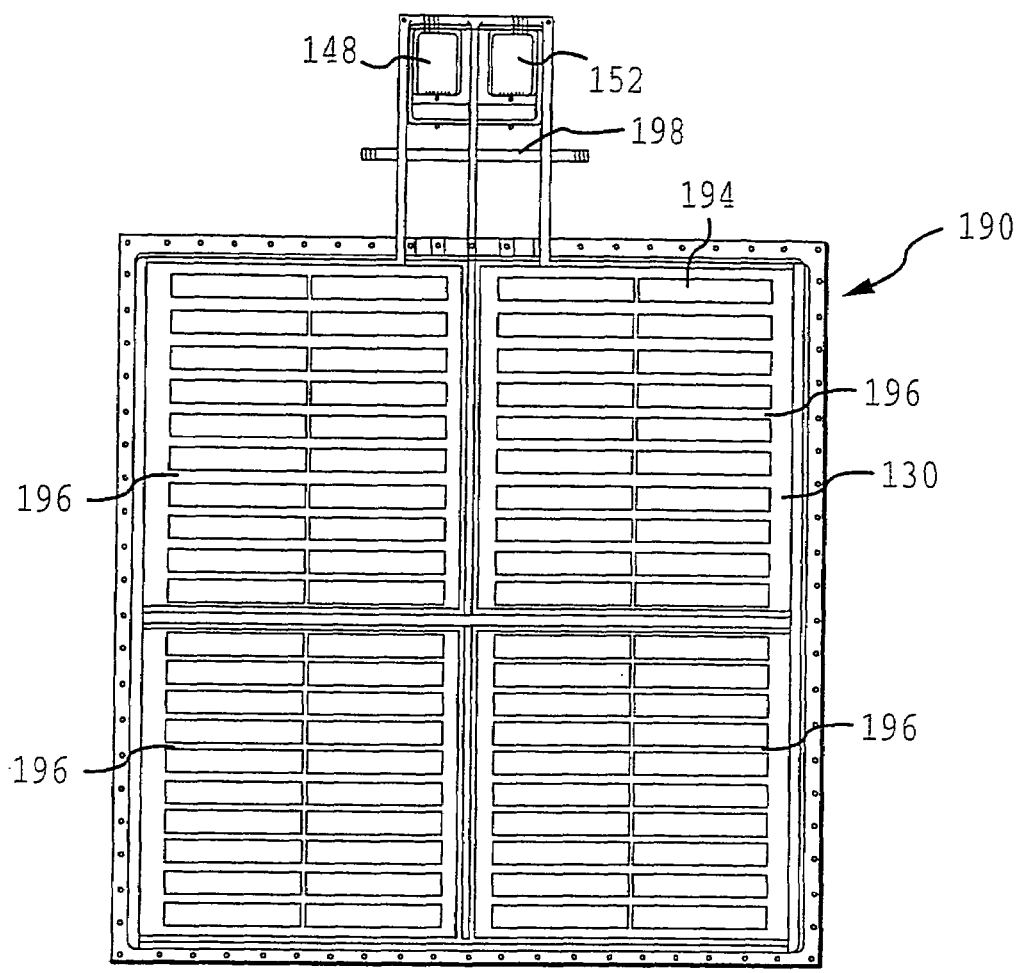
FIG. 12 is a top view of a liquid feed box having a bottom retaining plate to assist in retaining a separator for use in an aerosol generator of the present invention.
Figure 13:
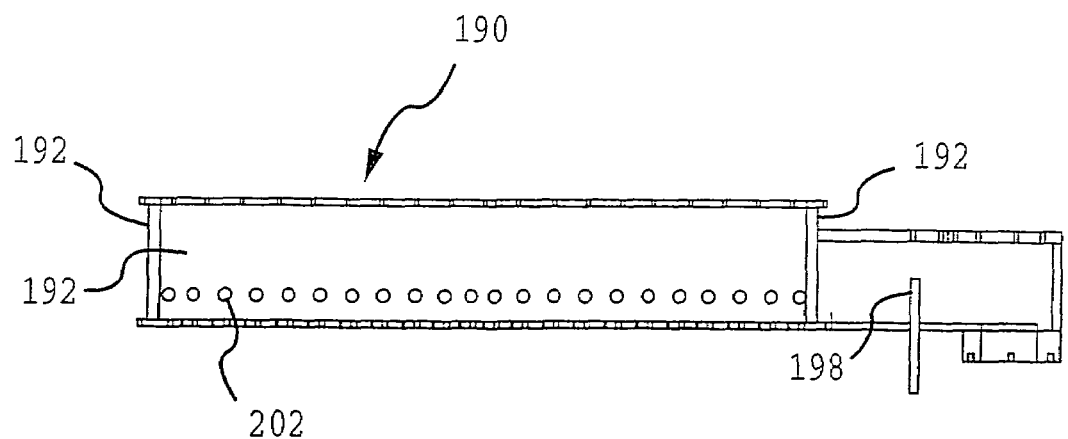
FIG. 13 is a side view of the liquid feed box shown in FIG. 12.

Referring now to FIGS. 12 and 13, a liquid feed box 190 for a 400 transducer array is shown having the top retaining plate 130 designed to fit over the bottom retaining plate 128 (shown in FIG. 11), with a separator 126 (not shown) being retained between the bottom retaining plate 128 and the top retaining plate 130 when the aerosol generator 106 is assembled. The liquid feed box 190 also includes vertically extending walls 192 for containing the liquid feed 102 when the aerosol generator is in operation. Also shown in FIGS. 12 and 13 is the feed inlet 148 and the feed outlet 152. An adjustable weir 198 determines the level of liquid feed 102 in the liquid feed box 190 during operation of the aerosol generator 106.

The top retaining plate 130 of the liquid feed box 190 has eighty openings 194 therethrough, which are arranged in four subgroups 196 of twenty openings 194 each. The openings 194 of the top retaining plate 130 correspond in size with the openings 184 of the bottom retaining plate 128 (shown in FIG. 11). When the aerosol generator 106 is assembled, the openings 194 through the top retaining plate 130 and the openings 184 through the bottom retaining plate 128 are aligned, with the separator 126 positioned therebetween, to permit transmission of ultrasonic signals when the aerosol generator 106 is in operation.

Figure 14:
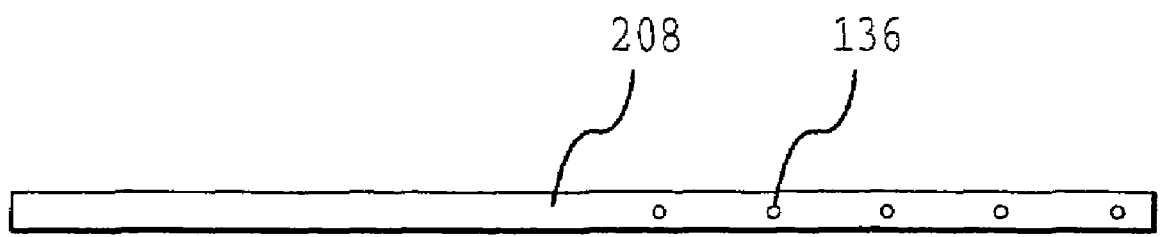
FIG. 14 is a side view of a gas tube for delivering gas within an aerosol generator of the present invention.

Referring now to FIGS. 12-14, a plurality of gas tube feed-through holes 202 extend through the vertically extending walls 192 to either side of the assembly including the feed inlet 148 and feed outlet 152 of the liquid feed box 190. The gas tube feed-through holes 202 are designed to permit insertion therethrough of gas tubes 208 of a design as shown in FIG. 14. When the aerosol generator 106 is assembled, a gas tube 208 is inserted through each of the gas tube feed-through holes 202 so that gas delivery ports 136 in the gas tube 208 will be properly positioned and aligned adjacent the openings 194 in the top retaining plate 130 for delivery of gas to atomization cones that develop in the liquid feed box 190 during operation of the aerosol generator 106. The gas delivery ports 136 are typically holes having a diameter of from about 1.5 millimeters to about 3.5 millimeters.

Figure 15:
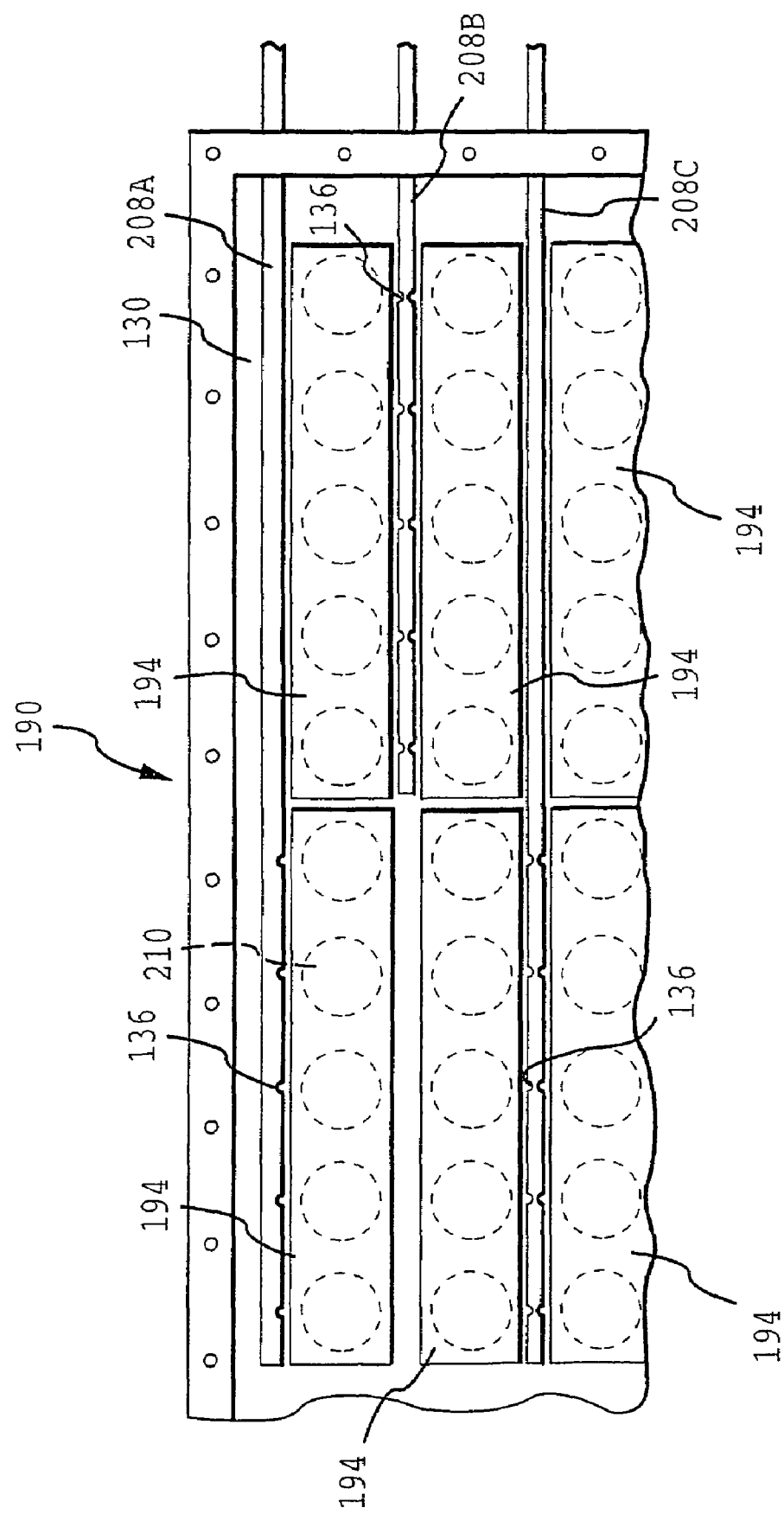
FIG. 15 shows a partial top view of gas tubes positioned in a liquid feed box for distributing gas relative to ultrasonic transducer positions for use in an aerosol generator of the present invention.

Referring now to FIG. 15, a partial view of the liquid feed box 190 is shown with gas tubes 208A, 208B and 208C positioned adjacent to the openings 194 through the top retaining plate 130. Also shown in FIG. 15 are the relative locations that ultrasonic transducer discs 120 would occupy when the aerosol generator 106 is assembled. As seen in FIG. 15, the gas tube 208A, which is at the edge of the array, has five gas delivery ports 136. Each of the gas delivery ports 136 is positioned to divert carrier gas 104 to a different one or atomization cones that develop over the array of ultrasonic transducer discs 120 when the aerosol generator 106 is operating. The gas tube 208B, which is one row in from the edge of the array, is a shorter tube that has ten gas delivery ports 136, five each on opposing sides of the gas tube 208B. The gas tube 208B, therefore, has gas delivery ports 136 for delivering gas to atomization cones corresponding with each of ten ultrasonic transducer discs 120. The third gas tube, 208C, is a longer tube that also has ten gas delivery ports 136 for delivering gas to atomization cones corresponding with ten ultrasonic transducer discs 120. The design shown in FIG. 15, therefore, includes one gas delivery port per ultrasonic transducer disc 120. Although this is a lower density of gas delivery ports 136 than for the embodiment of the aerosol generator 106 shown in FIG. 5, which includes two gas delivery ports per ultrasonic transducer disc 120, the design shown in FIG. 15 is, nevertheless, capable of producing a dense, high-quality aerosol without unnecessary waste of gas.

Figure 16:
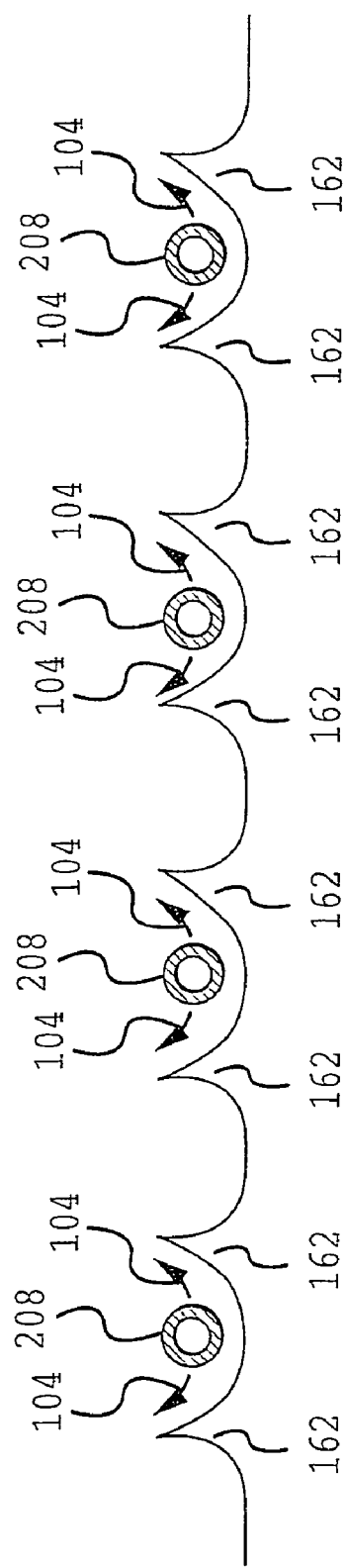
FIG. 16 shows one embodiment for a gas distribution configuration for the aerosol generator of the present invention.

Referring now to FIG. 16, the flow of carrier gas 104 relative to atomization cones 162 during operation of the aerosol generator 106 having a gas distribution configuration to deliver carrier gas 104 from gas delivery ports on both sides of the gas tubes 208, as was shown for the gas tubes 208A, 208B and 208C in the gas distribution configuration shown in FIG. 14. The carrier gas 104 sweeps both directions from each of the gas tubes 208.

Figure 17:
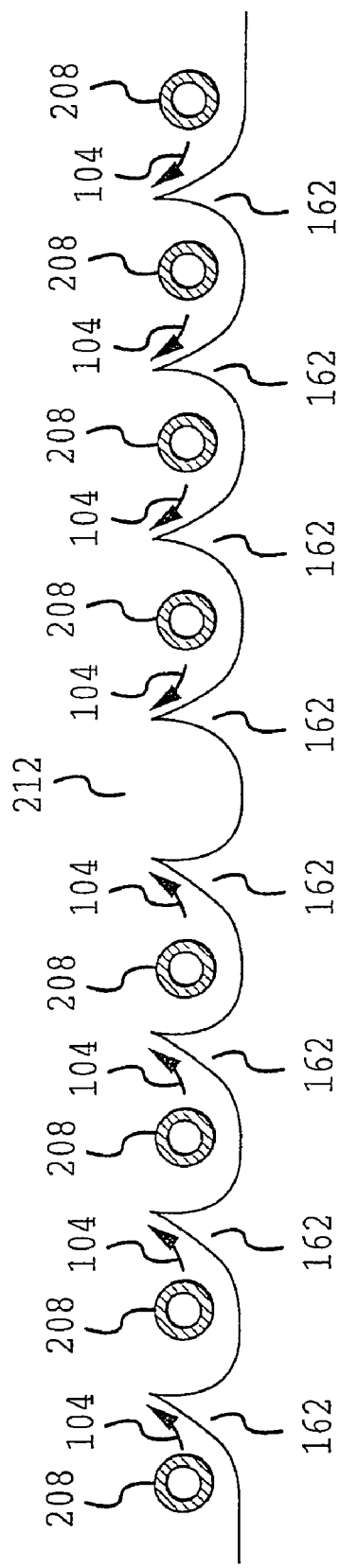
FIG. 17 shows another embodiment for a gas distribution configuration for the aerosol generator of the present invention.

An alternative, and preferred, flow for carrier gas 104 is shown in FIG. 17. As shown in FIG. 17, carrier gas 104 is delivered from only one side of each of the gas tubes 208. This results in a sweep of carrier gas from all of the gas tubes 208 toward a central area 212. This results in a more uniform flow pattern for aerosol generation that may significantly enhance the efficiency with which the carrier gas 104 is used to produce an aerosol. The aerosol that is generated, therefore, tends to be more heavily loaded with liquid droplets.

Figure 18:
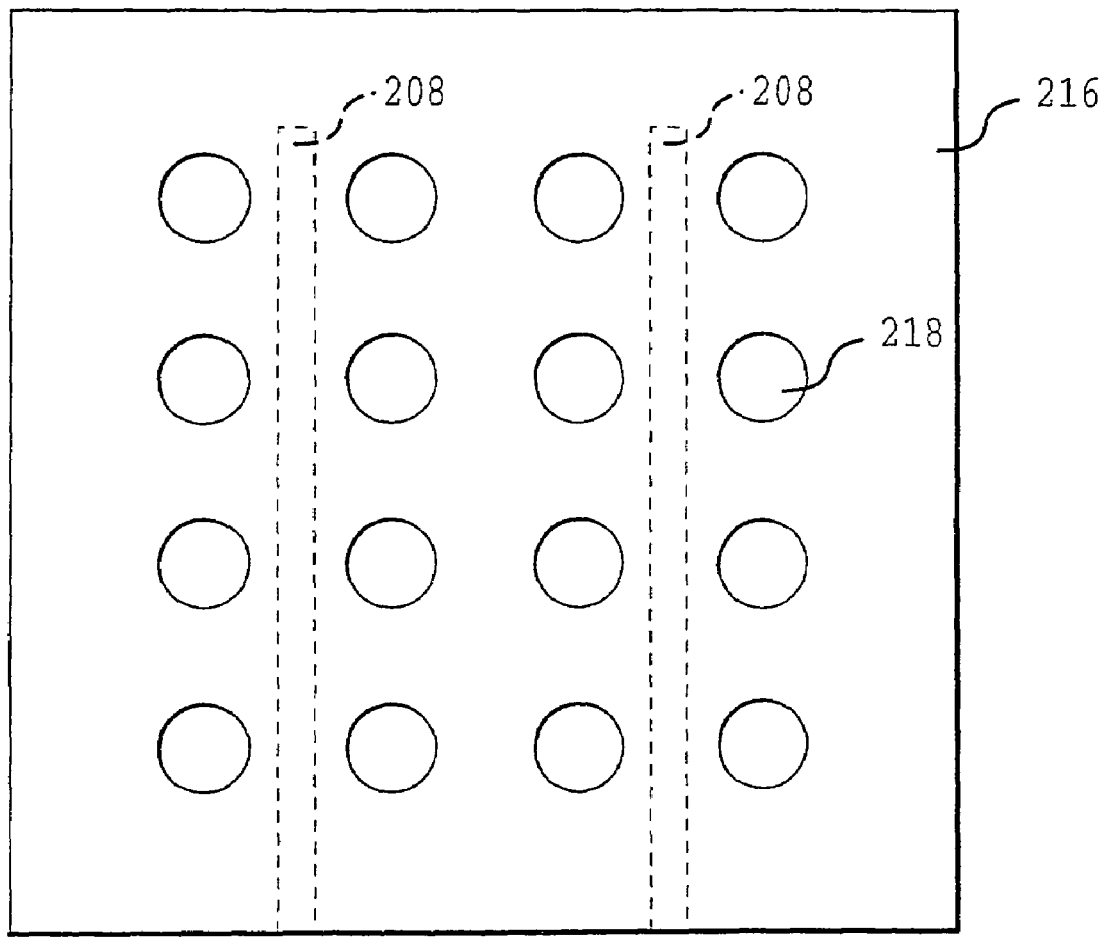
FIG. 18 is a top view of one embodiment of a gas distribution plate/gas tube assembly of the aerosol generator of the present invention.
Figure 19:
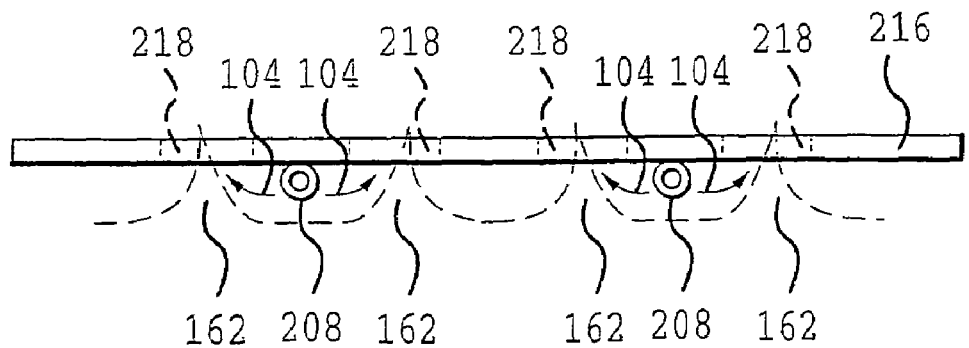
FIG. 19 is a side view of one embodiment of the gas distribution plate/gas tube assembly shown in FIG. 18.

Another configuration for distributing carrier gas in the aerosol generator 106 is shown in FIGS. 18 and 19. in this configuration, the gas tubes 208 are hung from a gas distribution plate 216 adjacent gas flow holes 218 through the gas distribution plate 216. In the aerosol generator 106, the gas distribution plate 216 would be mounted above the liquid feed, with the gas flow holes positioned to each correspond with an underlying ultrasonic transducer. Referring specifically to FIG. 19, when the ultrasonic generator 106 is in operation, atomization cones 162 develop through the gas flow holes 218, and the gas tubes 208 are located such that carrier gas 104 exiting from ports in the gas tubes 208 impinge on the atomization cones and flow upward through the gas flow holes. The gas flow holes 218, therefore, act to assist in efficiently distributing the carrier gas 104 about the atomization cones 162 for aerosol formation. It should be appreciated that the gas distribution plates 218 can be made to accommodate any number of the gas tubes 208 and gas flow holes 218. For convenience of illustration, the embodiment shown in FIGS. 18 and 19 shows a design having only two of the gas tubes 208 and only 16 of the gas flow holes 218. Also, it should be appreciated that the gas distribution plate 216 could be used alone, without the gas tubes 208. In that case, a slight positive pressure of carrier gas 104 would be maintained under the gas distribution plate 216 and the gas flow holes 218 would be sized to maintain the proper velocity of carrier gas 104 through the gas flow holes 218 for efficient aerosol generation. Because of the relative complexity of operating in that mode, however, it is not preferred.

Figure 20:
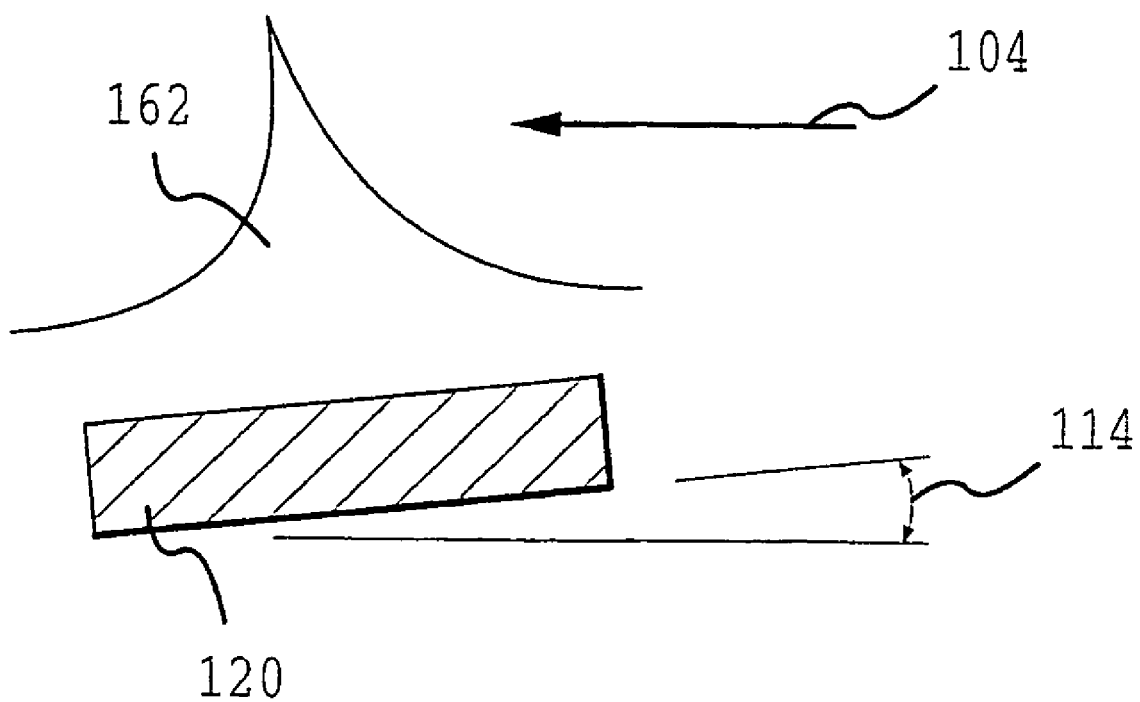
FIG. 20 shows one embodiment for orienting a transducer in the aerosol generator of the present invention.

Aerosol generation may also be enhanced through mounting of ultrasonic transducers at a slight angle and directing the carrier gas at resulting atomization cones such that the atomization cones are tilting in the same direction as the direction of flow of carrier gas. Referring to FIG. 20, an ultrasonic transducer disc 120 is shown. The ultrasonic transducer disc 120 is tilted at a tilt angle 114 (typically less than 10 degrees), so that the atomization cone 162 will also have a tilt. It is preferred that the direction of flow of the carrier gas 104 directed at the atomization cone 162 is in the same direction as the tilt of the atomization cone 162.

Figure 21:
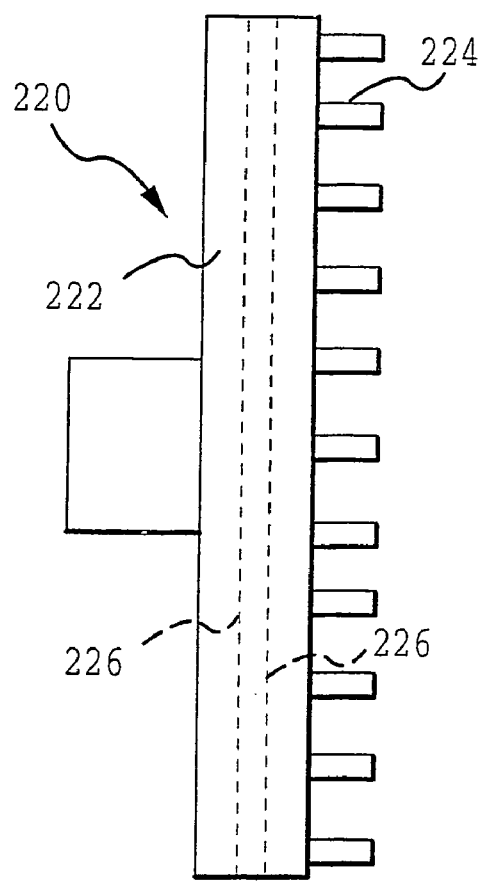
FIG. 21 is a top view of a gas manifold for distributing gas within an aerosol generator of the present invention.
Figure 22:
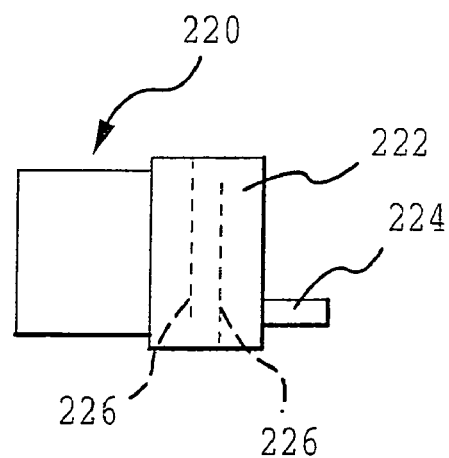
FIG. 22 is a side view of the gas manifold shown in FIG. 21.

Referring now to FIGS. 21 and 22, a gas manifold 220 is shown for distributing gas to the gas tubes 208 in a 400 transducer array design. The gas manifold 220 includes a gas distribution box 222 and piping stubs 224 for connection with gas tubes 208 (shown in FIG. 14). Inside the gas distribution box 222 are two gas distribution plates 226 that form a flow path to assist in distributing the gas equally throughout the gas distribution box 222, to promote substantially equal delivery of gas through the piping stubs 224. The gas manifold 220, as shown in FIGS. 21 and 22, is designed to feed eleven gas tubes 208. For the 400 transducer design, a total of four gas manifolds 220 are required.

Figure 23:
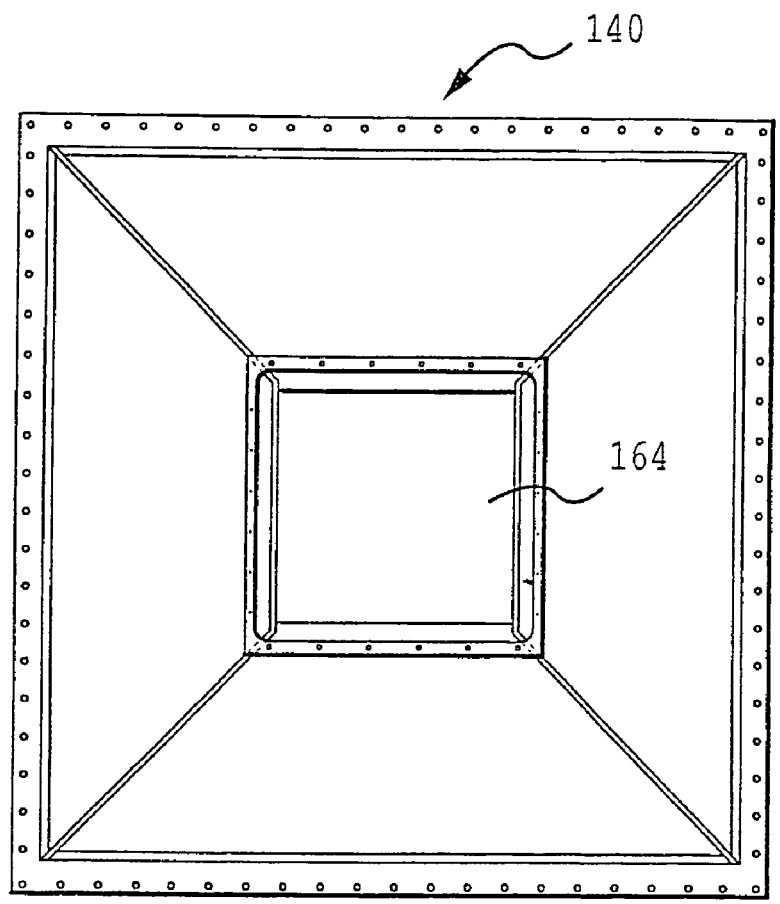
FIG. 23 is a top view of a generator lid of a hood design for use in an aerosol generator of the present invention.
Figure 24:
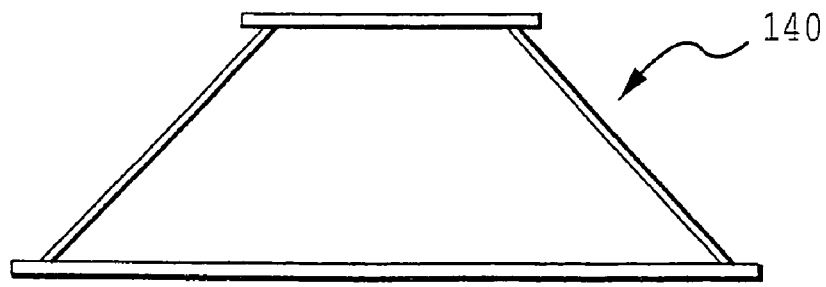
FIG. 24 is a side view of the generator lid shown in FIG. 23.
Figure 26:
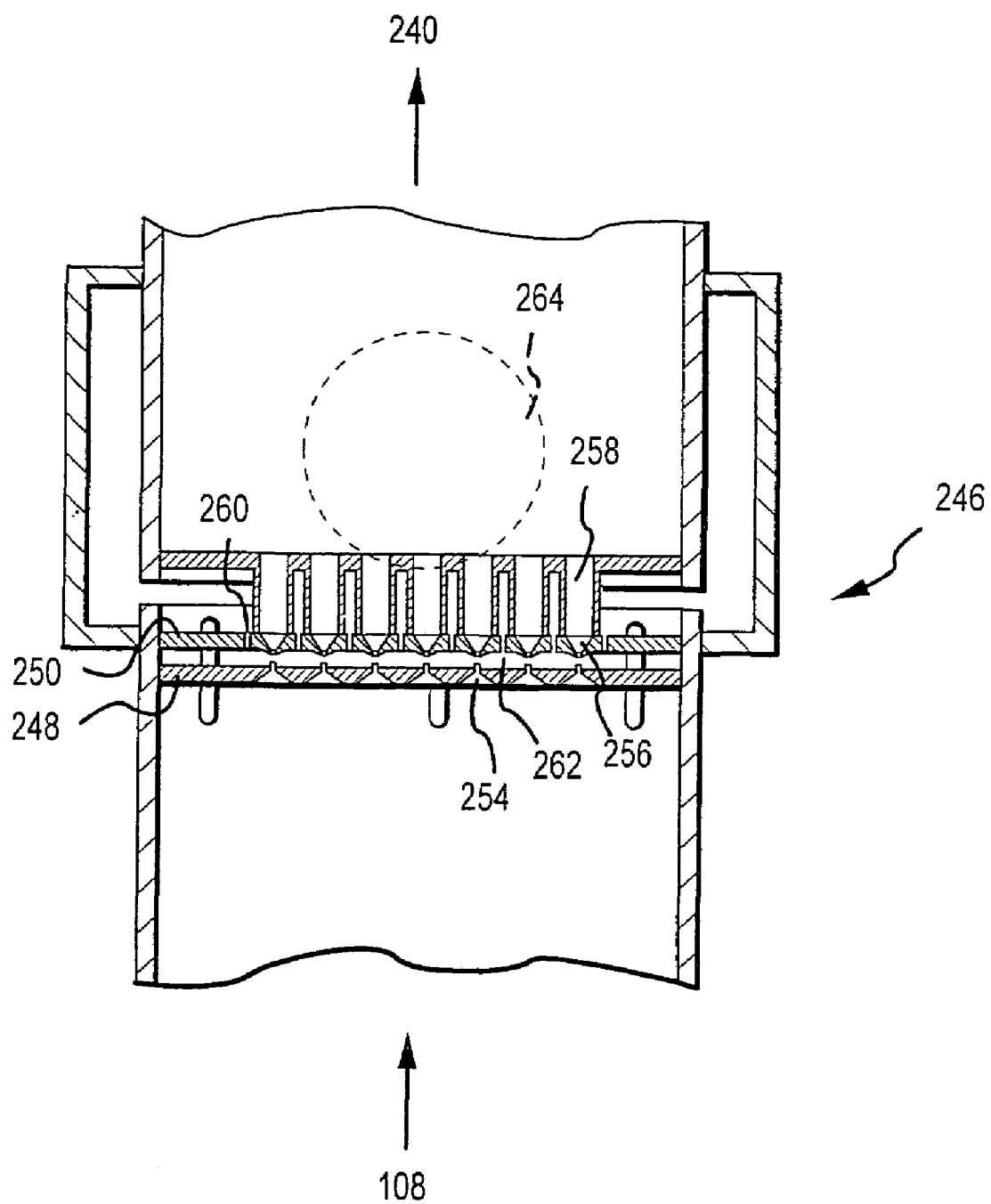
FIG. 26 is a top view in cross section of a virtual impactor that may be used for concentrating an aerosol according to the present invention.
Figure 27:
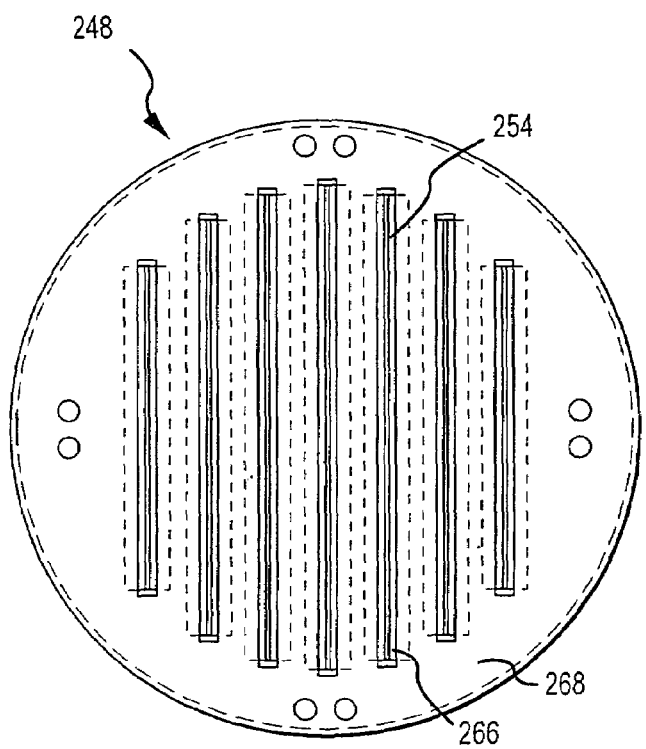
FIG. 27 is a front view of an upstream plate assembly of the virtual impactor shown in FIG. 26.
Figure 29:
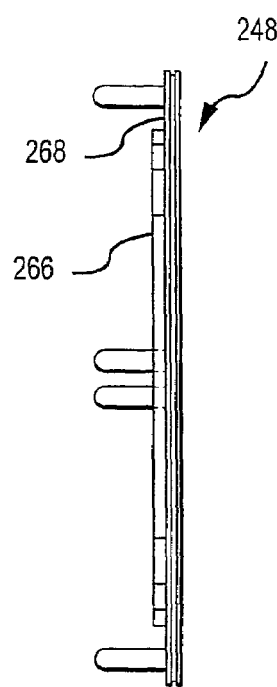
FIG. 29 is a side view of the upstream plate assembly shown in FIG. 27.
Figure 28:
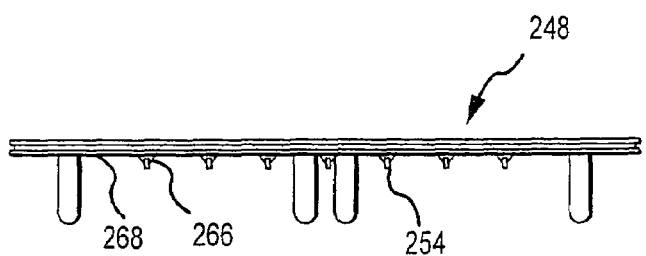
FIG. 28 is a top view of the upstream plate assembly shown in FIG. 27.
Figure 30:
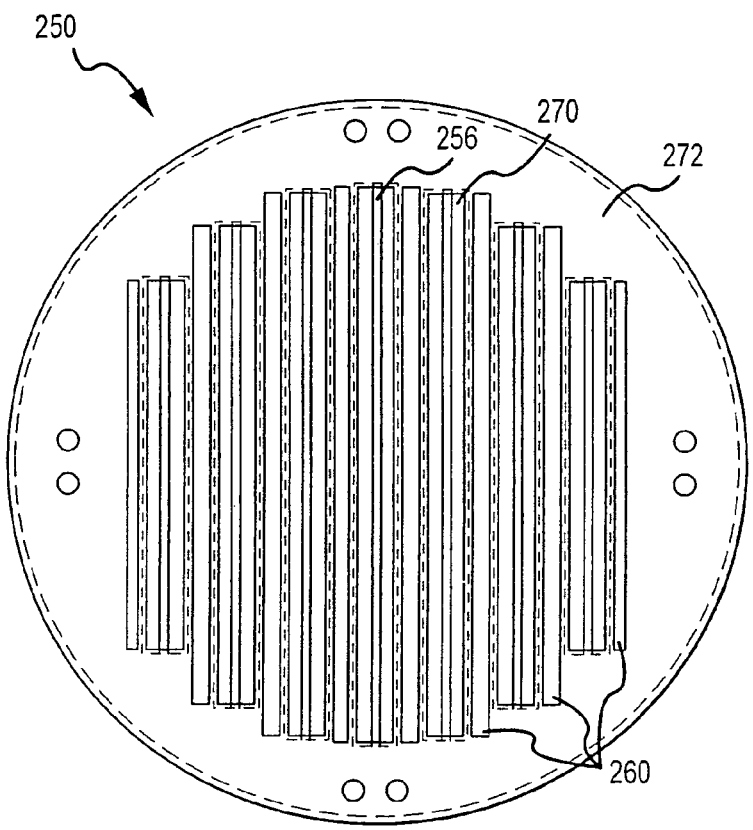
FIG. 30 is a front view of a downstream plate assembly of the virtual impactor shown in FIG. 26.
Figure 32:
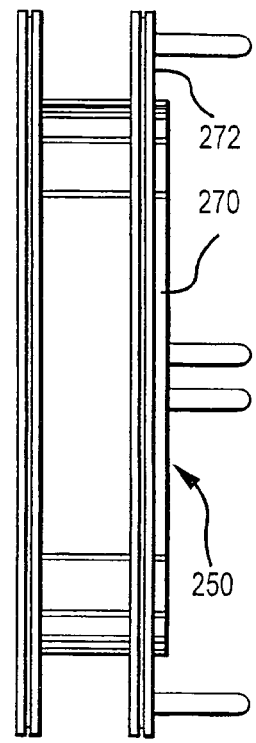
FIG. 32 is a side view of the downstream plate assembly shown in FIG. 30.
Figure 31:
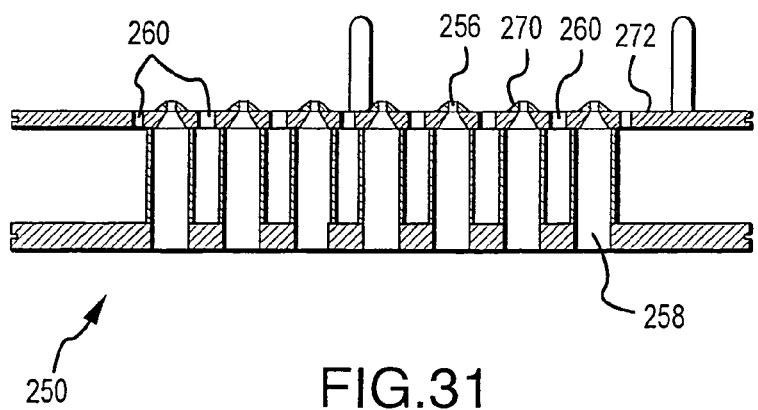
FIG. 31 is a top view of the downstream plate assembly shown in FIG. 30.

Referring now to FIGS. 23 and 24, the generator lid 140 is shown for a 400 transducer array design. The generator lid 140 mates with and covers the liquid feed box 190 (shown in FIGS. 12 and 13). The generator lid 140, as shown in FIGS. 23 and 24, has a hood design to permit easy collection of the aerosol 108 without subjecting droplets in the aerosol 108 to sharp edges on which droplets may coalesce and be lost, and possibly interfere with the proper operation of the aerosol generator 106. When the aerosol generator 106 is in operation, the aerosol 108 would be withdrawn via the aerosol exit opening 164 through the generator cover 140.

Although the aerosol generator 106 produces a high quality aerosol 108 having a high droplet loading, it is often desirable to further concentrate the aerosol 108 prior to introduction into the furnace 110. Referring now to FIG. 25, a process flow diagram is shown for one embodiment of the present invention involving such concentration of the aerosol 108. As shown in FIG. 25, the aerosol 108 from the aerosol generator 106 is sent to an aerosol concentrator 236 where excess carrier gas 238 is withdrawn from the aerosol 108 to produce a concentrated aerosol 240, which is then fed to the furnace 110.

The aerosol concentrator 236 typically includes one or more virtual impactors capable of concentrating droplets in the aerosol 108 by a factor of greater than about 2, preferably by a factor of greater than about 5, and more preferably by a factor of greater than about 10, to produce the concentrated aerosol 240. According to the present invention, the concentrated aerosol 240 should typically contain greater than about $1 \times 10^7$ droplets per cubic centimeter, and more preferably from about $5 \times 10^7$ to about $5 \times 10^8$ droplets per cubic centimeter. A concentration of about $1 \times 10^8$ droplets per cubic centimeter of the concentrated aerosol is particularly preferred, because when the concentrated aerosol 240 is loaded more heavily than that, then the frequency of collisions between droplets becomes large enough to impair the properties of the concentrated aerosol 240, resulting in potential contamination of the particulate product 116 with an undesirably large quantity of over-sized particles. For example, if the aerosol 108 has a concentration of about $1 \times 10^7$ droplets per cubic centimeter, and the aerosol concentrator 236 concentrates droplets by a factor of 10, then the concentrated aerosol 240 will have a concentration of about $1 \times 10^8$ droplets per cubic centimeter. Stated another way, for example, when the aerosol generator generates the aerosol 108 with a droplet loading of about 0.167 milliliters liquid feed 102 per liter of carrier gas 104, the concentrated aerosol 240 would be loaded with about 1.67 milliliters of liquid feed 102 per liter of carrier gas 104, assuming the aerosol 108 is concentrated by a factor of 10.

Having a high droplet loading in aerosol feed to the furnace provides the important advantage of reducing the heating demand on the furnace 110 and the size of flow conduits required through the furnace. Also, other advantages of having a dense aerosol include a reduction in the demands on cooling and particle collection components, permitting significant equipment and operational savings. Furthermore, as system components are reduced in size, powder holdup within the system is reduced, which is also desirable. Concentration of the aerosol stream prior to entry into the furnace 110, therefore, provides a substantial advantage relative to processes that utilize less concentrated aerosol streams.

The excess carrier gas 238 that is removed in the aerosol concentrator 236 typically includes extremely small droplets that are also removed from the aerosol 108. Preferably, the droplets removed with the excess carrier gas 238 have a weight average size of smaller than about 1.5 microns, and more preferably smaller than about 1 micron and the droplets retained in the concentrated aerosol 240 have an average droplet size of larger than about 2 microns. For example, a virtual impactor sized to treat an aerosol stream having a weight average droplet size of about three microns might be designed to remove with the excess carrier gas 238 most droplets smaller than about 1.5 microns in size. Other designs are also possible. When using the aerosol generator 106 with the present invention, however, the loss of these very small droplets in the aerosol concentrator 236 will typically constitute no more than about 10 percent by weight, and more preferably no more than about 5 percent by weight, of the droplets originally in the aerosol stream that is fed to the concentrator 236. Although the aerosol concentrator 236 is useful in some situations, it is normally not required with the process of the present invention, because the aerosol generator 106 is capable, in most circumstances, of generating an aerosol stream that is sufficiently dense. So long as the aerosol stream coming out of the aerosol generator 102 is sufficiently dense, it is preferred that the aerosol concentrator not be used. It is a significant advantage of the present invention that the aerosol generator 106 normally generates such a dense aerosol stream that the aerosol concentrator 236 is not needed. Therefore, the complexity of operation of the aerosol concentrator 236 and accompanying liquid losses may typically be avoided.

It is important that the aerosol stream (whether it has been concentrated or not) that is fed to the furnace 110 have a high droplet flow rate and high droplet loading as would be required for most industrial applications. With the present invention, the aerosol stream fed to the furnace preferably includes a droplet flow of greater than about 0.5 liters per hour, more preferably greater than about 2 liters per hour, still more preferably greater than about 5 liters per hour, even more preferably greater than about 10 liters per hour, particularly greater than about 50 liters per hour and most preferably greater than about 100 liters per hour; and with the droplet loading being typically greater than about 0.04 milliliters of droplets per liter of carrier gas, preferably greater than about 0.083 milliliters of droplets per liter of carrier gas 104, more preferably greater than about 0.167 milliliters of droplets per liter of carrier gas 104, still more preferably greater than about 0.25 milliliters of droplets per liter of carrier gas 104, particularly greater than about 0.33 milliliters of droplets per liter of carrier gas 104 and most preferably greater than about 0.83 milliliters of droplets per liter of carrier gas 104.

One embodiment of a virtual impactor that could be used as the aerosol concentrator 236 will now be described with reference to FIGS. 26-32. A virtual impactor 246 includes an upstream plate assembly 248 (details shown in FIGS. 27-29) and a downstream plate assembly 250 (details shown in FIGS. 25-32), with a concentrating chamber 262 located between the upstream plate assembly 248 and the downstream plate assembly 250.

Through the upstream plate assembly 248 are a plurality of vertically extending inlet slits 254. The downstream plate assembly 250 includes a plurality of vertically extending exit slits 256 that are In alignment with the inlet slits 254. The exit slits 256 are, however, slightly wider than the inlet slits 254. The downstream plate assembly 250 also includes flow channels 258 that extend substantially across the width of the entire downstream plate assembly 250, with each flow channel 258 being adjacent to an excess gas withdrawal port 260.

During operation, the aerosol 108 passes through the inlet slits 254 and into the concentrating chamber 262. Excess carrier gas 238 is withdrawn from the concentrating chamber 262 via the excess gas withdrawal ports 260. The withdrawn excess carrier gas 238 then exits via a gas duct port 264. That portion of the aerosol 108 that is not withdrawn through the excess gas withdrawal ports 260 passes through the exit slits 256 and the flow channels 258 to form the concentrated aerosol 240. Those droplets passing across the concentrating chamber 262 and through the exit slits 256 are those droplets of a large enough size to have sufficient momentum to resist being withdrawn with the excess carrier gas 238.

As seen best in FIGS. 27-32, the inlet slits 254 of the upstream plate assembly 248 include inlet nozzle extension portions 266 that extend outward from the plate surface 268 of the upstream plate assembly 248. The exit slits 256 of the downstream plate assembly 250 include exit nozzle extension portions 270 extending outward from a plate surface 272 of the downstream plate assembly 250. These nozzle extension portions 266 and 270 are important for operation of the virtual impactor 246, because having these nozzle extension portions 266 and 270 permits a very close spacing to be attained between the inlet slits 254 and the exit slits 256 across the concentrating chamber 262, while also providing a relatively large space in the concentrating chamber 262 to facilitate efficient removal of the excess carrier gas 238.

Also as best seen in FIGS. 27-32, the inlet slits 254 have widths that flare outward toward the side of the upstream plate assembly 248 that is first encountered by the aerosol 108 during operation. This flared configuration reduces the sharpness of surfaces encountered by the aerosol 108, reducing the loss of aerosol droplets and potential interference from liquid buildup that could occur if sharp surfaces were present. Likewise, the exit slits 256 have a width that flares outward towards the flow channels 258, thereby allowing the concentrated aerosol 240 to expand into the flow channels 258 without encountering sharp edges that could cause problems.

As noted previously, both the inlet slits 254 of the upstream plate assembly 248 and the exit slits 256 of the downstream plate assembly 250 are vertically extending. This configuration is advantageous for permitting liquid that may collect around the inlet slits 254 and the exit slits 256 to drain away. The inlet slits 254 and the exit slits 256 need not, however, have a perfectly vertical orientation. Rather, it is often desirable to slant the slits backward (sloping upward and away in the direction of flow) by about five to ten degrees relative to vertical, to enhance draining of liquid off of the upstream plate assembly 248 and the downstream plate assembly 250. This drainage function of the vertically extending configuration of the inlet slits 254 and the outlet slits 256 also inhibits liquid build-up in the vicinity of the inlet slits 248 and the exit slits 250, which liquid build-up could result in the release of undesirably large droplets into the concentrated aerosol 240.

As discussed previously, the aerosol generator 106 of the present invention produces a concentrated, high quality aerosol of micro-sized droplets having a relatively narrow size distribution. It has been found, however, that for many applications the process of the present invention is significantly enhanced by further classifying by size the droplets in the aerosol 108 prior to introduction of the droplets into the furnace 110. In this manner, the size and size distribution of particles in the particulate product 116 are further controlled.

Figure 33:
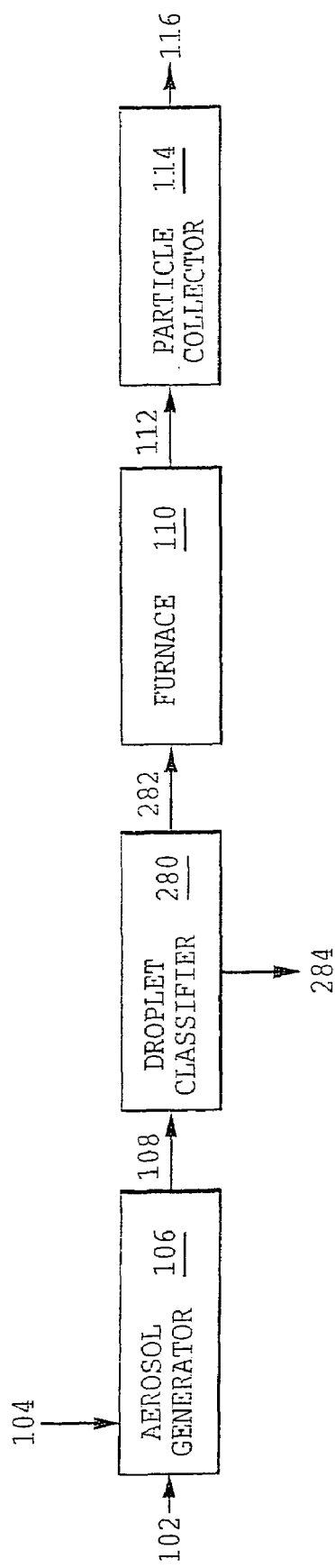
FIG. 33 is a process block diagram of one embodiment of the process of the present invention including a droplet classifier.

Referring now to FIG. 33, a process flow diagram is shown for one embodiment of the process of the present invention including such droplet classification. As shown in FIG. 33, the aerosol 108 from the aerosol generator 106 goes to a droplet classifier 280 where oversized droplets are removed from the aerosol 108 to prepare a classified aerosol 282. Liquid 284 from the oversized droplets that are being removed is drained from the droplet classifier 280. This drained liquid 284 may advantageously be recycled for use in preparing additional liquid feed 102.

Any suitable droplet classifier may be used for removing droplets above a predetermined size. For example, a cyclone could be used to remove over-size droplets. A preferred droplet classifier for many applications, however, is an impactor. One embodiment of an impactor for use with the present invention will now be described with reference to FIGS. 34-38.

Figure 34:
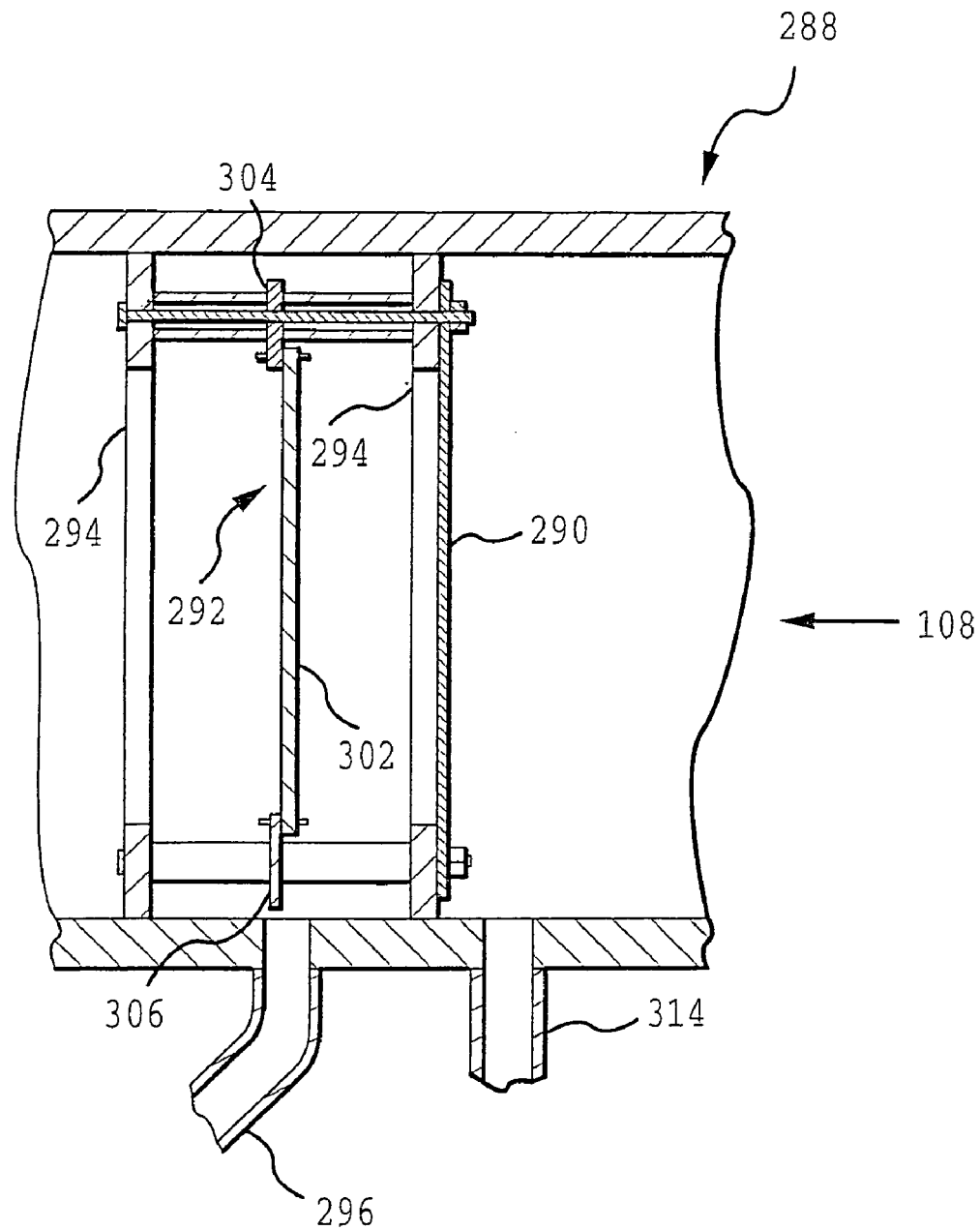
FIG. 34 is a top view in cross section of an impactor of the present invention for use in classifying an aerosol.

As seen in FIG. 34, an impactor 288 has disposed in a flow conduit 286 a flow control plate 290 and an impactor plate assembly 292. The flow control plate 290 is conveniently mounted on a mounting plate 294.

Figure 35:
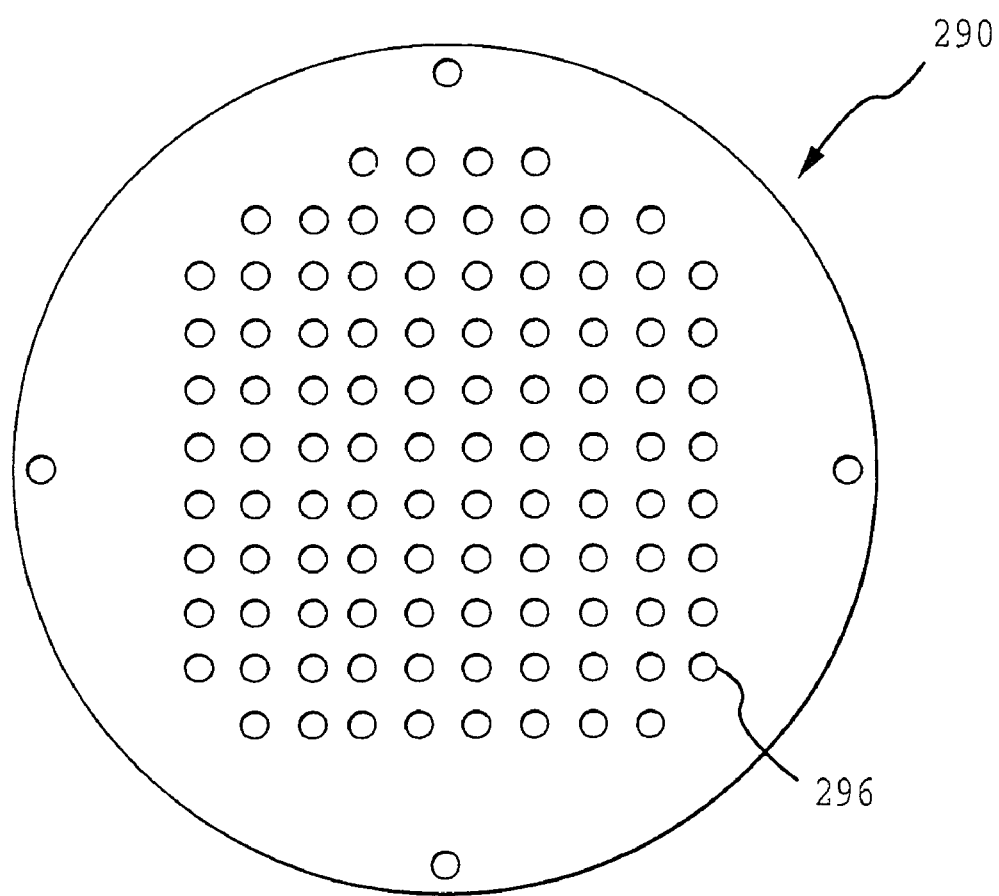
FIG. 35 is a front view of a flow control plate of the impactor shown in FIG. 34.

The flow control plate 290 is used to channel the flow of the aerosol stream toward the impactor plate assembly 292 in a manner with controlled flow characteristics that are desirable for proper impaction of oversize droplets on the impactor plate assembly 292 for removal through the drains 296 and 314. One embodiment of the flow control plate 290 is shown in FIG. 35. The flow control plate 290 has an array of circular flow ports 296 for channeling flow of the aerosol 108 towards the impactor plate assembly 292 with the desired flow characteristics.

Figure 36:
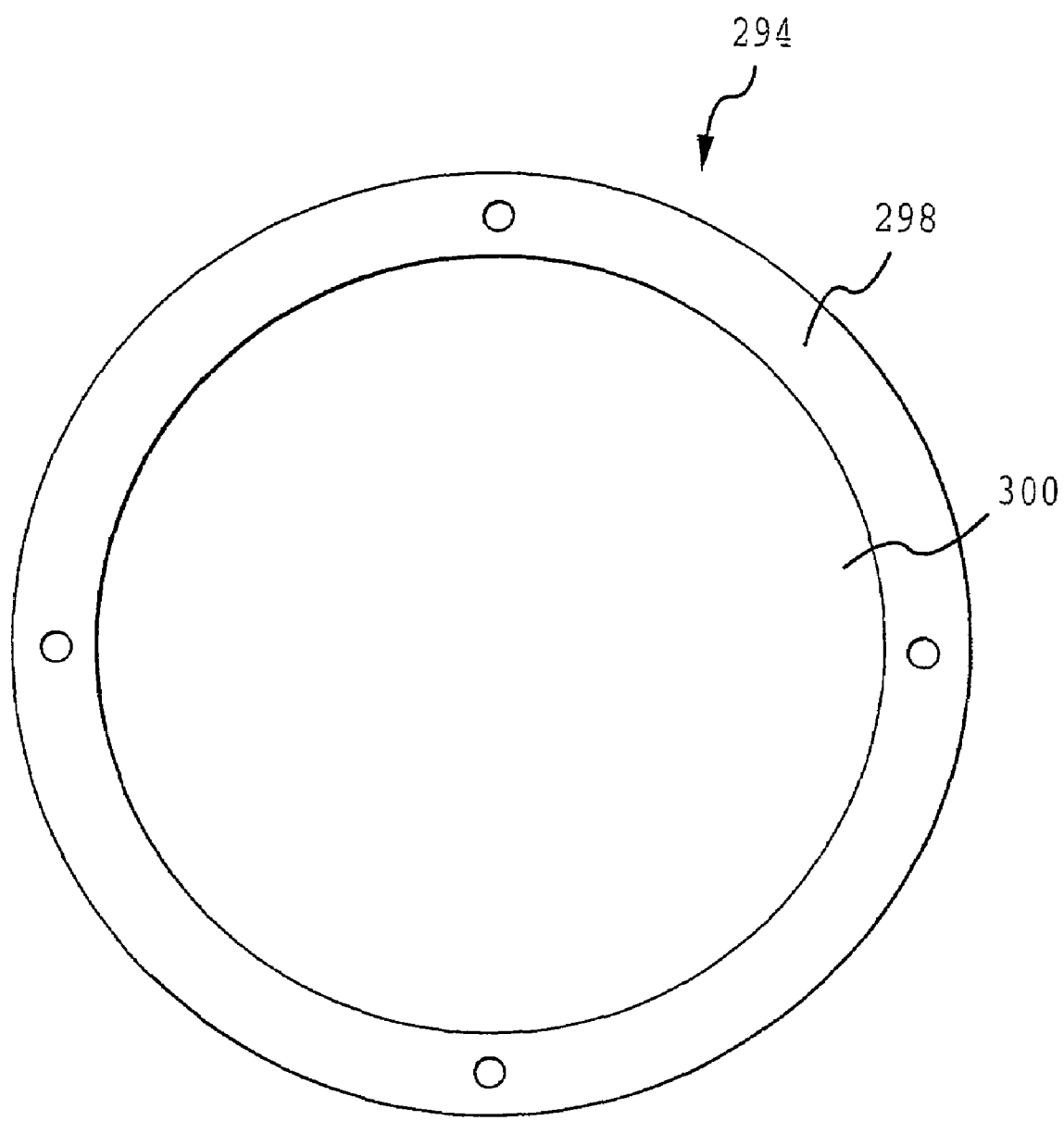
FIG. 36 is a front view of a mounting plate of the impactor shown in FIG. 34.

Details of the mounting plate 294 are shown in FIG. 36. The mounting plate 294 has a mounting flange 298 with a large diameter flow opening 300 passing therethrough to permit access of the aerosol 108 to the flow ports 296 of the flow control plate 290 (shown in FIG. 35).

Figure 37:
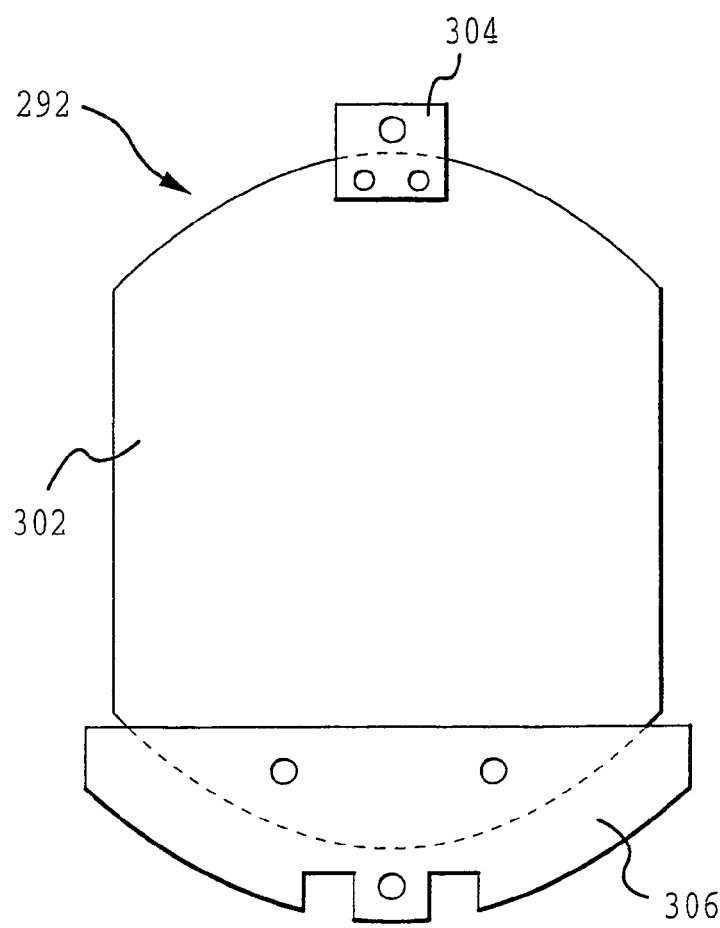
FIG. 37 is a front view of an impactor plate assembly of the impactor shown in FIG. 34.
Figure 38:
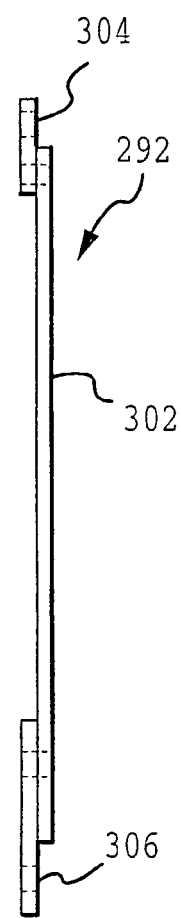
FIG. 38 is a side view of the impactor plate assembly shown in FIG. 37.

Referring now to FIGS. 37 and 38, one embodiment or an impactor plate assembly 292 is shown. The impactor plate assembly 292 includes an impactor plate 302 and mounting brackets 304 and 306 used to mount the impactor plate 302 inside of the flow conduit 286. The impactor plate 302 and the flow channel plate 290 are designed so that droplets larger than a predetermined size will have momentum that is too large for those particles to change flow direction to navigate around the impactor plate 302.

During operation of the impactor 288, the aerosol 108 from the aerosol generator 106 passes through the upstream flow control plate 290. Most of the droplets in the aerosol navigate around the impactor plate 302 and exit the impactor 288 through the downstream flow control plate 290 in the classified aerosol 282. Droplets in the aerosol 108 that are too large to navigate around the impactor plate 302 will impact on the impactor plate 302 and drain through the drain 296 to be collected with the drained liquid 284 (as shown in FIG. 34).

The configuration of the impactor plate 302 shown in FIG. 33 represents only one of many possible configurations for the impactor plate 302. For example, the impactor 288 could include an upstream flow control plate 290 having vertically extending flow slits therethrough that are offset from vertically extending flow slits through the impactor plate 302, such that droplets too large to navigate the change in flow due to the offset of the flow slits between the flow control plate 290 and the impactor plate 302 would impact on the impactor plate 302 to be drained away. Other designs are also possible.

In a preferred embodiment of the present invention, the droplet classifier 280 is typically designed to remove droplets from the aerosol 108 that are larger than about 15 microns in size, more preferably to remove droplets larger than about 10 microns in size, even more preferably to remove droplets of a size larger than about 8 microns in size and most preferably to remove droplets larger than about 5 microns in size. The droplet classification size in the droplet classifier is preferably smaller than about 15 microns, more preferably smaller than about 10 microns, even more preferably smaller than about 8 microns and most preferably smaller than about 5 microns. The classification size, also called the classification cut point, is that size at which half of the droplets of that size are removed and half of the droplets of that size are retained. Depending upon the specific application, however, the droplet classification size may be varied, such as by changing the spacing between the impactor plate 302 and the flow control plate 290 or increasing or decreasing aerosol velocity through the jets in the flow control plate 290. Because the aerosol generator 106 of the present invention initially produces a high quality aerosol 108, having a relatively narrow size distribution of droplets, typically less than about 30 weight percent of liquid feed 102 in the aerosol 108 Is removed as the drain liquid 284 in the droplet classifier 288, with preferably less than about 25 weight percent being removed, even more preferably less than about 20 weight percent being removed and most preferably less than about 15 weight percent being removed. Minimizing the removal of liquid feed 102 from the aerosol 108 is particularly important for commercial applications to increase the yield of high quality particulate product 116. it should be noted, however, that because of the superior performance of the aerosol generator 106, it is frequently not required to use an impactor or other droplet classifier to obtain a desired absence of oversize droplets to the furnace. This is a major advantage, because the added complexity and liquid losses accompanying use of an impactor may often be avoided with the process of the present invention.

Figure 39:
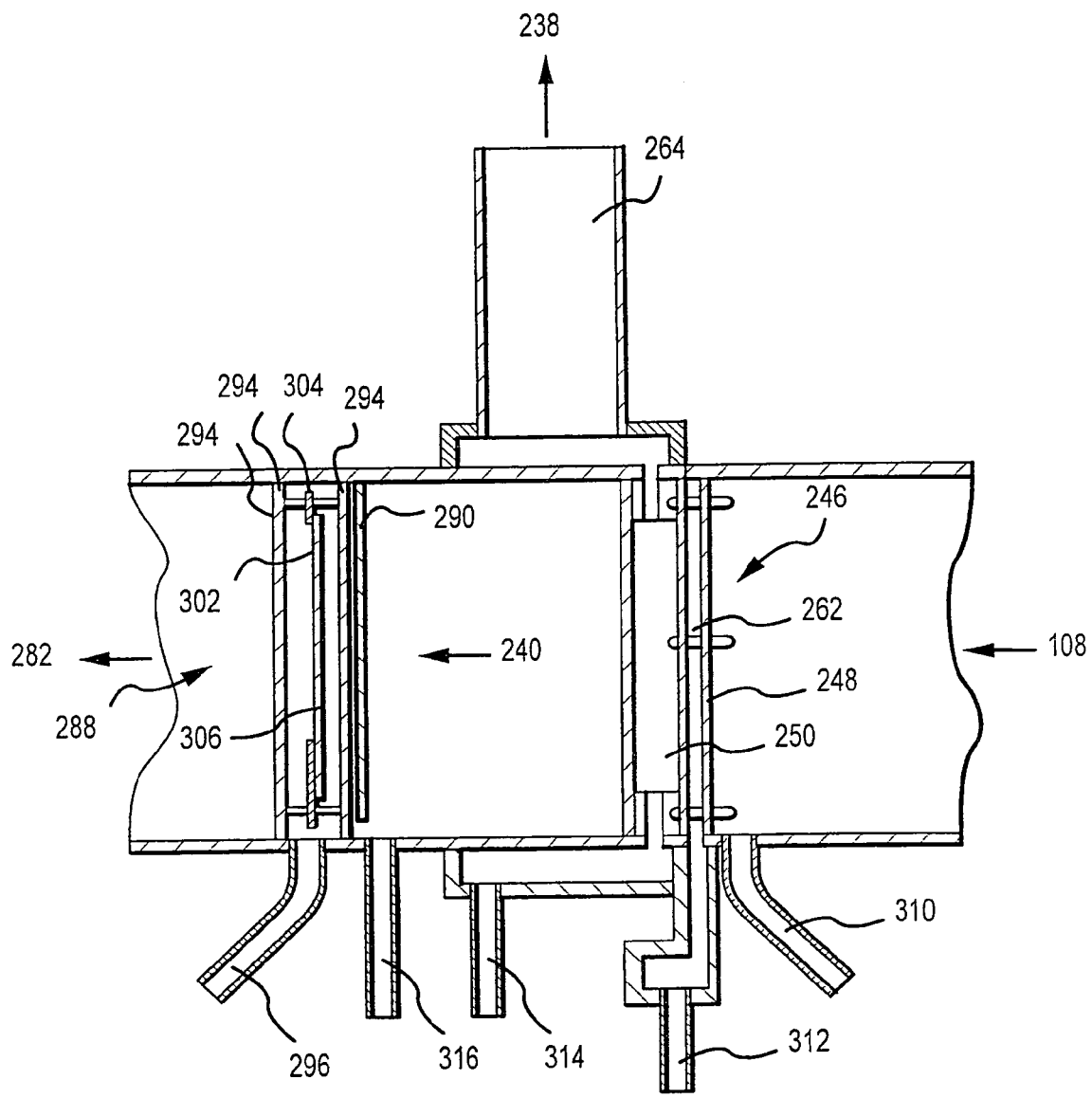
FIG. 39 shows a side view in cross section of a virtual impactor in combination with an impactor of an aerosol concentrator, a droplet classifier, a furnace, a particle cooler, and a particle collector.

Sometimes it is desirable to use both the aerosol concentrator 236 and the droplet classifier 280 to produce an extremely high quality aerosol stream for introduction into the furnace for the production of particles of highly controlled size and size distribution. Referring now to FIG. 39, one embodiment of the present invention is shown incorporating both the virtual impactor 246 and the impactor 288. Basic components of the virtual impactor 246 and the impactor 288, as shown in FIG. 39, are substantially as previously described with reference to FIGS. 26-38. As seen in FIG. 39, the aerosol 108 from the aerosol generator 106 is fed to the virtual impactor 246 where the aerosol stream is concentrated to produce the concentrated aerosol 240. The concentrated aerosol 240 is then fed to the impactor 288 to remove large droplets therefrom and produce the classified aerosol 282, which may then be fed to the furnace 110. Also, it should be noted that by using both a virtual impactor and an impactor, both undesirably large and undesirably small droplets are removed, thereby producing a classified aerosol with a very narrow droplet size distribution. Also, the order of the aerosol concentrator and the aerosol classifier could be reversed, so that the aerosol concentrator 236 follows the aerosol classifier 280.

One important feature of the design shown in FIG. 39 is the incorporation of drains 310, 312, 314, 316 and 296 at strategic locations. These drains are extremely important for industrial-scale particle production because buildup of liquid in the process equipment can significantly impair the quality of the particulate product 116 that is produced. In that regard, drain 310 drains liquid away from the inlet side of the first plate assembly 248 of the virtual impactor 246. Drain 312 drains liquid away from the inside of the concentrating chamber 262 in the virtual impactor 246 and drain 314 removes liquid that deposits out of the excess carrier gas 238. Drain 316 removes liquid from the vicinity of the inlet side of the flow control plate 290 of the impactor, while the drain 296 removes liquid from the vicinity of the impactor plate 302. Without these drains 310, 312, 314, 316 and 296, the performance of the apparatus shown in FIG. 39 would be significantly impaired. All liquids drained in the drains 310, 312, 314, 316 and 296 may advantageously be recycled for use to prepare the liquid feed 102.

Figure 40:
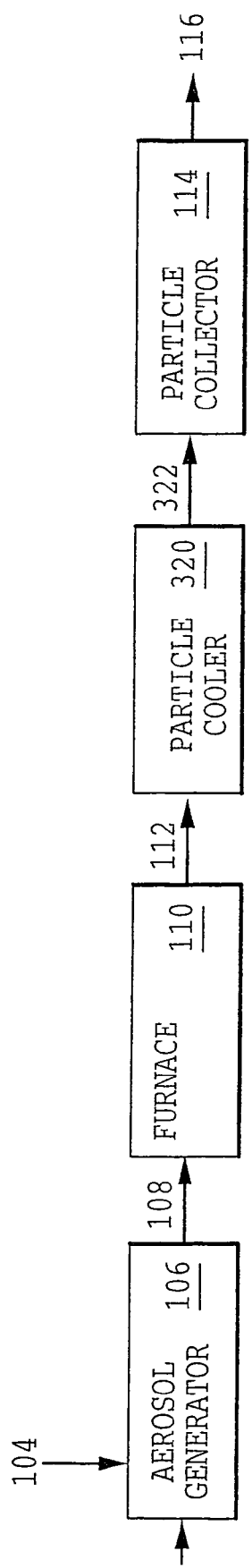

With some applications of the process of the present invention, it may be possible to collect the particles 112 directly from the output of the furnace 110. More often, however, it will be desirable to cool the particles 112 exiting the furnace 110 prior to collection of the particles 112 in the particle collector 114. Referring now to FIG. 40, one embodiment of the process of the present invention is shown in which the particles 112 exiting the furnace 110 are sent to a particle cooler 320 to produce a cooled particle stream 322, which is then feed to the particle collector 114. Although the particle cooler 320 may be any cooling apparatus capable of cooling the particles 112 to the desired temperature for introduction into the particle collector 114, traditional heat exchanger designs are not preferred. This is because a traditional heat exchanger design ordinarily directly subjects the aerosol stream, in which the hot particles 112 are suspended, to cool surfaces. In that situation, significant losses of the particles 112 occur due to thermophoretic deposition of the hot particles 112 on the cool surfaces of the heat exchanger. According to the present invention, a gas quench apparatus is provided for use as the particle cooler 320 that significantly reduces thermophoretic losses compared to a traditional heat exchanger.

Referring now to FIGS. 41-43, one embodiment of a gas quench cooler 330 is shown. The gas quench cooler includes a perforated conduit 332 housed inside of a cooler housing 334 with an annular space 336 located between the cooler housing 334 and the perforated conduit 332. In fluid communication with the annular space 336 is a quench gas inlet box 338, inside of which is disposed a portion or an aerosol outlet conduit 340. The perforated conduit 332 extends between the aerosol outlet conduit 340 and an aerosol inlet conduit 342. Attached to an opening into the quench gas inlet box 338 are two quench gas feed tubes 344. Referring specifically to FIG. 43, the perforated tube 332 is shown. The perforated tube 332 has a plurality of openings 345. The openings 345, when the perforated conduit 332 is assembled into the gas quench cooler 330, permit the flow of quench gas 346 from the annular space 336 into the interior space 348 of the perforated conduit 332. Although the openings 345 are shown as being round holes, any shape of opening could be used, such as slits. Also, the perforated conduit 332 could be a porous screen. Two heat radiation shields 347 prevent downstream radiant heating from the furnace. In most instances, however, it will not be necessary to include the heat radiation shields 347, because downstream radiant heating from the furnace is normally not a significant problem. Use of the heat radiation shields 347 is not preferred due to particulate losses that accompany their use.

With continued reference to FIGS. 41-43, operation of the gas quench cooler 330 will now be described. During operation, the particles 112, carried by and dispersed in a gas stream, enter the gas quench cooler 330 through the aerosol inlet conduit 342 and flow into the interior space 348 of perforated conduit 332. Quench gas 346 is introduced through the quench gas feed tubes 344 into the quench gas inlet box 338. Quench gas 346 entering the quench gas inlet box 338 encounters the outer surface of the aerosol outlet conduit 340, forcing the quench gas 346 to flow, in a spiraling, swirling manner, into the annular space 336, where the quench gas 346 flows through the openings 345 through the walls of the perforated conduit 332. Preferably, the gas 346 retains some swirling motion even after passing into the interior space 348. In this way, the particles 112 are quickly cooled with low losses of particles to the walls of the gas quench cooler 330. In this manner, the quench gas 346 enters in a radial direction into the interior space 348 of the perforated conduit 332 around the entire periphery, or circumference, of the perforated conduit 332 and over the entire length of the perforated conduit 332. The cool quench gas 346 mixes with and cools the hot particles 112, which then exit through the aerosol outlet conduit 340 as the cooled particle stream 322. The cooled particle stream 322 can then be sent to the particle collector 114 for particle collection. The temperature of the cooled particle stream 322 is controlled by introducing more or less quench gas. Also, as shown in FIG. 41, the quench gas 346 is fed into the quench cooler 330 in counter flow to flow of the particles. Alternatively, the quench cooler could be designed so that the quench gas 346 is fed into the quench cooler in concurrent flow with the flow of the particles 112. The amount of quench gas 346 fed to the gas quench cooler 330 will depend upon the specific material being made and the specific operating conditions. The quantity of quench gas 346 used, however, must be sufficient to reduce the temperature of the aerosol steam including the particles 112 to the desired temperature. Typically, the particles 112 are cooled to a temperature at least below about 200° C., and often lower. The only limitation on how much the particles 112 are cooled is that the cooled particle stream 322 must be at a temperature that is above the condensation temperature for water as another condensible vapor in the stream. The temperature of the cooled particle stream 322 Is often at a temperature or from about 50° C. to about 120° C.

Because of the entry of quench gas 346 into the interior space 348 of the perforated conduit 322 in a radial direction about the entire circumference and length of the perforated conduit 322, a buffer of the cool quench gas 346 is formed about the inner wall of the perforated conduit 332, thereby significantly inhibiting the loss of hot particles 112 due to thermophoretic deposition on the cool wall of the perforated conduit 332. In operation, the quench gas 346 exiting the openings 345 and entering into the interior space 348 should have a radial velocity (velocity inward toward the center of the circular cross-section of the perforated conduit 332) of larger than the thermophoretic velocity of the particles 112 inside the perforated conduit 332 in a direction radially outward toward the perforated wall of the perforated conduit 332.

As seen in FIGS. 41-43, the gas quench cooler 330 includes a flow path for the particles 112 through the gas quench cooler of a substantially constant cross-sectional shape and area. Preferably, the flow path through the gas quench cooler 330 will have the same cross-sectional shape and area as the flow path through the furnace 110 and through the conduit delivering the aerosol 108 from the aerosol generator 106 to the furnace 110. In one embodiment, however, it may be necessary to reduce the cross-sectional area available for flow prior to the particle collector 114. This is the case, for example, when the particle collector includes a cyclone for separating particles in the cooled particle stream 322 from gas in the cooled particle stream 322. This is because of the high inlet velocity requirements into cyclone separators.

Figure 44:
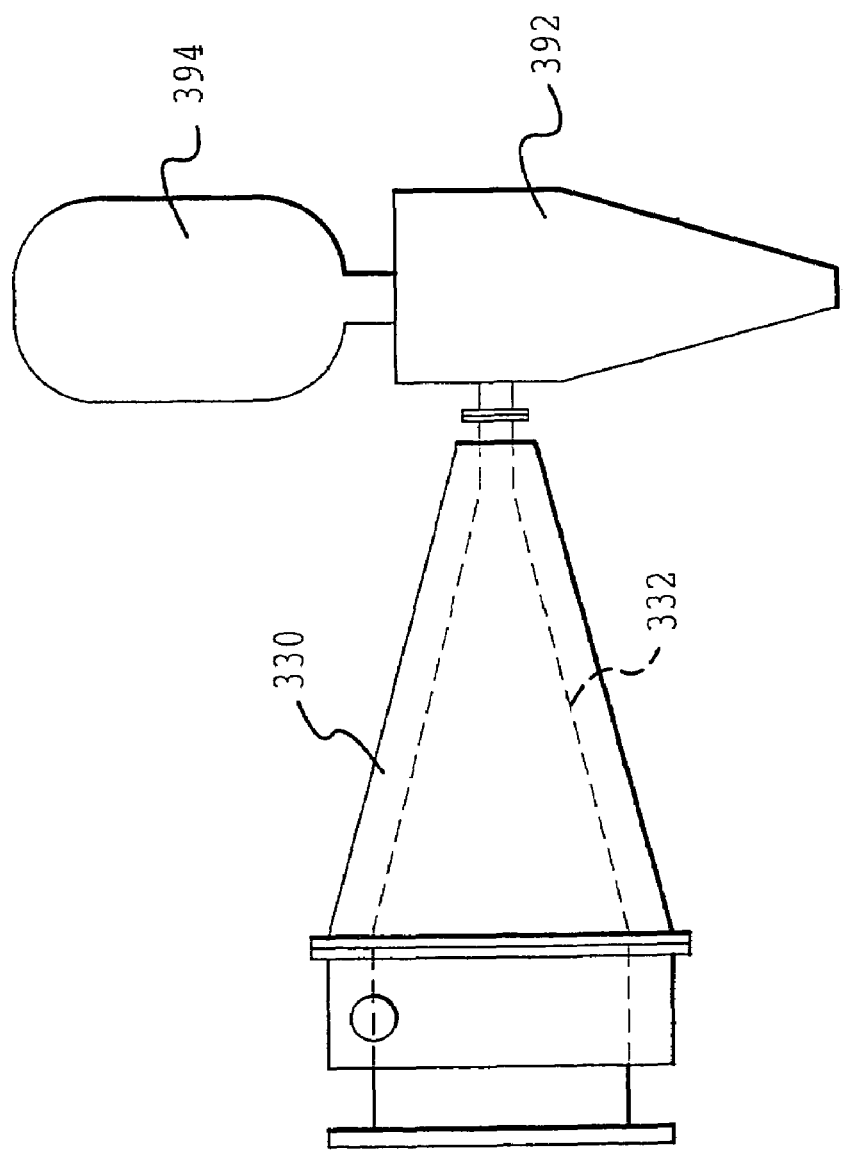

Referring now to FIG. 44, one embodiment of the gas quench cooler 330 is shown in combination with a cyclone separator 392. The perforated conduit 332 has a continuously decreasing cross-sectional area for flow to increase the velocity of flow to the proper value for the feed to cyclone separator 392. Attached to the cyclone separator 392 is a bag filter 394 for final clean-up of overflow from the cyclone separator 392. Separated particles exit with underflow from the cyclone separator 392 and may be collected in any convenient container. The use of cyclone separation is particularly preferred for powder having a weight average size of larger than about 1 micron, although a series of cyclones may sometimes be needed to get the desired degree of separation. Cyclone separation is particularly preferred for powders having a weight average size of larger than about 1.5 microns. Also, cyclone separation is best suited for high density materials. Preferably, when particles are separated using a cyclone, the particles have a composition with specific gravity of greater than about 5.

In an additional embodiment, the process of the present invention can also incorporate compositional modification of the particles 112 exiting the furnace. Most commonly, the compositional modification will involve forming on the particles 112 a material phase that is different than that of the particles 112, such as by coating the particles 112 with a coating material. One embodiment of the process of the present invention incorporating particle coating is shown in FIG. 45. As shown in FIG. 45, the particles 112 exiting from the furnace 110 go to a particle coater 350 where a coating is placed over the outer surface of the particles 112 to form coated particles 352, which are then sent to the particle collector 114 for preparation of the particulate product 116.

In the particle coater 350, the particles 112 are coated using any suitable particle coating technology, such as by gas-to-particle conversion. Preferably, however, the coating is accomplished by chemical vapor deposition (CVD) and/or physical vapor deposition (PVD). In CVD coating, one or more vapor phase coating precursors are reacted to form a surface coating on the particles 112. Preferred coatings deposited by CVD include oxides, such as silica, and elemental metals. In PVD coating, coating material physically deposits on the surface of the particles 112. Preferred coatings deposited by PVD include organic materials and elemental metals, such as elemental silver, copper and gold. Another possible surface coating method is surface conversion or the surface portion of the particles 112 by reaction with a vapor phase reactant to convert a surface portion of the particles to a different material than that originally contained in the particles 112. Although any suitable apparatus may be used for the particle coater 350, when a gaseous coating feed involving coating precursors is used, such as for CVD and PVD, feed of the gaseous coating feed is introduced through a circumferentially perforated conduit, such as was described for the quench cooler 330 with reference to FIGS. 41-44. In some instances, the quench cooler 330 may also act as the particle coater 350, when coating material precursors are included in the quench gas 346.

With continued reference primarily to FIG. 45, in a preferred embodiment, when the particles 112 are coated according to the process of the present invention, the particles 112 are also manufactured via the aerosol process of the present invention, as previously described. The process of the present invention can, however, be used to coat particles that have been premanufactured by a different process, such as by a liquid precipitation route. When coating particles that have been premanufactured by a different route, such as by liquid precipitation, it is preferred that the particles remain in a dispersed state from the time of manufacture to the time that the particles are introduced in slurry form into the aerosol generator 106 for preparation of the aerosol 108 to form the dry particles 112 in the furnace 110, which particles 112 can then be coated in the particle coater 350. Maintaining particles in a dispersed state from manufacture through coating avoids problems associated with agglomeration and redispersion of particles if particles must be redispersed in the liquid feed 102 for feed to the aerosol generator 106. For example, for particles originally precipitated from a liquid medium, the liquid medium containing the suspended precipitated particles could be used to form the liquid feed 102 to the aerosol generator 106. It should be noted that the particle coater 350 could be an integral extension of the furnace 110 or could be a separate piece of equipment.

In a further embodiment of the present invention, following preparation of the particles 112 in the furnace 110, the particles 112 may then be structurally modified to impart desired physical properties prior to particle collection. Referring now to FIG. 46, one embodiment of the process of the present invention is shown including such structural particle modification. The particles 112 exiting the furnace 110 go to a particle modifier 360 where the particles are structurally modified to form modified particles 362, which are then sent to the particle collector 114 for preparation of the particulate product 116. The particle modifier 360 is typically a furnace, such as an annealing furnace, which may be integral with the furnace 110 or may be a separate heating device. Regardless, it is important that the particle modifier 360 have temperature control that is independent of the furnace 110, so that the proper conditions for particle modification may be provided separate from conditions required of the furnace 110 to prepare the particles 112. The particle modifier 360, therefore, typically provides a temperature controlled environment and necessary residence time to effect the desired structural modification of the particles 112.

The structural modification that occurs in the particle modifier 360 may be any modification to the crystalline structure or morphology of the particles 112. For example, the particles 112 may be annealed in the particle modifier 360 to density the particles 112 or to recrystallize the particles 112 into a polycrystalline or single crystalline form. Also, especially in the case of composite particles 112, the particles may be annealed for a sufficient time to permit redistribution within the particles 112 of different material phases.

Figure 47:
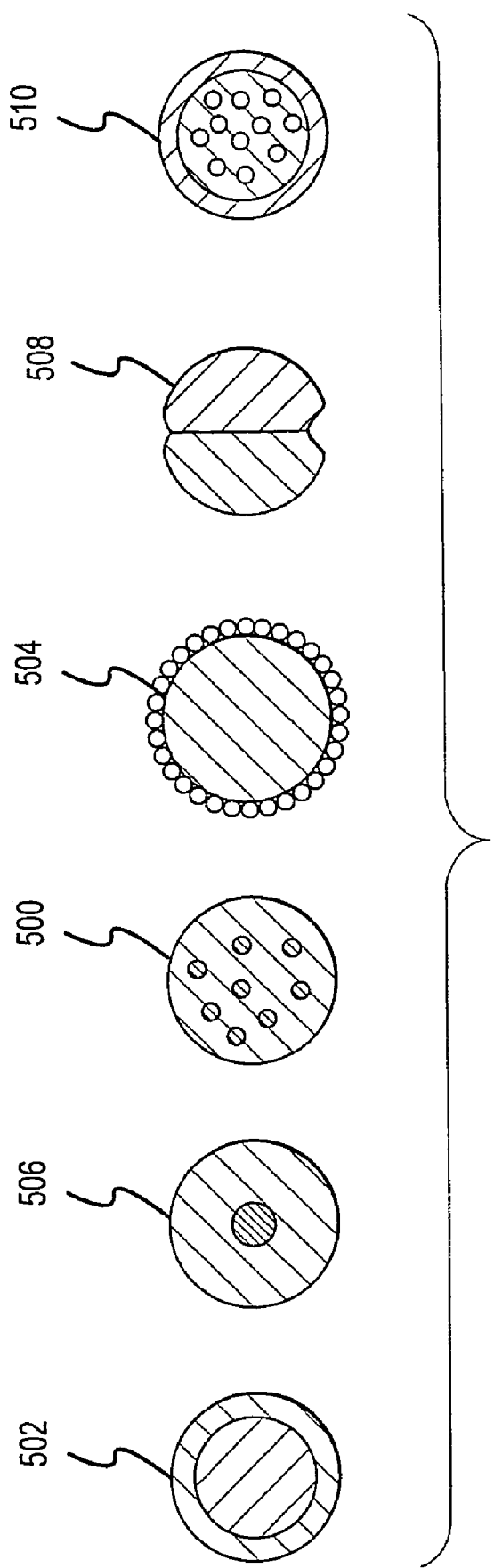

The initial morphology of composite particles made in the furnace 110, according to the present invention, could take a variety of forms, depending upon the specified materials involved and the specific processing conditions. Examples of some possible composite particle morphologies, manufacturable according to the present invention are shown in FIG. 47. These morphologies could be of the particles as initially produced in the furnace 110 or that result from structural modification in the particle modifier 360. Furthermore, the composite particles could include a mixture of the morphological attributes shown in FIG. 47.

Figure 48:
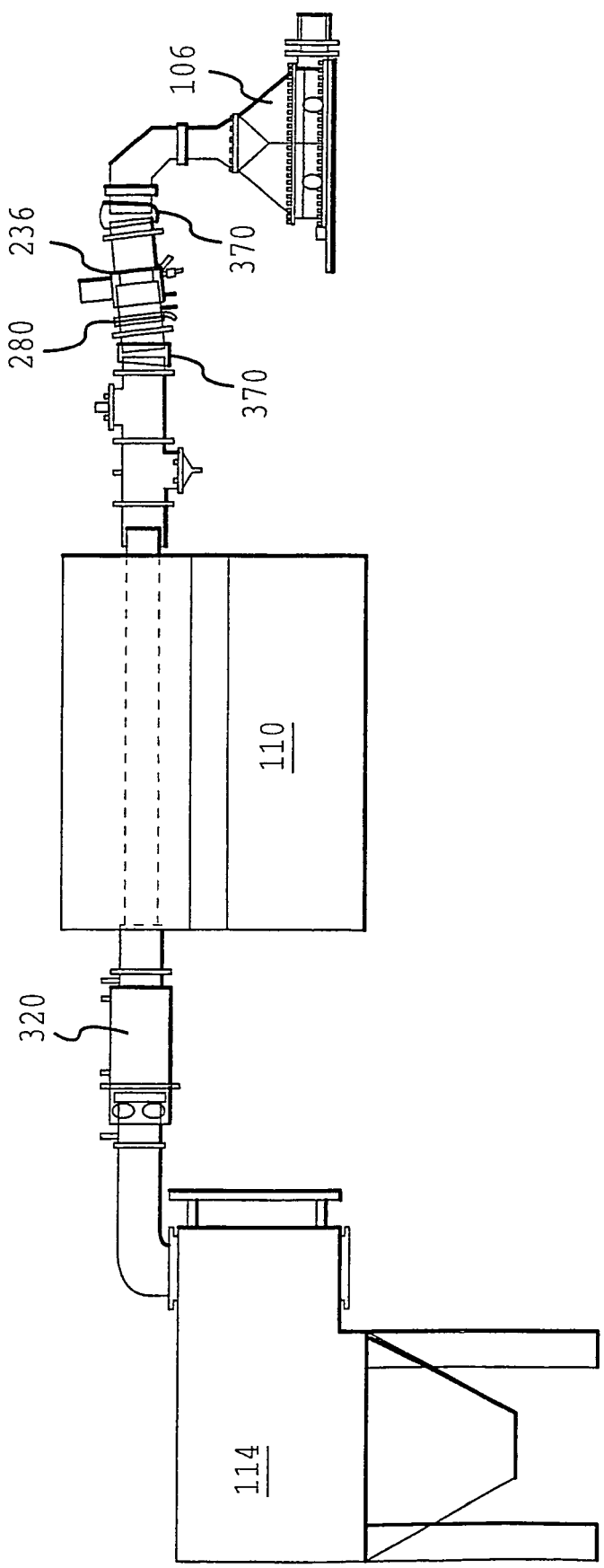

Referring now to FIG. 48, an embodiment of the apparatus of the present invention is shown that includes the aerosol generator 106 (in the form of the 400 transducer array design) the aerosol concentrator 236 (in the form of a virtual impactor), the droplet classifier 280 (in the form of an impactor), the furnace 110, the particle cooler 320 (in the form of a gas quench cooler) and the particle collector 114 (in the form of a bag filter). All process equipment components are connected via appropriate flow conduits that are substantially free of sharp edges that could detrimentally cause liquid accumulations in the apparatus. Also, it should be noted that flex connectors 370 are used upstream and downstream of the aerosol concentrator 236 and the droplet classifier 280. By using the flex connectors 370, it is possible to vary the angle of slant of vertically extending slits in the aerosol concentrator 236 and/or the droplet classifier 280. In this way, a desired slant for the vertically extending slits may be set to optimize the draining characteristics off the vertically extending slits.

Aerosol generation with the process of the present invention has thus far been described with respect to the ultrasonic aerosol generator. Use of the ultrasonic generator is preferred for the process of the present invention because of the extremely high quality and dense aerosol generated. In some instances, however, the aerosol generator for the process of the present invention may have a different design depending upon the specific application. For example, when larger particles are desired, such as those having a weight average size of larger than about 3 microns, a spray nozzle atomizer may be preferred. For smaller-particle applications, however, and particularly for those applications to produce particles smaller than about 3 microns, and preferably smaller than about 2 microns in size, as is generally desired with the silver-containing particles of the present invention, the ultrasonic generator, as described herein, is particularly preferred. In that regard, the ultrasonic generator of the present invention is particularly preferred for when making particles with a weight average size or from about 0.2 micron to about 3 microns.

Although ultrasonic aerosol generators have been used for medical applications and home humidifiers, use of ultrasonic generators or spray pyrolysis particle manufacture has largely been confined to small-scale, experimental situations. The ultrasonic aerosol generator of the present invention described with reference to FIGS. 5-24, however, is well suited for commercial production of high quality silver-containing powders with a small average size and a narrow size distribution. In that regard, the aerosol generator produces a high quality aerosol, with heavy droplet loading and at a high rate of production. Such a combination of small droplet size, narrow size distribution, heavy droplet loading, and high production rate provide significant advantages over existing aerosol generators that usually suffer from at least one of inadequately narrow size distribution, undesirably low droplet loading, or unacceptably low production rate.

Through the careful and controlled design of the ultrasonic generator of the present invention, an aerosol may be produced typically having greater than about 70 weight percent (and preferably greater than about 80 weight percent) of droplets in the size range of from about 1 micron to about 10 microns, preferably in a size range of from about 1 micron to about 5 microns and more preferably from about 2 microns to about 4 microns. Also, the ultrasonic generator of the present invention is capable of delivering high output rates of liquid feed in the aerosol. The rate of liquid feed, at the high liquid loadings previously described, is preferably greater than about 25 milliliters per hour per transducer, more preferably greater than about 37.5 milliliters per hour per transducer, even more preferably greater than about 50 milliliters per hour per transducer and most preferably greater than about 100 millimeters per hour per transducer. This high level of performance is desirable for commercial operations and is accomplished with the present invention with a relatively simple design including a single precursor bath over an array of ultrasonic transducers. The ultrasonic generator is made for high aerosol production rates at a high droplet loading, and with a narrow size distribution of droplets. The generator preferably produces an aerosol at a rate of greater than about 0.5 liter per hour of droplets, more preferably greater than about 2 liters per hour of droplets, still more preferably greater than about 5 liters per hour of droplets, even more preferably greater than about 10 liters per hour of droplets and most preferably greater than about 40 liters per hour of droplets. For example, when the aerosol generator has a 400 transducer design, as described with reference to FIGS. 7-24, the aerosol generator is capable of producing a high quality aerosol having high droplet loading as previously described, at a total production rate of preferably greater than about 10 liters per hour of liquid feed, more preferably greater than about 15 liters per hour of liquid feed, even more preferably greater than about 20 liters per hour of liquid feed and most preferably greater than about 40 liters per hour of liquid feed.

Under most operating conditions, when using such an aerosol generator, total particulate produce produced is preferably greater than about 0.5 gram per hour per transducer, more preferably greater than about 0.75 gram per hour per transducer, even more preferably greater than about 1.0 gram per hour per transducer and most preferably greater than about 2.0 grams per hour per transducer.

The concentrations or soluble precursors in the liquid feed 102 will vary depending upon the particular materials involved and the particular particle composition and particle morphology desired. For most applications, when soluble precursor(s) are used, the soluble precursor(s) are present at a concentration of from about 1-50 weight percent of the liquid feed 102. In any event, however, when soluble precursors are used, the precursors should be at a low enough concentration to permit the liquid feed to be ultrasonically atomized and to prevent premature precipitation or materials from the liquid feed 102. The concentration of suspended particulate precursors will also vary depending upon the particular materials involved in the particular application.

One significant aspect of the process of the present invention for manufacturing particulate materials is the unique flow characteristics encountered in the furnace relative to laboratory scale systems. The maximum Reynolds number attained for low in the furnace 110 with the present invention is very high, typically in excess of 500, preferably in excess of 1,000 and more preferably in excess of 2,000. In most instances, however, the maximum Reynolds number for flow in the furnace will not exceed 10,000, and preferably will not exceed 5,000. This is significantly different from lab-scale systems where the Reynolds number for flow in a reactor is typically lower than 50 and rarely exceeds 100.

The Reynolds number is a dimensionless quantity characterizing flow of a fluid which, for flow through a circular cross sectional conduit is defined as:

$$Re = \frac{\rho v d}{\mu}$$

where:
  $\rho$=fluid density;
  v=fluid mean velocity;
  d=conduit inside diameter; and
  $\mu$=fluid viscosity.

It should be noted that the values for density, velocity and viscosity will vary along the length of the furnace 110. The maximum Reynolds number in the furnace 110 is typically attained when the average stream temperature is at a maximum, because the gas velocity is at a very high value due to gas expansion upon heating.

One problem with operating under flow conditions at a high Reynolds number is that undesirable volatilization of components is much more likely to occur than in systems having flow characteristics as found in laboratory-scale systems. The volatilization problem occurs with the present invention, because the furnace is typically operated over a substantial section of the heating zone in a constant wall heat flux mode, due to limitations in heat transfer capability. This is significantly different than operation of a furnace at a laboratory scale, which typically involves operation of most of the heating zone of the furnace in a uniform wall temperature mode, because the heating load is sufficiently small that the system is not heat transfer limited.

With the present invention, it is typically preferred to heat the aerosol stream in the heating zone of the furnace as quickly as possible to the desired temperature range for particle manufacture. Because of flow characteristics in the furnace and heat transfer limitations, during rapid heating or the aerosol the wall temperature of the furnace can significantly exceed the maximum average target temperature for the stream. This is a problem because, even though the average stream temperature may be within the range desired, the wall temperature may become so hot that components in the vicinity of the wall are subjected to temperatures high enough to undesirably volatilize the components. This volatilization near the wall of the furnace can cause formation of significant quantities of ultrafine particles that are outside of the size range desired.

Therefore, with the present invention, it is preferred that when the flow characteristics in the furnace are such that the Reynolds number through any part of the furnace exceeds 500, more preferably exceeds 1,000, and most preferably exceeds 2,000, the maximum wall temperature in the furnace should be kept at a temperature that is below the temperature at which a desired component of the fine particles would exert a vapor pressure not exceeding about 200 millitorr, more preferably not exceeding about 100 millitorr, and most preferably not exceeding about 50 millitorr. Furthermore, the maximum wall temperature in the furnace should also be kept below a temperature at which an intermediate component, from which a final component is to be at least partially derived, should also have a vapor pressure not exceeding the magnitudes noted for components of the final product.

For example, when the particles being manufactured are substantially pure silver, the maximum wall temperature should be kept at a temperature at which silver exerts a vapor pressure not exceeding about 200 millitorr, preferably not exceeding about 100 millitorr, and most preferably not exceeding about 50 millitorr. In that regard, silver exerts a vapor pressure of about 200 millitorr at about 1210° C., a vapor pressure of about 100 millitorr at about 1180° C., and a vapor pressure of about 50 millitorr at about 1130° C. Furthermore, it should be noted that when making an alloy, such as a silver/palladium alloy, the alloy composition will often exert a much lower vapor pressure than would pure silver. Nevertheless, the maximum wall temperature should preferably be maintained at a temperature at which the vapor pressure of pure silver would not exceed the stated vapor pressure levels. This is because that during pyrolysis in the furnace, silver may volatilize prior to alloying with the other metal, causing the undesirable formation of ultrafine silver particles.

In addition to maintaining the furnace wall temperature below a level that could create volatilization problems, it is also important that this not be accomplished at the expense of the desired average stream temperature. The maximum average stream temperature must be maintained at a high enough level so that the particles will have a desired high density. The maximum average stream temperature should, however, generally be a temperature at which a component in the final particles, or an intermediate component from which a component in the final particles is at least partially derived, would exert a vapor pressure not exceeding about 100 millitorr, preferably not exceeding about 50 millitorr, and most preferably not exceeding about 25 millitorr.

So long as the maximum wall temperature and the average stream temperature are kept below the point at which detrimental volatilization occurs, it is generally desirable to heat the stream as fast as possible and to remove resulting particles from the furnace immediately after the maximum average stream temperature is reached in the furnace. With the present invention, the average residence time in the heating zone of the furnace may typically be maintained at shorter than about 4 seconds, preferably shorter than about 2 seconds, more preferably shorter than about 1 second and most preferably shorter than about 0.5 second.

Another significant issue with respect to operating the process of the present invention, which includes high aerosol flow rates, is loss within the system of materials intended for incorporation into the final particulate product. Material losses in the system can be quite high if the system is not properly operated. If system losses are too high, the process would not be practical for use in the manufacture of particulate products of many materials. This has typically not been a major consideration with laboratory-scale systems.

One significant potential for loss with the process of the present invention is thermophoretic losses that occur when a hot aerosol stream is in the presence of a cooler surface. In that regard, the use of the quench cooler, as previously described, with the process of the present invention provides an efficient way to cool the particles without unreasonably high thermophoretic losses. There is also, however, significant potential for losses occurring at the end section of the furnace and between the furnace and the cooling unit.

It has been found that thermophoretic losses in the back end of the furnace can be significantly controlled if the heating zone of the furnace is operated such that the maximum average stream temperature is not attained until near the end of the heating zone in the furnace, and at least not until the last third of the heating zone. When the heating zone includes a plurality of heating sections, the maximum average stream temperature should not occur until at least the last heating section. Furthermore, the heating zone should extend to as close to the exit of the furnace as possible. This is counter to conventional thought which is to typically maintain the exit portion of the furnace at a low temperature to avoid having to seal the furnace outlet at a high temperature. Such cooling of the exit portion of the furnace, however, significantly promotes thermophoretic losses. Furthermore, the potential for operating problems that could result in thermophoretic losses at the back end of the furnace are reduced with the very short residence times in the furnace for the present invention, as discussed previously.

Ideally, upon exiting the furnace the aerosol would be cooled instantaneously. This is not possible. It is possible, however, to make the residence time between the furnace outlet and the cooling unit as short as possible. Furthermore, it is desirable to insulate the aerosol conduit occurring between the furnace exit and the cooling unit entrance. Even more preferred is to insulate that conduit and, even more preferably, to also heat that conduit so that the wall temperature of that conduit is at least as high as the average stream temperature of the aerosol stream. Furthermore, it is desirable that the cooling unit operate in a manner such that the aerosol is quickly cooled in a manner to prevent thermophoretic losses during cooling. The quench cooler, described previously, is very effective for cooling with low losses. Furthermore, to keep the potential for thermophoretic losses very low, it is preferred that the residence time of the aerosol stream between attaining the maximum average stream temperature in the furnace and a point at which the aerosol has been cooled to an average stream temperature below about 200° C. is shorter than about 2 seconds, more preferably shorter than about 1 second, and even more preferably shorter than about 0.5 second and most preferably shorter than about 0.1 second. In most instances, the maximum average stream temperature attained in the furnace will be greater than about 800° C. Furthermore, the total residence time from the beginning of the heating zone in the furnace to a point at which the average stream temperature is at a temperature below about 200° C. should typically be shorter than about 5 seconds, preferably shorter than about 3 seconds, more preferably shorter than about 2 seconds, and most preferably shorter than about 1 second.

Another part of the process with significant potential for thermophoretic losses is after particle cooling until the particles are finally collected. Proper particle collection is very important to reducing losses within the system. The potential for thermophoretic losses is significant following particle cooling because the aerosol stream is still at an elevated temperature to prevent detrimental condensation of water in the aerosol stream. Therefore, cooler surfaces of particle collection equipment can result in significant thermophoretic losses.

To reduce the potential for thermophoretic losses before the particles are finally collected, it is important that the transition between the cooling unit and particle collection be as short as possible. Preferably, the output from the quench cooler is immediately sent to a particle separator, such as a filter unit or a cyclone. In that regard, the total residence time of the aerosol between attaining the maximum average stream temperature in the furnace and the final collection of the particles is preferably shorter than about 2 seconds, more preferably shorter than about 1 second, still more preferably shorter than about 0.5 second and most preferably shorter than about 0.1 second. Furthermore, the residence time between the beginning of the heating zone in the furnace and final collection of the particles is preferably shorter than about 6 seconds, more preferably shorter than about 3 seconds, even more preferably shorter than about 2 seconds, and most preferably shorter than about 1 second. Furthermore, the potential for thermophoretic losses may further be reduced by insulating the conduit section between the cooling unit and the particle collector and, even more preferably, by also insulating around the filter, when a filter is used for particle collection. The potential for losses may be reduced even further by heating of the conduit section between the cooling unit and the particle collection equipment, so that the internal equipment surfaces are at least slightly warmer than the aerosol stream average stream temperature. Furthermore, when a filter is used for particle collection, the filter could be heated. For example, insulation could be wrapped around a filter unit, with electric heating inside of the insulating layer to maintain the walls of the filter unit at a desired elevated temperature higher than the temperature of filter elements in the filter unit, thereby reducing thermophoretic particle losses to walls of the filter unit.

Even with careful operation to reduce thermophoretic losses, some losses will still occur. For example, some particles will inevitably be lost to walls of particle collection equipment, such as the walls of a cyclone or filter housing. One way to reduce these losses, and correspondingly increase product yield, is to periodically wash the interior of the particle collection equipment to remove particles adhering to the sides. In most cases, the wash fluid will be water, unless water would have a detrimental effect on one of the components of the particles. For example, the particle collection equipment could include parallel collection paths. One path could be used for active particle collection while the other is being washed. The wash could include an automatic or manual flush without disconnecting the equipment. Alternatively, the equipment to be washed could be disconnected to permit access to the interior of the equipment for a thorough wash. As an alternative to having parallel collection paths, the process could simply be shut down occasionally to permit disconnection of the equipment for washing. The removed equipment could be replaced with a clean piece of equipment and the process could then be resumed while the disconnected equipment is being washed.

For example, a cyclone or filter unit could periodically be disconnected and particles adhering to interior walls could be removed by a water wash. The particles could then be dried in a low temperature dryer, preferably at a temperature of lower than about 50° C.

In one embodiment, wash fluid used to wash particles from the interior walls of particle collection equipment includes a surfactant. Some of the surfactant will adhere to the surface of the particles. This could be advantageous to reduce agglomeration tendency of the particles and to enhance dispersibility of the particles in a thick film past formulation. The surfactant could be selected for compatibility with the specific paste formulation anticipated.

Another area for potential losses in the system, and for the occurrence of potential operating problems, is between the outlet of the aerosol generator and the inlet of the furnace. Losses here are not due to thermophoresis, but rather to liquid coming out of the aerosol and impinging and collecting on conduit and equipment surfaces. Although this loss is undesirable from a material yield standpoint, the loss may be even more detrimental to other aspects of the process. For example, water collecting on surfaces may release large droplets that can lead to large particles that detrimentally contaminate the particulate product. Furthermore, if accumulated liquid reaches the furnace, the liquid can cause excessive temperature gradients within the furnace tube, which can cause furnace tube failure, especially for ceramic tubes. One way to reduce the potential for undesirable liquid buildup in the system is to provide adequate drains, as previously described. In that regard, it is preferred that a drain be placed as close as possible to the furnace inlet to prevent liquid accumulations from reaching the furnace. The drain should be placed, however, far enough in advance of the furnace inlet such that the stream temperature is lower than about 80° C. at the drain location.

Another way to reduce the potential for undesirable liquid buildup is for the conduit between the aerosol generator outlet and the furnace inlet be of a substantially constant cross sectional area and configuration. Preferably, the conduit beginning with the aerosol generator outlet, passing through the furnace and continuing to at least the cooling unit inlet is of a substantially constant cross sectional area and geometry.

Another way to reduce the potential for undesirable buildup is to heat at least a portion, and preferably the entire length, of the conduit between the aerosol generator and the inlet to the furnace. For example, the conduit could be wrapped with a heating tape to maintain the inside walls of the conduit at a temperature higher than the temperature of the aerosol. The aerosol would then tend to concentrate toward the center of the conduit due to thermophoresis. Fewer aerosol droplets would, therefore, be likely to impinge on conduit walls or other surfaces making the transition to the furnace.

Figure 50:
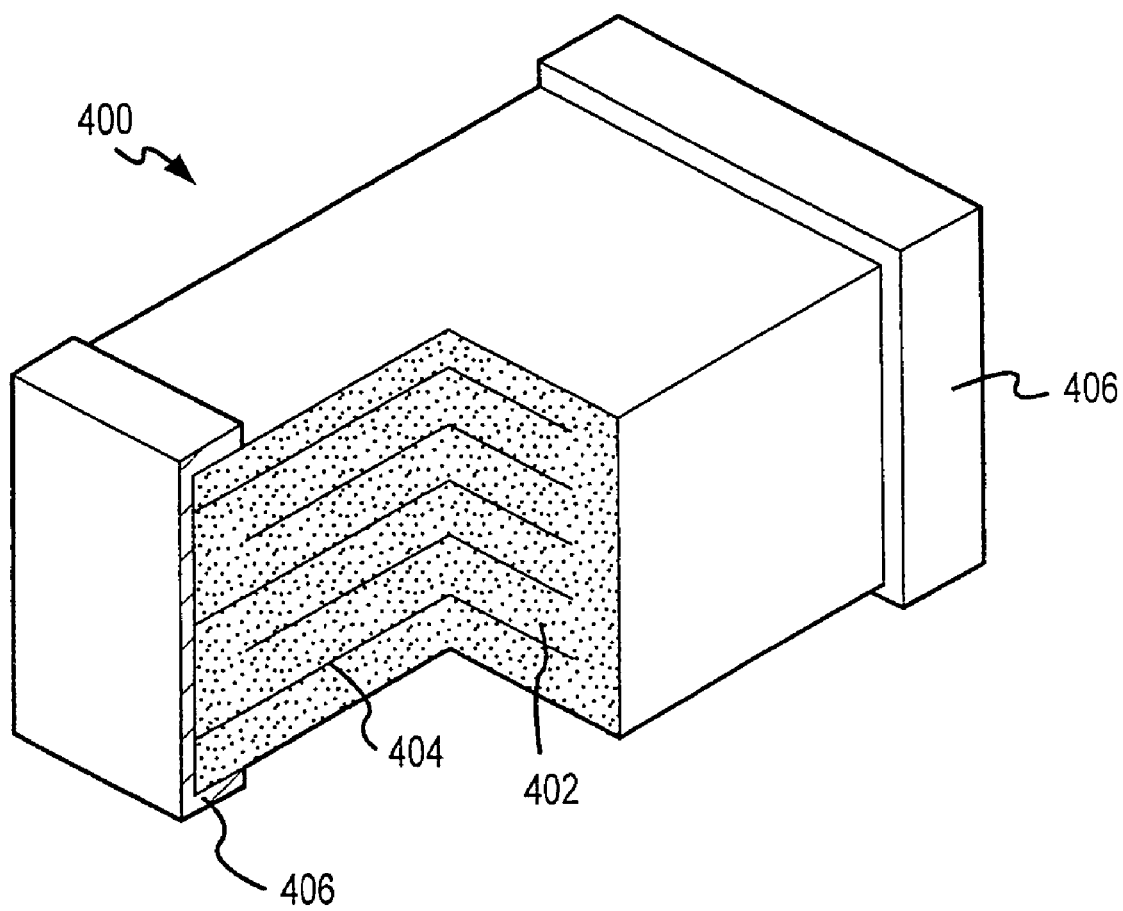
FIG. 50 is a perspective view with partial cutaway of a multi-layer capacitor of the present invention.

Another way to reduce the potential for undesirable liquid buildup is to introduce a dry gas into the aerosol between the aerosol generator and the furnace. Referring now to FIG. 50, one embodiment of the process is shown for adding a dry gas 119 to the aerosol 108 before the furnace 110. Addition of the dry gas 118 causes vaporization of at least a part of the moisture in the aerosol 108, and preferably substantially all of the moisture in the aerosol 108, to form a dried aerosol 119, which is then introduced into the furnace 110.

The dry gas 118 will most often be dry air, although in some instances it may be desirable to use dry nitrogen gas or some other dry gas. If a sufficient quantity of the dry gas 118 is used, the droplets of the aerosol 108 are substantially completely dried to beneficially form dried precursor particles in aerosol form for introduction into the furnace 110, where the precursor particles are then pyrolyzed to make a desired particulate product. Also, the use of the dry gas 118 typically will reduce the potential for contact between droplets of the aerosol and the conduit wall, especially in the critical area in the vicinity of the inlet to the furnace 110. In that regard, a preferred method for introducing the dry gas 118 into the aerosol 108 is from a radial direction into the aerosol 108. For example, equipment of substantially the same design as the quench cooler, described previously with reference to FIGS. 41-43, could be used, with the aerosol 108 flowing through the interior flow path of the apparatus and the dry gas 118 being introduced through perforated wall of the perforated conduit. An alternative to using the dry gas 118 to dry the aerosol 108 would be to use a low temperature thermal preheater/dryer prior to the furnace 110 to dry the aerosol 108 prior to introduction into the furnace 110. This alternative is not, however, preferred.

Still another way to reduce the potential for losses due to liquid accumulation is to operate the process with equipment configurations such that the aerosol stream flows in a vertical direction from the aerosol generator to and through the furnace. For smaller-size particles, those smaller than about 1.5 microns, this vertical flow should, preferably, be vertically upward. For larger-size particles, such as those larger than about 1.5 microns, the vertical flow is preferably vertically downward.

Furthermore, with the process of the present invention, the potential for system losses is significantly reduced because the total system residence time from the outlet of the generator until collection of the particles is typically shorter than about 12 seconds, preferably shorter than about 10 seconds, more preferably shorter than about 7 seconds and most preferably shorter than about 5 seconds.

According to the process of the present invention, and using the apparatus of the present invention, silver-containing particles of a variety of compositions and for a variety of uses may be made. Many of the these particles are producible in novel powder form and include many compositions believed to have not been heretofore produced by spray pyrolysis processing.

Many applications use silver-containing powders, and it is usually desirable that particles of the powder have one or more of the following properties: high purity; high crystallinity; high density; small particle size; narrow particle size distribution; spherical morphology; controlled surface chemistry; and reduced agglomeration. The particles of the present invention are well suited for such applications and may be used to replace silver-containing particles of the prior art that may currently be used.

Important applications for the silver-containing particles of the present invention are in the manufacture of electronic products. In some instances, the particles will be used in the electronic products in particulate form, while in other instances the particles may be sintered onto a substrate or onto a monolithic mass.

For example, the particles may be used in electrically conductive or electrically resistive portions of electronic products. One such application is for the manufacture of electronic products including silver-containing thick film features that are active in the function of the product when used. For example, the particles may be used to make capacitor electrodes for chip capacitor designs, including supercapacitors, and especially for multi-layer capacitors. Also, the particles may be used in the manufacture of resistive films, such as may be used in serpentine meander circuits in surge protector resistor systems. Also, the particles could be used to make resistive heating lines in a pattern on a window for deicing and defogging, such as used in the rear window of many automobiles.

Another application is to make thick film metallized terminations on electronic components. These terminations are common on surface mount components to permit easy interconnection of the component into an electrical circuit. For example, the component may be mounted on a circuit board by soldering to the metallized terminations.

Another application is to make thick film electrical interconnections within electronic products. For example, the particles may be used to make electrical interconnections within a multi-chip module or other circuit board.

Another application is to make a thick film grid for collecting or distributing electrical current. For example, the particles may be used to make the lines for resistive heating on windows for deicing and/or defogging. Also, the particles may be used to make a grid electrode for a photovoltaic module.

Still another application is as a particulate component in paste or powder formulations incorporated into various electronic products. For example, the particles may be included in resistor powder or paste formulations or resistors. Also, the particles may be included in powder or paste electrode formulations, such as may be used in electrochemical cells, including batteries and fuel cells.

Another important application for the powder is to make silver-containing films for electromagnetic shielding to prevent interference of electromagnetic waves with the operation or electronic components, such as in cellular telephones and computers. For example, such films are used in cellular telephones to prevent interference of certain electronic components with radio frequency signals being processed in the device.

Another important application for the powder is to make thermally conductive films for conducting heat away from active electronic components, such as resistors, inductors, capacitors, transistors and integrated circuits, which often generate significant heat during operation that must be removed to avoid malfunction of the device. Many other application are also possible for the silver-containing powder of the present invention, some of which are discussed below.

The powder of the present invention is of a high quality that is desirable for many applications. The silver-containing particles of the powder have a small average particle size. Although the preferred average size of the particles will vary according to the particular application, the number average particle size is typically in a range having a lower limit of about 0.1 micron, preferably about 0.2 micron, more preferably about 0.5 micron and most preferably about 0.8 micron; and having an upper limit of about 5 microns, preferably about 3 microns and more preferably about 2 microns.

Another indication of the high quality of the powder is based on the weight average particle size and size distribution of silver-containing particles on a weight basis. This is because a weight basis is more sensitive to the presence of oversize particles, which are usually more detrimental in the powder of the present invention than undersize particles, although both are generally undesirable. In that regard, it is preferred that the silver-containing powder has a weight average particle size in a range having a lower limit of about 0.1 micron, preferably about 0.2 micron, more preferably about 0.5 micron and most preferably about 0.8 micron; and having an upper limit of about 5 microns, preferably about 3 microns and more preferably about 2 microns.

The silver-containing particles of the powder also typically have a narrow particle size distribution, such that the majority of particles are substantially the same size. Preferably, at least about 75 percent by number, more preferably at least about 85 percent by number, even more preferably at least about 90 percent by number and most preferably at least about 95 percent by number of the particles are smaller than twice the number average particle size. Thus, when the number average particle size is about 2 microns it is preferred, for example, that at least about 75 number percent of the particles are smaller than about 4 microns. Further, it is preferred that at least about 75 number percent, more preferably at least about 85 number percent, even more preferably at least about 90 number percent and most preferably at least about 95 number percent or the particles are smaller than about 1.5 times the number average particle size. Thus, when the number average particle size is about 2 microns, it is preferred, for example, that at least about 75 number percent of the particles are smaller than about 3 microns.

Furthermore, the silver-containing particles of the powder have a particle size distribution such that preferably at least about 75 weight percent of the particles, more preferably at least about 85 weight percent of the particles, still more preferably at least about 90 weight percent or the particles, and most preferably at least about 95 weight percent of the particles are smaller than twice the weight average particle size; and even more preferably smaller than about 1.5 times the weight average particle size, in a manner as stated previously with the particle size distribution with respect to number average particle size.

The silver-containing particles of the powder typically have a high degree or purity, and it is preferred that the particles include less than about 0.1 weight percent impurities and more preferably less than about 0.01 weight percent impurities. Most preferably the particles are substantially free of contaminants. The purity of the particles of the present invention is one major advantage over particles manufactured by liquid phase routes. The powders of the present invention are substantially free of contaminants, and particularly surfactants and other organic materials that are often left as residue in powders made by liquid routes. The substantial absence of residual surfactants and other organics is important in making pastes for thick film applications, because the surfactants, or other organics, are often incompatible with other paste ingredients. Also, the presence of such organics or surfactants can sometimes cause complications during film bake-out, and can impair film performance, especially if high electrical conductivity is desired.

The silver-containing particles of the powder also typically have a very high density. Preferably, the powder exhibits a particle density, as measured by helium pycnometry, of at least about 80 percent of theoretical, more preferably at least about 90 percent of theoretical density and even more preferably at least about 95 percent of the theoretical density. Most preferably, the powders exhibit a particle density, as measured by helium pycnometry, of at least about 99 percent of the theoretical density. The theoretical density is that density that the particles would have assuming zero pore volume within the particles.

The silver-containing particles of the powder are also typically substantially spheroidal in shape. A high degree or sphericity is advantageous because the particles are able to be dispersed more readily, imparting advantageous rheological characteristics to paste formulations, including the particles. The powders of the present invention are substantially non-agglomerated and nave good dispersibility in a variety of liquid vehicles used in thick film paste formulations.

The silver-containing particles of the powder also typically have good crystallinity. The metallic phase including the silver typically preferably includes a mean crystallite size of larger than about 50 nanometers, and more preferably larger than about 100 nanometers. The metallic phase may be polycrystalline, depending upon manufacturing conditions, or may be single crystal. For example, when the particles consist essentially of only a metallic phase, such as of pure silver or a silver-containing alloy, then the particles may be substantially single crystals of the metallic phase.

Although the silver in the particles may be in any form, including in the form of silver oxide, it is preferred that substantially all of the silver be in elemental form in a metallic phase. This metallic phase may be a silver-containing alloy or may consist essentially of only silver. When reference is made herein to alloys, it should be recognized that the discussion applies equally to intermetallic compounds, which are not true alloys. Preferred alloy metals include palladium (Pd), nickel (Ni), copper (Cu), platinum (Pt), molybdenum (Mo), tungsten (W), tantalum (Ta), aluminum (Al), gold (Au), indium (In), lead (Pb), tin (Sn), bismuth (Bi) and the like. When alloyed with one or more other metals, silver will typically comprise from about 1 weight percent to about 99 weight percent. In one embodiment, the alloy includes less than about 30 weight percent silver, while in another embodiment the alloy includes greater than about 50 weight percent silver, or even greater than about 70 weight percent silver. The desired composition of an alloy will vary depending upon the specific application.

One preferred alloy is with palladium. Particles including an Ag:Pd alloy are particularly preferred for use in making internal electrodes of multi-layer capacitors and for electrical interconnections in multi-chip modules. In that regard, however, it has traditionally been difficult to prepare a true alloy between silver and palladium, i.e., homogeneous at the molecular level. This has also been found to be the case with spray pyrolysis unless the conditions of particle manufacture are carefully controlled.

The particular alloy composition will depend upon the specific application for which the particles are intended. For most applications, however, silver/palladium alloys of the present invention preferably include from about 30 weight percent to about 90 weight percent silver and from about 10 weight percent to about 70 weight percent palladium, with more specific alloys in that preferred range being more preferred for different applications.

For electronic components, including multi-layer capacitors and multi-chip modules, manufactured in low fire processes (with firing temperatures generally lower than about 700° C.), silver-rich alloys with palladium are preferred. Preferred alloys for low fire processes include from about 10 weight percent to about 30 weight percent palladium and from about 70 weight percent to about 90 weight percent silver. Particularly preferred for low fire processes are alloys having a weight ratio of Pd:Ag of about 20:80 and 30:70.

For electronic components, such as multi-layer capacitors and multi-chip modules, manufactured in high fire processes (with firing temperatures generally above about 800° C.), palladium-rich alloys are preferred. Preferred alloys for high fire processes include from about 50 weight percent to about 70 weight percent palladium and from about 30 weight percent to about 50 weight percent silver. Particularly preferred for high fire processes are alloys having a weight ratio of Pd:Ag of about 50:50 and 70:30.

According to the present invention, it has, surprisingly, been found that certain spray pyrolysis manufacturing conditions are particularly conducive to preparation of a true alloy between silver and palladium.

According to the process of the present invention, when making particles including a silver/palladium alloy, or for making pure silver, the maximum average stream temperature of the aerosol the furnace should ordinarily be in a range with a lower limit of about 900° C., preferably about 950° C., more preferably about 975° C., and even more preferably about 1000° C.; and with an upper limit of about 1300° C., preferably about 1200° C., more preferably about 1150° C., even more preferably about 1100° C., and still more preferably about 1050° C. If the temperature is too low, the particles do not adequately densify and significant porosity in the particles can result. As the temperature exceeds about 1100° C., however, the vapor pressure of silver can become significant, and significant vaporization of silver during particle manufacture appears to occur, which can result in the production of undesirable ultrafines of silver. This problem becomes particularly pronounced above about 1200° C. Such vaporization can result in significant segregation of silver and defeat the objective of preparing an alloy between silver and palladium. The presence of a segregated, unalloyed silver phase in a powder is undesirable because of the high mobility of silver in microelectronic devices when the silver is in an unalloyed state and because the palladium will tend to be more susceptible to undesirable oxidation during manufacture of microelectronic devices as more of the silver segregates.

When making alloys of palladium and silver, maximum average stream temperatures in the furnace should preferably be in a range of from about 950° C. to about 1100° C. More preferred is a temperature range of from about 975° C. to about 1050° C., with a manufacture temperature of approximately 1,000° C. being particularly preferred. These temperatures are also preferred for silver-rich alloys, such as one including about 30 weight percent palladium and 70 weight percent silver.

Furthermore, it has been found that the vapor pressure of silver should generally be maintained at a relatively low level during processing to avoid the production of ultrafines that degrade the quality of the particulate product. This is especially important when preparing alloys. When the temperature of the furnace is maintained at a temperature low enough to prevent the vapor pressure of the silver from exceeding about 100 millitorr, and more preferably about 50 millitorr, it has been most surprisingly found that the resulting particles are generally of a higher quality, with a reduced amount of silver fines.

The silver-containing particles may include only a single material phase, which would include the silver. Alternatively, the silver-containing particles may be multi-phase, or composite, particles. In multi-phase particles, the silver is present in a first material phase. The particles also include a second material phase that is different than the first material phase. The multi-phase particles may, however, include more than two material phases.

Single phase particles will typically consist essentially of a single metallic phase of silver metal or a silver-containing alloy. Multi-phase particles also typically include a silver-containing metallic phase and at least one other phase. Besides the silver-containing metallic phase, the other phases that may be present are other metallic phases, that are preferably substantially free of silver, or nonmetallic phases, that are also preferably substantially free of silver.

For many applications, whether single phase or multi-phase particles are used, the silver-containing metallic phase will frequently comprise greater than about 50 weight percent silver, preferably greater than about 60 weight percent silver, more preferably greater than about 70 weight percent silver, even more preferably greater than about 80 weight percent silver and most preferably greater than about 90 weight percent silver. Examples of applications when an essentially pure silver or silver-rich metallic phase is desirable include internal electrodes for multi-layer capacitors manufactured in a process involving a low firing temperature (such as lower than about 700° C.), thick film metallized terminations for surface-mountain electronic components, conductive lines for printed circuits, horizontal interconnects in multi-chip modules and vertical interconnects in multi-chip modules. It should be recognized, however, that many applications exist where silver may be present in much lower proportions. For example, the metallic phase of some particles may include 30 weight percent or less of silver, especially for multi-layer capacitors manufactured in a process involving a high firing temperature (such as higher than about 800° C.).

Multi-phase particles may be desirable for a number of reasons, including: (1) a reduction in the amount of the expensive silver that is used in the particle to provide electrical conductivity by incorporating a second material phase that is a less expensive filler material; (2) to improve flowability of the particles in a paste and to improve resistance of particles to deformations; (3) to modify physical properties of the particles for improved compatibility with a substrate supporting a conductive film made using the particles, including modifications of the thermal coefficient of linear expansion, modification of sintering/densification characteristics, and modification of surface energy to alter wetability of the particles; and (4) to modify electrical or dielectric properties for customized electronic components. Some examples of uses of the multi-phase, silver-containing particles include use as catalysts or catalytic supports and as particles in paste formulations used in thick film applications, including manufacture of multi-layer capacitors, multi-chip components, super capacitors and other electronic components, batteries and fuel cells.

In the case of multi-phase particles, the particles include at least a first material phase and a second material phase. Additional material phases may be present, if desired. The first material phase includes silver, and is typically an electrically conductive metallic phase, with the silver being in the form of substantially pure silver or an alloy with one or more other metal. The second material phase, which is different than the first material phase, is typically substantially free of silver.

The second material phase may be a metallic phase. When the second material phase is a metallic phase, it may consist essentially of a single metal, or may include an alloy of two or more metals. Examples of some metals that may be included in the second material phase include palladium, nickel, copper, platinum, molybdenum, tungsten, tantalum, aluminum, gold, indium, lead, tin, bismuth, and the like.

For most applications, however, the second material phase will be nonmetallic, in which case the second material phase will also typically not be electrically conductive. Preferred in a nonmetallic second material phase are a variety of ceramic materials, glass materials or other materials that would alter the sintering characteristics of the particles. Control of sintering characteristics of the particles is particularly important when the particles are to be used in a paste for manufacture of a silver-containing film on a substrate including a ceramic layer, which is typically dielectric, to more closely match with the sintering and shrinkage characteristics of the powder particles with those of the substrate, thereby reducing the occurrence of problems such as film cracking and delamination. This is particularly important when layers are to be cofired.

The second material phase may include an oxide material, such as oxides of zinc, tin, barium, molybdenum, manganese, vanadium, niobium, tantalum, tungsten, iron, silver, chromium, cobalt, nickel, copper, yttrium, iridium, beryllium, silicon, zirconium, aluminum, bismuth, magnesium, thorium and gadolinium. Some preferred oxides are silica, alumina, titania, zirconia, yttria, and oxides of copper, bismuth and tin. Another preferred group of oxides includes borates, titanates, silicates (including borosilicates and aluminosilicates), aluminates, niobates, zirconates and tantalates. Examples include mullite, cordierite, barium titanate, neodymium titanate, magnesium titanate, calcium titanate, strontium titanate and lead titanate. Additional materials that could be used as the second material phase include glass materials, such as glass frits and glazes. Particularly preferred are second material phases including titanates, and especially including a titanate of one or more of barium, strontium, neodymium, calcium, magnesium and lead. The titanate may be of a single metal or may be a mixed metal titanate, such as, for example $Ba_xSr_{1-x}TiO_3$. Furthermore, a variety of other ceramic materials may be used in the second material phase, such as carbides and nitrides, including silicon nitride. Also, porcelain could be used in the second material phase.

The multi-phase particles of the present invention may typically be used in place of single phase metallic particles for most application, so long as the proportion of the second material phase making up the particles is small enough not to be detrimental to the application. Often, however, the use of multi-phase particles significantly enhances the performance of films made using the particles relative to the use or single phase metallic particles.

One use for the multi-phase particles of the present invention is to form a film including silver in a metallic phase, often electrically conductive, adjacent to a layer or nonmetallic material, often dielectric. In that case, the multi-phase particles will typically include in the second phase a nonmetallic material that enhances suitability for use with the nonmetallic layer, resulting in improved compatibility and bonding between the nonmetallic layer and the film including the metallic phase. For example, if the silver-containing film is a conductive electrode line on a silicon-based photovoltaic layer, the silver-containing particles may include a glass frit in the second material phase or the silver-containing particles. For many of these applications, the multi-phase silver-containing particles will include in the second material phase a nonmetallic material that is also present in an adjacent nonmetallic layer. Thus, when the nonmetallic layer is of a dielectric material, that dielectric material is also present in the second material phase. When the nonmetallic layer is a ceramic layer, for example, the multi-phase particles could include in the second phase a ceramic material that is also present in the ceramic layer. As one specific example, titanate materials are often used in the dielectric layers of multi-layer capacitors, and the silver-containing particles used to make internal electrodes for the multi-layer capacitor could include in the second material phase the same titanate that is present in the dielectric layers.

Generally, for applications involving the use of multi-phase particles to form a metallic electrically conductive phase adjacent a dielectric layer, the second material phase of the particles typically comprises less than about 30 weight percent or the particles, preferably less than about 20 weight percent of the particles, and more preferably less than about 10 weight percent of the particles.

Multiphase particles having a very low content of the second material phase are generally preferred when the particles will be used to make electrically conductive features, because the second material phase is typically dielectric and reduces electrical conductivity. In many instances, therefore, and especially those including silica, alumina or a titanate as the second material phase, the second material phase typically comprises less than about 10 weight percent of the particles, more preferably less than about 5 weight percent of the particles, and even more preferably less than about 2 weight percent of the particles; but the second material phase will typically be at least about 0.5 weight percent of the particles. In this way, enhanced compatibility between the dielectric layer and the electrically conductive film may be accomplished without significant detrimental impact to electrical conductivity. Also, the use of the multiphase particles to make electrically conductive films will typically result in improved adhesion for better bonding with the dielectric layer, thereby reducing the potential for delaminations.

One preferred powder of multi-phase particles includes the metallic first phase and a second phase including carbon. The carbon is typically an electrically conductive form of carbon, such as in the form of graphite or carbon black. The metallic phase is typically substantially pure silver. Those multi-phase particles are particularly well suited for use as electrode materials, especially in electrochemical cells. These multi-phase particles may also be advantageously used as conductive filler particles in electrically conductive adhesive formulations.

A number of different variations of the process of the present invention are possible for making the multi-phase particles. In one embodiment, a silver-containing precursor for the first material phase and a second precursor for the second material phase may both be included in the liquid feed 102 (referring back to FIGS. 1-47 and the discussion relating thereto). In such a case, both precursors could be in solution in a flowable liquid of the liquid feed 102. Alternatively, one or both of the precursors could be particles suspended in the flowable liquid. Also, it is possible that the liquid feed 102 could include more than two precursors for the multi-phase particles. In another embodiment, the silver-containing precursor could initially be in the liquid feed 102, which is then processed in aerosol form in the furnace 110 to prepare silver-containing precursor particles. The precursor particles are then coated with tee second material phase in a separate step, in a manner similar to that described previously with reference to FIG. 45. This two-step process of initially preparing silver-containing precursor particles and then coating the precursor particles on the fly in an aerosol state is particularly advantageous because problems are avoided that are encountered in particle manufacture procedures, such as liquid route precipitation, in which precursor particles would have to be collected and then redispersed prior to coating. Not only is collection and redispersion cumbersome, but problems are often encountered due to particle agglomeration, which is avoided with the on-the-fly coating of the present invention. Avoidance of particle agglomeration is very important when a uniform particle coating is desired.

As noted previously, the multi-phase particles of the present invention may include a variety of particle morphologies. With reference again to FIG. 47, the multi-phase particles may include an intimate mixture of the first material phase and the second material phase, as in the multi-phase particle 500. Typically, with such an intimate mixture, the first material phase is a continuous phase throughout which the second material phase is dispersed. Another possible morphology is for the first material phase to be in the form of a large core that is covered by a thin coating layer of the second material phase, as shown for particles 502 and 504 in FIG. 47. Whether such coatings form a smooth coating, such as shown in particle 502, or a rough and bumpy coating, such as shown in particle 504, will depend upon the wetability characteristics of the first and second material phases and the conditions under which the materials are processed, and especially the processing temperature. For example, in gas-to-particle conversion processes, higher temperatures during the coating operation tends to result in smoother, more continuous coatings. The multi-phase particles could also include a small core of one material phase surrounded by a thick layer of the other material phase, as shown for particle 506. Also, the first and second material phase could completely segregate in a manner shown for particle 508. Furthermore, the multi-phase particles are not limited to two material phases. For example, particle 510 in FIG. 47 shows a multi-phase particle including a core of second material phase domains dispersed in a matrix of the first material phase, and with the core being coated by a third material phase.

With continued reference to FIG. 47, it should be noted that the first material phase and the second material phase could constitute any of the phases in particles 500, 502, 504, 506, 508 and 510. For most applications, however, the first material phase, which includes silver, will be the more abundant phase, and the second material phase will be the less abundant phase.

In the case of coated particles, the second material phase will often be in the form of a coating around a core including the first material phase. In the case of catalyst materials, however, the first material phase may be a coating or a disperse phase on the surface of a support of the second material phase. For particles including intimate mixtures of the two phases, the first material phase will typically be the continuous phase and the second material phase will typically be the disperse phase.

For most applications, the multi-phase particles will include greater than about 50 weight percent of the first material phase, more preferably greater than about 60 weight percent of the first material phase, even more preferably greater than about 70 weight percent of the first material phase and most preferably greater than about 80 weight percent of the first material phase. In the case of multi-phase particles including the coating layers of the second material phase, the first material phase may comprise 90 weight percent or more of the particles. Conversely, the second material phase typically will comprise less than about 50 weight percent of the multi-phase particles, preferably less than about 40 weight percent, more preferably less than about 30 weight percent and even more preferably less than about 20 weight percent. In the case of thin coatings of the second material phase, the second material phase may comprise 10 percent or less of the particles. Even in the case of coated particles, however, the second material phase will typically comprise greater than about 0.5 weight percent, and preferably greater than about 1 weight percent, of the particles.

Because most applications for multi-phase particles of the present invention include the use of either a particle including the first material phase in a large core surrounded by a thin coating of the second material phase or an intimate mixture or the first material phase as a continuous phase with the second material as a disperse phase, those particular situations will now be discussed below in greater detail.

One preferred class of multi-phase particles are coated particles in which the first material phase forms a core and the second material phase forms a thin coating layer about the outer surface of the core. The second material phase may include any of the materials previously listed as being suitable for the second material phase.

With the present invention, the coating including the second material phase may be made as a relatively uniform layer that substantially entirely covers the core of the first material phase. One method for making multi-phase particles including the second material phase as a uniform coating is as described previously with reference to FIG. 45. In that regard, the second material phase is typically formed on a precursor particle, which includes the first material phase, by techniques as previously described. A preferred coating technique is CVD. CVD is a well known deposition technique in which a precursor for the second material phase is reacted in the vapor phase to form the second material phase. Generally, precursors for CVD are metal-containing compounds, for example, inorganic compounds, metal organics and organometallics. Examples of some vapor phase precursors for CVD of inorganic coatings include silanes, metal formates, metal acetates, metal oxalates, metal carboxylates, metal alkyls, metal aryls, metal alkoxides, metal ketonates (especially beta-diketonates), metal amides, metal hydrides, metal oxyhalides, and metal halides (especially metal chlorides and metal bromides). For example, to deposit a coating of silica, a vaporous silane precursor, such as silicon tetrachloride, may be decomposed and converted to silica at elevated temperature in the presence of oxygen or water vapor, with the silica then depositing on the surface of silver-containing precursor particles.

Typically, a coating deposited by CVD or by PVD will result in an average coating thickness of from about 10 nanometers to about 200 nanometers. Preferred coatings have an average thickness of thinner than about 100 nanometers, more preferably thinner than about 50 nanometers and most preferably thinner than about 25 nanometers.

Applications for coated multi-phase particles include the manufacture of electrically conductive films or electronic devices, such as multi-layer capacitors and multi-chip modules In the case or many coatings such as silica, the coating is useful to beneficially alter the sintering and/or shrinkage characteristics of the particle for improved compatibility with a ceramic substrate.

Another way to make coated multi-phase particles is to provide precursors for both the first material phase and the second material phase in the feed liquid 102 (as described with respect to FIGS. 1-49). As noted previously, each precursor in the feed liquid 102 could be either in the liquid phase, e.g., in solution in a flowable liquid, or in the form of particles suspended by the flowable liquid. The multi-phase particles would then form in the furnace 110 as liquid is removed from aerosol droplets. It should be noted that, in the case of multiple phases forming simultaneously in the furnace, the different phases are typically initially formed as an intimate mixture of the phases. Generally, higher processing temperatures and longer residence times will result in redistribution of the material phases to the desired morphology of a coating of one material phase about a core of the other material phase, assuming that the two material phases have the proper wetability characteristics. Alternatively, it is possible that redistribution of the phases could result in complete segregation of the phases, as shown by the multi-phase particles 508 in FIG. 47. When redistribution of the material phases is desired to form a coated particle morphology, a processing embodiment such as that described previously with reference to FIG. 46 may be advantageous.

When making coated particles with precursors for both the first material phase and the second material phase in the liquid feed 102, a first precursor for the silver containing first material phase could comprise preformed silver-containing particles to be coated. The precursor for the second material phase could also be in particulate form, or could be in solution in a liquid phase. For example, a soluble precursor, such as from dissolution of a metal alkoxide could be used as a precursor for the second material phase. In the case of metal alkoxides, it should be recognized that in aqueous solution the dissolved metal alkoxide usually reacts to form other soluble components, which will function as a soluble precursor. This could be the case in the preparation of particles including titania or alumina as the second material phase. In the case of silica as the second material phase, the precursor will typically be small silica particles, which are preferably of colloidal size, or silica dissolved in solution.

The manufacture or multi-phase particles with an intimately mixed morphology for the different material phases is typically accomplished by initially including a precursor for both the first material phase and the second material phase in a liquid feed 102, as previously described. As noted, the process may be substantially the same as the process used to prepare particles with a coating morphology, except the processing conditions may be altered so that the material phases do not redistribute, and are instead retained in an intimately mixed state. Generally, lower operating temperatures in the furnace 110 and shorter residence times, with rapid particle cooling, promote an intimate mixture of the phases.

Multi-phase particles of an intimately mixed morphology are particularly useful for modifying sintering/densification temperatures of the particle, reducing shrinkage that occurs during firing in thick film applications, and modifying the electrical or other properties of the particle for special applications.

As noted previously, the silver-containing particles of the present invention may be used in the manufacture of a variety of products, which products are also within the scope or the present invention, as are the methods for making those products. The powders typically may include silver-containing particles of only a single phase and/or including any of the multi-phase particles previously discussed. The use of multi-phase particles, however, is often preferred. Furthermore, for all of the applications discussed below, a powder having any combination of the characteristics of size, size distribution, sphericity, crystallinity and any other characteristic described herein for the powders of the present invention. In general, high levels of sphericity and crystallinity and with a narrow size distribution are preferred. Although average particle sizes may be any convenient size described previously. For some applications, particular particle size ranges are more preferred, as noted when applicable.

The silver-containing powders of the present invention may be used in the manufacture of a variety of electronic products, with the powders typically being used to form electrically conductive features, of varying resistivity, in the products.

FIG. 50 shows one embodiment of a multi-layer capacitor 400 made using the particles of the present invention. The capacitor includes a structure of stacked layers, including electrically conductive internal electrode layers 404 separated by dielectric layers 402. The dielectric layers may include a variety of dielectric materials, mostly ceramics.

The internal electrode layers 404 are made using a silver-containing powder of the present invention. The capacitor also includes metallized terminations 406 at either end of the capacitor that serve as electrical contacts for interconnecting the capacitors in an electrical circuit when the capacitor is used. The terminations 406 are typically made from a paste including particles of an electrically conductive metal. The terminations 406 are preferably also made from a silver-containing powder of the present invention, as is discussed in greater detail below. The discussion here focuses on use of the particles of the present invention for making the internal electrode layers 404.

There are a variety of structures and configurations known in the art for multi-layer capacitors, any of which may be made using a silver-containing powder of the present invention. The manufacturing techniques are well known in the art and need not be significantly altered to accommodate use of the silver-containing powders of the present invention. Furthermore, it should be appreciated that although a multi-layer capacitor is discussed as an example, the same principles apply to other capacitor designs, including supercapacitors, that include silver-containing electrodes made by thick film techniques.

The silver-containing powder, however, used to make the internal electrode layers 404 preferably has a weight average particle size in a range having a lower limit of preferably about 0.2 micron and more preferably about 0.3 micron; and an upper limit of preferably about 1 micron, more preferably about 0.8 micron and even more preferably about 0.6 micron. Particularly preferred is a weight average particle size in a range of from about 0.3 micron to about 0.6 micron.

The silver-containing powders of the present invention used to make the internal electrode layers 406 may include the silver in single phase particles having only a silver-containing metallic phase, which is frequently a silver-palladium alloy. Alternatively, in a preferred embodiment, the internal electrode layers 404 are made using, at least in part, silver-containing multi-phase particles that include at least a second material phase, as previously discussed, that modifies the sintering and/or densification properties of the silver-containing particles for enhanced bonding and compatibility with the dielectric layers 402. Although the second material phase could include any of the materials previously listed, the second material phase preferably includes a dielectric material that is also present in the dielectric layers 404. Therefore, if the dielectric layers 402 include a titanate, as previously discussed, then the second phase of the silver-containing particles used to make the internal electrode layers 404 would also include at least some of that same titanate. When the stacked layers are then cofired, a bonding zone develops at the interface between adjacent ones of the internal electrode layers 404 and the dielectric layers 402, with enhanced bonding in the bonding zone due to the inclusion of the dielectric material in the second phase of the multi-phase particles. The use of the multi-phase particles of the present invention to make the internal electrode layers 410 provides a significant performance advantage in terms of bonding and compatibility with the dielectric layers 402, relative to the use or a simple mixture of dielectric particles and metallic silver-containing particles.

When using multi-phase particles to make the internal electrode layers 404, it should be recognized that a paste preparation for making the internal electrode layers 404 could include only the multi-phase particles of the present invention, provided that the quantity of the electrically conductive first material phase is sufficient to provide a desired degree of electrical conductivity. Alternatively, a paste from which the internal electrode layers 404 are made could include a mixture the multi-phase particles and single-phase particles including only a silver-containing electrically conductive metallic phase. Also, particles of any other composition could be added to the paste as deemed desirable.

Figure 51:
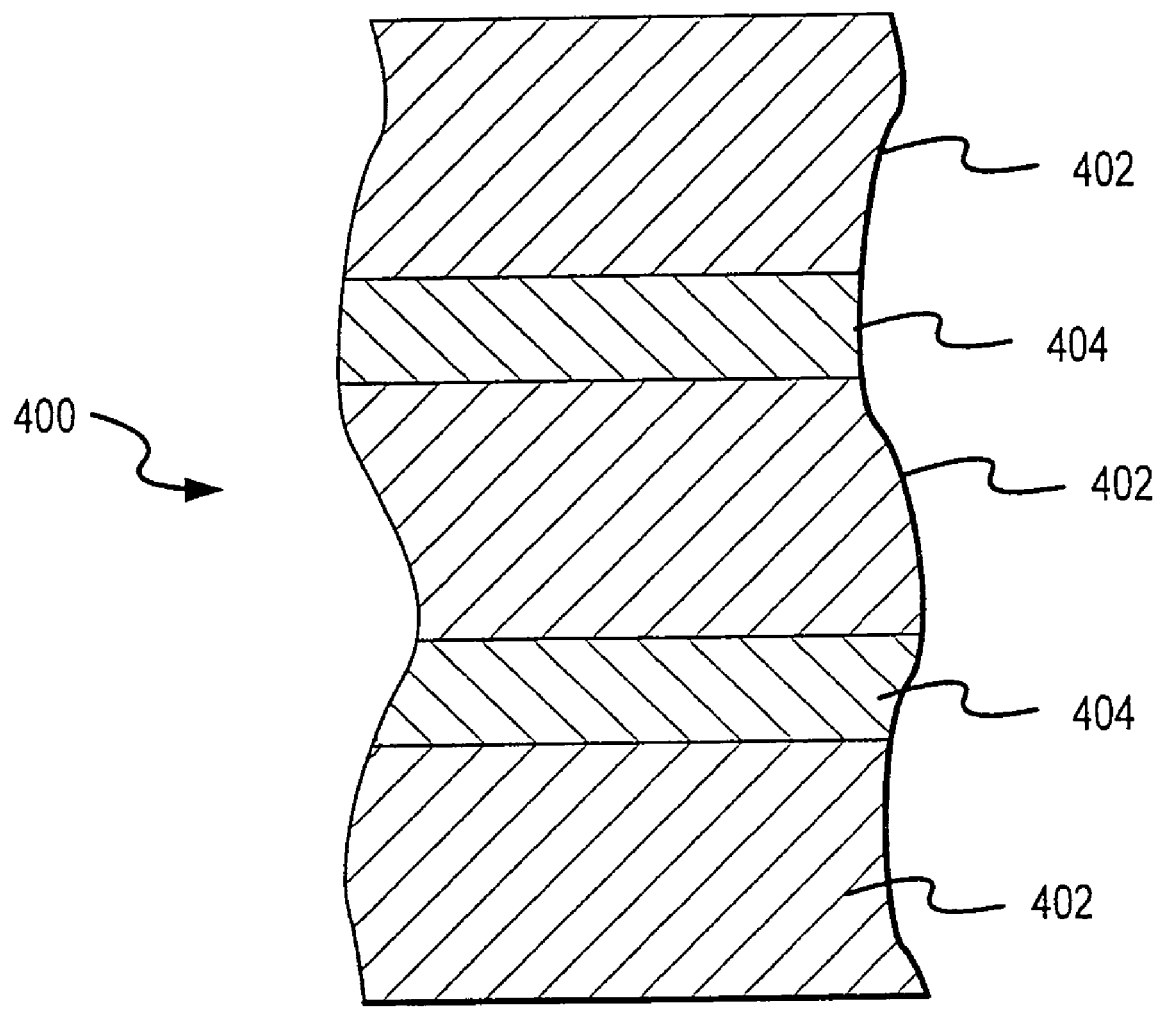
FIG. 51 is a partial cross-sectional view of a stacked layer structure of one embodiment of a multi-layer capacitor of the present invention.

Referring now to FIG. 51, a preferred embodiment of the stacked structure of the multi-layered capacitor 400 is shown. Interposed between the dielectric layers 402 are the electrically conductive internal electrode layers 404 made with silver-containing powder of the present invention. In the structure shown in FIG. 51, the internal electrode layers 404 each include only a single silver-containing film. The single silver-containing film is made using single or multi-phase particles, or mixtures of particles.

Figure 52:
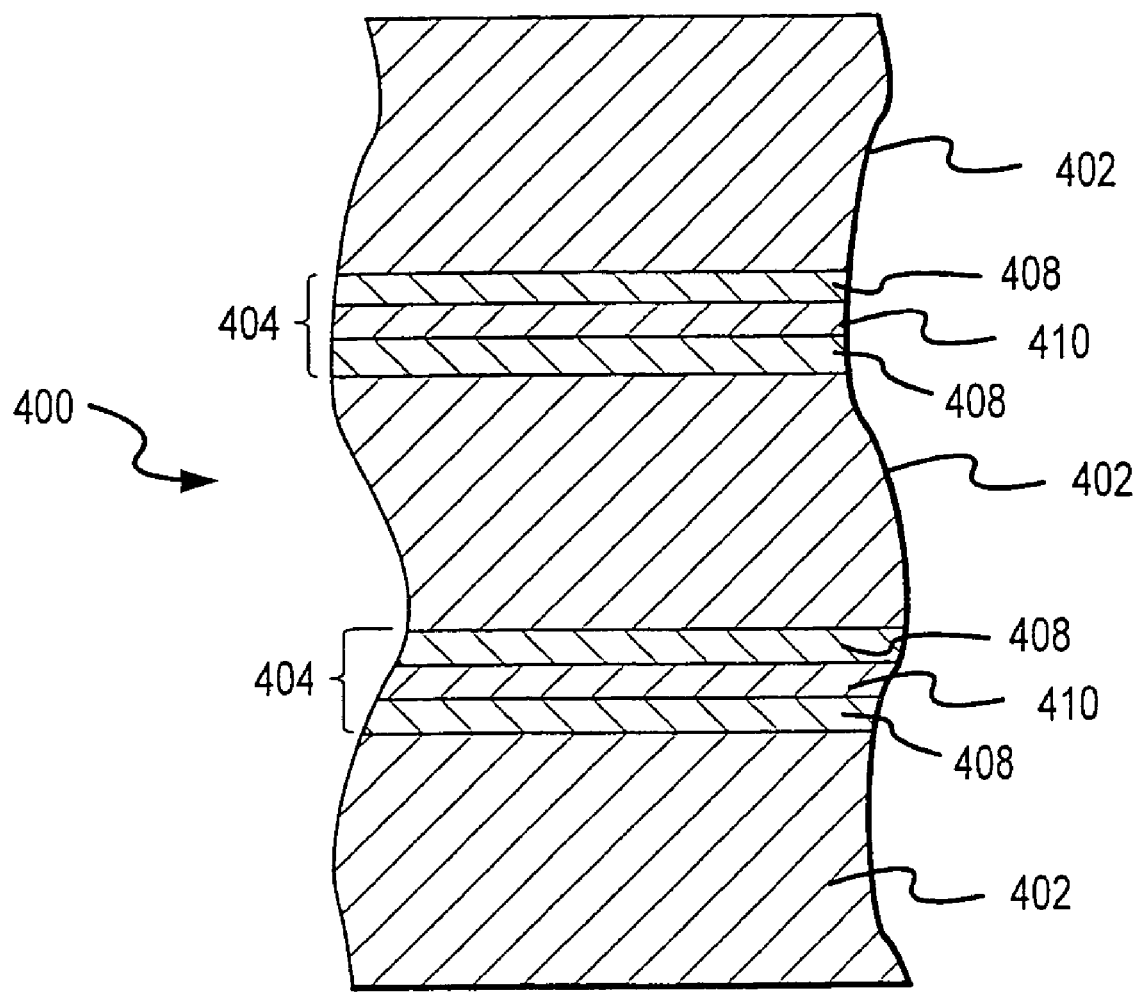
FIG. 52 is a partial cross-sectional view of a stacked layer structure of another embodiment of a multi-layer capacitor of the present invention.

In another embodiment, however, the internal electrode layers 404 could include sublayers to provide a transition from the dielectric material of the dielectric layers 402 to the metallic material of the internal electrode layers 404. FIG. 52 shows stacked layers of one embodiment or a multi-layer capacitor including internal electrode layers 404 comprised of sublayers for gradation of the metallic content in the internal electrode layers 404. The internal electrode layers 404 each include two first sublayers 408 and one second sublayer 410. The first sublayers 408 are leaner in a silver-containing, electrically conductive metallic phase than the second sublayers 410. The first sublayers 408 act as interlayers to enhance bonding and compatibility between the dielectric layers 402 and the more electricity conductive second sublayers 410. For example, the first sublayers 408 could be made from multi-phase particles, as previously discussed, while the second sublayers 410 are made from single-phase metallic particles. As an alternative, the first sublayers 408 could be made from multi-phase particles having a higher content of dielectric material and the second sublayers 410 could be made from multi-phase particles having a lower content of dielectric material. As yet another alternative, the first sublayers 408 could be made from a mixture of multi-phase and single-phase particles including a higher proportion and the second sublayers 410 could be made from a mixture of multi-phase particles including smaller proportion of the multi-phase particles. As will be appreciated, other alternatives are also possible for obtaining a compositional gradient between sublayers 408 and 410 of the internal electrode layers 404. Also, more than two sublayers could be used, or the internal electrode layers could include a continuous gradation of composition.

Another important application for the silver-containing powders of the present invention is for use in making metallized terminations on electronic components. Through the metallized into an electrical circuit. These terminations are typically on components adopted for surface mounting, such as on a circuit board, via a solder connection between the metallized terminations of the component and metallized portions of the circuit board. The particles of the present invention may be used in the manufacture of terminations for a variety of electronic components, including capacitors (including multi-layer capacitors, supercapacitors, etc.), inductors (including multi-layer inductors), resistors, fuses, resonators, trimmers, potentiometers, thermisters, varistors and the wrap-around terminations for hybrid circuits. These components are frequently ceramic chip components.

By way of example, metallized terminations are now discussed with reference again to FIG. 50. Although FIG. 50 specifically concerns a multi-layer capacitor, the discussion concerning terminations applies equally to metallized terminations on other electronic components. As shown in FIG. 50, the multi-layer capacitor 400 includes metallized terminations 406 on opposite ends of the multi-layer capacitor 400. These metallized terminations 406 may advantageously be used to solder the component for surface mounting, such as on a circuit board, which may be a single-layer board a multi-layer package.

With continued reference to FIG. 50, the metallized terminations 406 include at least one electrically-conductive film made using silver-containing powder of the present invention. The powder will often include only single-phase particles; however, multi-phase particles may be used to modify sintering and densification characteristics of the film for better compatibility with a dielectric material of the component, if desired. To make the metallized terminations 406, the particles are applied from a paste or slurry including the particles by any appropriate technique, such as by dip coating, spraying, brushing or printing. The terminations 406 are then fired to develop a dense, electrically conductive film. Although any convenient firing temperature may be used, firing temperatures are often in the range of from about 300° C. to about 700° C. For making the metallized terminations 406, the silver-containing powder will preferably have a weight average particle size of from about 0.5 micron to about 2 microns. Furthermore, although the metallic phase of the particles of the present invention are often pure silver for making the metallized terminations 406, the silver may be in an alloy with another metal when neither performance applications are required. Preferred alloy metals are palladium and/or platinum. Also, as with all of the applications for the silver-containing powders, an additional metal, such as palladium or platinum, could be present in a separate phase in the particles, if desired. This is an alternative to providing another metal in an alloy with silver.

With continued reference to FIG. 50, the terminations 406 may comprise only a single layer made using the silver-containing particles of the present invention. Alternatively, however, the terminations 406 may include multiple metallic layers for enhanced performance, and especially for enhanced solderability. For example, one commonly used metallized termination structure includes a silver base film which may be made using powder of the present invention, a nickel barrier film overcoating the base film and a tin plating film overcoating the nickel barrier film.

Another important application of the silver-containing powders or the present invention is to make circuit interconnections in electronic products, and particularly in circuit boards. Such a circuit board may comprise a single layer structure or may compose a multi-layer structure. Preferred circuit boards are those including one or more dielectric layers of low temperature cofired ceramic on and/or through which electrical interconnections are made using silver-containing powder of the present invention. By low temperature cofired ceramic, it is meant ceramic compositions fireable at a relatively low temperature in a single firing operation in which thick film metallizations are also fired. Firing temperatures for such low temperature cofirings are frequently at a temperature of lower than about 800° C. For cofiring operations, powders of the present invention including multi-phase particles may be advantageously used, although single-phase particles could be used if desired. In the case of a single layer board, the particles of the present invention are useful for making conductive lines for interconnecting different portions of the board where components may be mounted. For multi-layer packages, the silver-containing powders of the present invention may advantageously be used for both horizontal interconnections and vertical interconnections.

The boards may come in a variety of configurations, but all are designed so that electronic components may be mounted on and bound to a surface of the board in a manner to provide desired electrical interconnection between the mounted components. The electronic components could be any components, for example capacitors, inductors, resistors and integrated circuits. Electronic components may be mounted on only one side of the board or may be mounted on both sides of the board. Multi-layer packages may also have electronic components embedded between dielectric layers.

Single-layer boards (those having only a single dielectric layer) are often referred to as hybrid circuit boards, whereas boards having a plurality of stacked dielectric layers are referred to by a variety of names, including multi-layer packages, multi-layer ceramic packages, and multi-chip modules.

Figure 53:
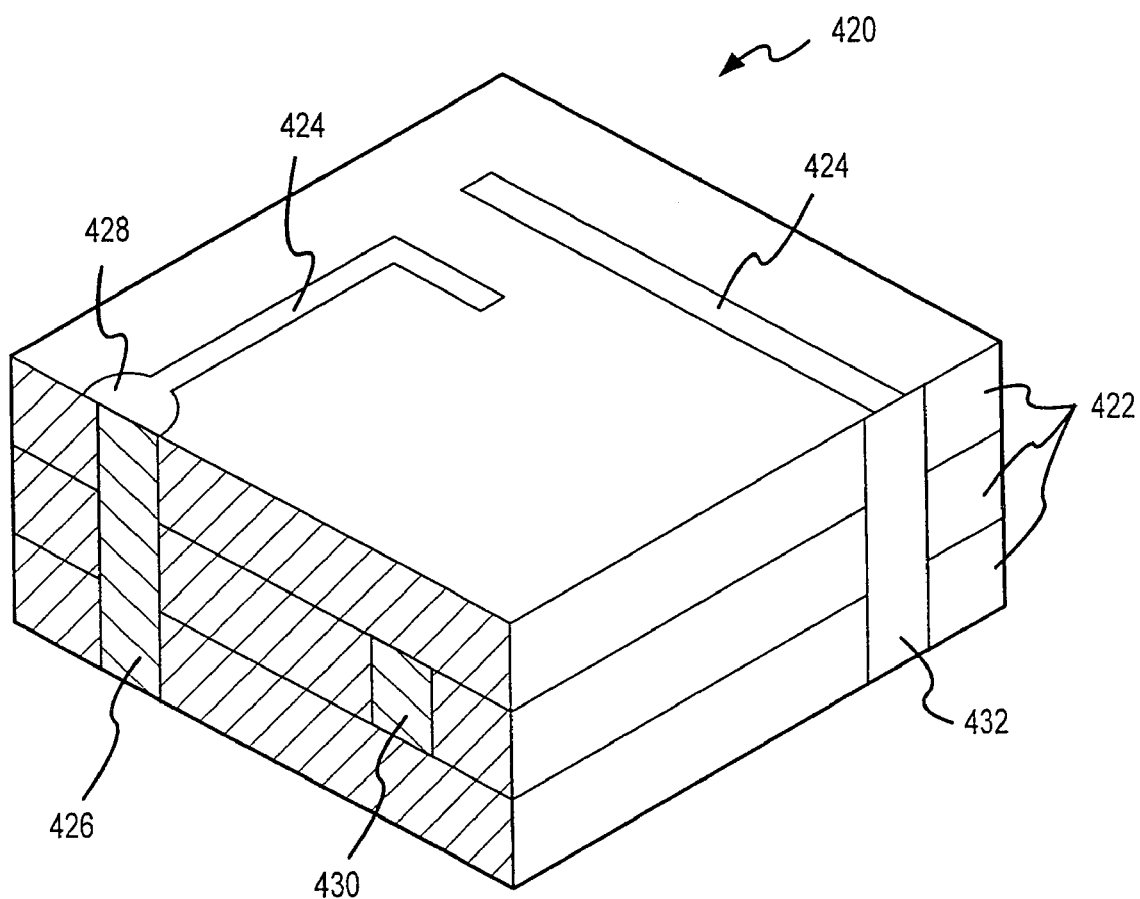
FIG. 53 is a perspective view with a cut away end showing a multi-chip module with various electrical interconnections made using powder of the present invention.

With reference now FIG. 53, one embodiment of a multi-layer ceramic package 420 shown, including examples of several interconnections that may be made using silver-containing powder of the preset invention. As seen in FIG. 53, the multi-layer ceramic package 420 includes three stacked dielectric layers 422, which are typically made from low temperature cofired ceramic materials. Shown in FIG. 53 are conductor lines 424, to provide horizontal interconnections in the multi-layer ceramic package 420. Also shown is a filled via 426 providing a vertical interconnection that extends across the entire thickness of the stacked structure. The filled via 426 is covered with a metallized cover pad 428 which enhances the interconnection between the filled via 426 and one or the conductor lines 424. Also shown is a blind via 430, which provides vertical interconnection only across one of the dielectric layers 422. Also shown is an edge metallization 432, which is a metallic film providing a vertical interconnection across the entire thickness at the edge or the multi-layer ceramic package 420, and providing a connection to one of the conducting lines 424.

It should be recognized that the multi-layer ceramic package 420 shown in FIG. 53 is a very simplified structure showing some features that may be present in a multi-layer ceramic package. It will be appreciated that multi-layer ceramic packages may be constructed having any number of dielectric layers and having a wide variety of vertical and horizontal interconnections. For example, a multi-layer ceramic package may include coated vias, in which the bore of the via is coated with a conductive film.

Any of the horizontal and vertical interconnections in the multi-layer ceramic package 420, including the cover pad 428, may be advantageously made using silver-containing powder of the present invention. The powder may include single-phase metallic particles and/or multi-phase particles. Furthermore, the metallic phase in the particles will often be pure silver, but may include other metals, such as palladium, platinum and/or gold, preferably in an alloy with the silver. Preferably, the silver-containing powder for making interconnections in multi-layer ceramic packages, and in other circuit boards, will have a weight average particle size of from about 0.5 micron to about 2 microns.

Furthermore, it will be appreciated that the surface layer of multi-layer ceramic packages will typically include metallized bonding locations for the mounting of electronic components. These bonding locations may include, for example, wire bond pads or solder pads. These metallized bonding locations may also be made using silver-containing powder of the present invention.

Boards including interconnections made from powder of the present invention may be manufactured by any suitable process known in the art, and need not be significantly modified to accommodate the making of interconnections using powder of the present invention. Typically, multi-layer ceramic packages are made by sequential processing and stacking of ceramic green tapes. The green tapes are punched and formed to provide desired structural features. The metallized features are then added, such as by screen printing of conduction lines and filling of vias by syringe or otherwise. The metallized ceramic layers are then stacked to form a layered structure which is then cofired. Any convenient firing temperature may be used. Often, firing temperatures of from about 300° C. to about 700° C. are used.

In addition to interconnections on circuit boards, silver-containing powder of the present invention may also be advantageously used to form patterned circuit lines for a variety of other applications. Examples include patterned lines for grid electrodes on photovoltaic modules, window deicers/defoggers, antennas, surge resistors, spiral inductors and membrane switches, and lines for flat panel display electrodes. A preferred powder for making these patterned lines has an acceptable average particle size of from about 0.5 micron to about 2 microns.

Figure 54:
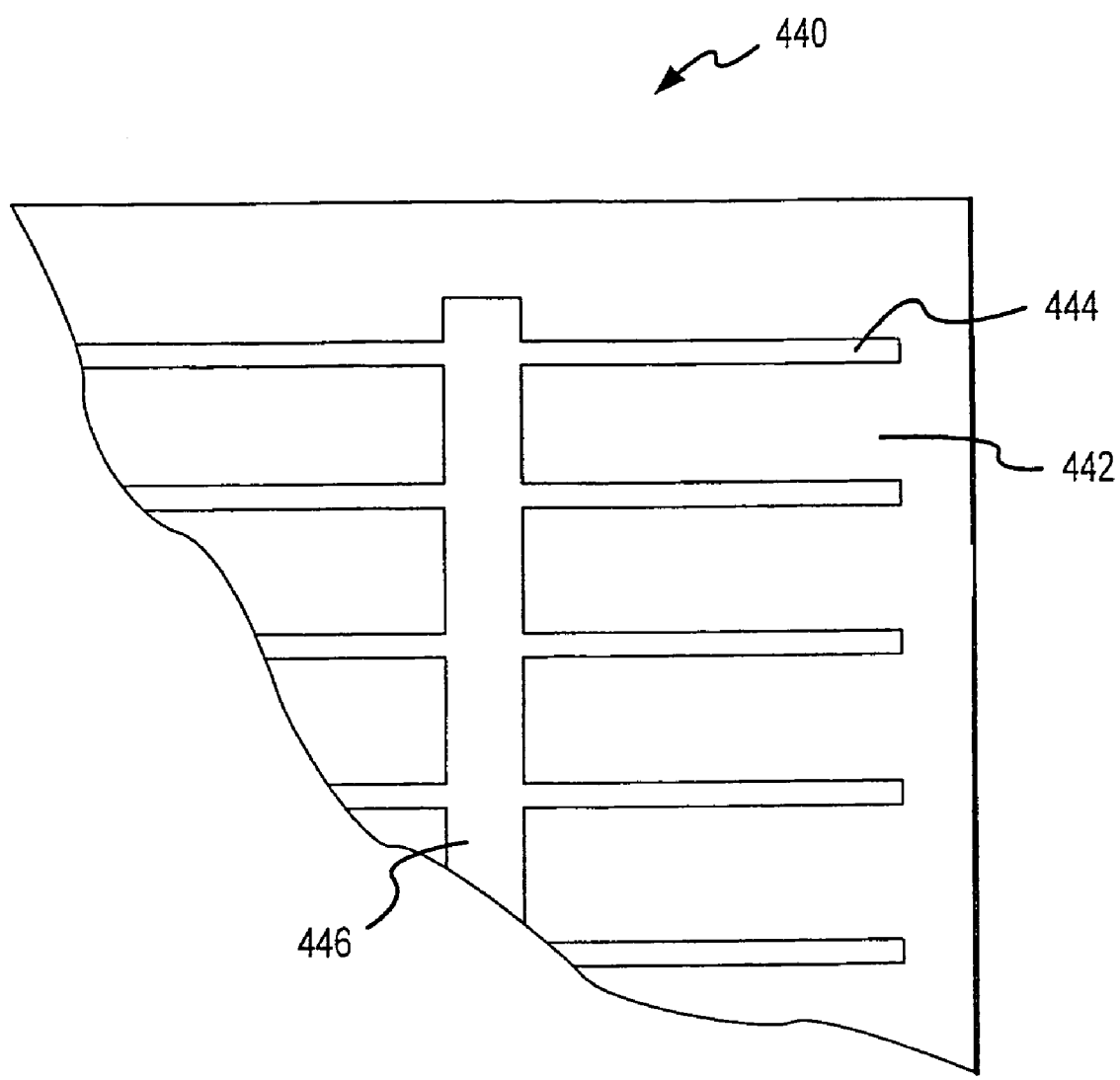
FIG. 54 is a partial top view of a photovoltaic module showing a grid electrode made with powder of the present invention.

Referring now to FIG. 54, a grid electrode on a photovoltaic module is shown. As shown in FIG. 54, a photovoltaic module 440 includes an active photovoltaic layer 442 on top of which a grid electrode has been formed using silver-containing powder of the present invention. The grid electrode includes primary collector lines 444, each of which collects electric current from different portions of the active photovoltaic layer 442. The grid electrode also includes a secondary collector line 446 which drains current from the primary collector lines 444 and also collects some current directly from the active photovoltaic layer 442. The secondary collector line 446, therefore, acts primarily as an electrical bus to the primary collector lines 444. When the photovoltaic module 440 includes a plurality of secondary conductor lines 446, then those secondary conductor lines 446 are further connected together for removing current from the photovoltaic module 440 for use in an electric circuit. Grid electrodes of the type shown in FIG. 54 may be a front or back electrode, but are most often used for a front electrode. By a front electrode, it is meant that it is on the side of the photovoltaic module facing the sun during operation. A back electrode would be on the side facing away from the sun during operation. The active photovoltaic layer 442 may be of any photovoltaic cell design, but often includes a silicon layer. These types of grid electrodes are frequently used on silicon-based photovoltaic modules, and particularly on those of polycrystalline silicon. When silver used to make the grid electrode is in the form of an alloy, it is often an alloy with aluminum.

Figure 55:
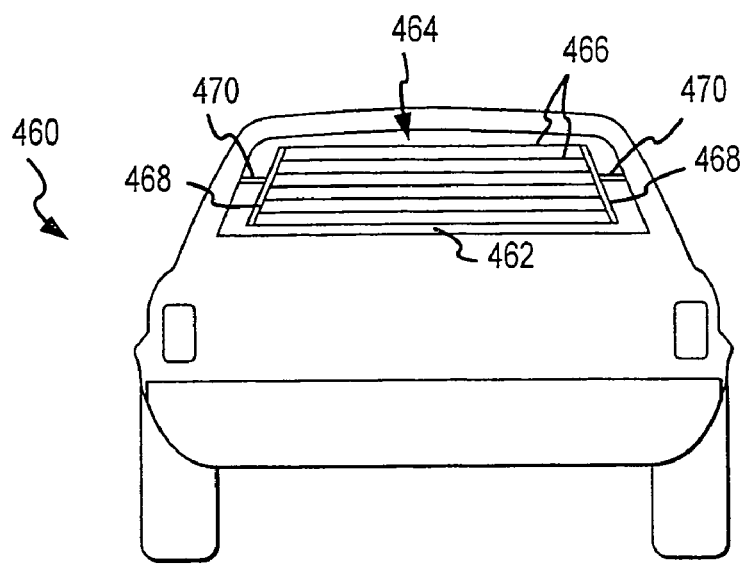
FIG. 55 is a rear view of an automobile showing a window deicer/defogger made using powder of the present invention.

Another example of patterned current lines is shown in FIG. 55 for a window defogger/deicer. FIG. 55 shows a car 460 including a rear window 462 on which a circuit grid for a deicer/defogger 464 is located. The deicer/defogger includes a plurality of resistive heating lines 466 connected between with bus lines 468, which are connected to leads 470, through which the deicer/defogger 464 is interconnected into the electrical system of the automobile 460. The resistive heating lines 466 provide parallel paths for current flow and include a sufficient amount of electrical resistance to accomplish the heating required to maintain the rear window 462 free of ice and fog when in operation. The resistive heating lines 466 will typically include silver as a major component, but will include other components to provide required resistance for heating. For example, a small amount of a resistive metal ruthenate may be included to provide resistivity. Also, the metal ruthenate could be provided in multi-phase particles with the silver. The bus lines 468 are very low resistance lines for effective distribution of current among the resistive heating lines 466. The bus lines 468 may also advantageously be made using silver-containing powder of the present invention. The leads 470, which provide interconnection to the electrical system of the automobile 460, may also advantageously be made using silver-containing powder of the present invention.

As noted, other patterned circuit lines that may be made with silver-containing powder of the present invention include antennas. One example is the antenna often printed on automobile rear windows in a "T" pattern. Also lines for antennas used in cellular telephones may be made using the silver-containing powders. Single or multi-phase particles may be used, and the metallic phase may be pure silver or may include another metal, preferably palladium or platinum, in an alloy with the silver.

Another application for patterned circuit lines are the resistive lines in surge resistors. Such resistors have serpentine meander circuit patterns of resistive lines for handling high current surges. The silver-containing powder of the present invention may be mixed with powder of a resistive material, such as a metal ruthenate, to provide the proper resistivity. Also, the particles could include the resistive material in a second phase in multi-phase silver-containing particles. The silver will typically be a pure silver metallic phase or as an alloy, preferably with palladium. Yet other applications for patterned circuit lines include conductor lines on spiral, two-dimensional inductors and membrane switches. In a membrane switch, the silver-containing powder is used to make conductive lines on a flexible membrane used to close the switch when depressed.

Another application for the silver-containing particles of the present invention is for use in the preparation of electrode materials for electrochemical cells, including fuel cells. These electrochemical cells may be in a variety of product forms, including miniature alkaline cells, batteries having a plurality of the cells packaged in a common container, and fuel cells. Furthermore, the electrochemical cells may be primary or secondary cells.

Figure 56:
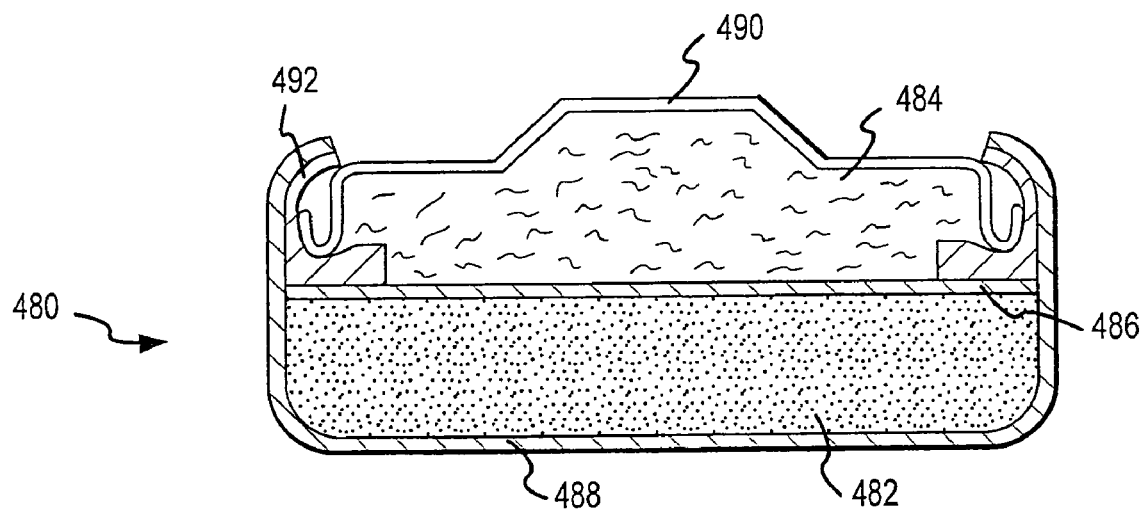
FIG. 56 is a side view in cross-section showing a miniature alkaline cell including cathode material make using powder of the present invention.

Referring now to FIG. 56, a miniature alkaline cell 480 is shown. The miniature alkaline cell 480 includes a cathode 482 and an anode 484 that are separated by a separator 486. The miniature alkaline cell also includes a can 488 and a lid 490, which are sealed using a gasket 492 to contain the contents of the miniature alkaline cell 480. When the miniature alkaline cell 480 is connected in an electrical circuit, the can 488 acts as a contact for the anode side and the lid 490 acts as a contact for the cathode side.

The cathode 482 is made using silver-containing powder of the present invention. The cathode 482 includes a powdered silver oxide wetted with an alkaline electrolyte, which is typically an aqueous solution of sodium hydroxide or potassium hydroxide. Silver in the silver oxide of the cathode 482 may be in monovalent or divalent form. Silver oxide may be made in powder form directly via the aerosol route of the present invention, as described previously. When making powder including silver oxide directly by the aerosol route, the furnace temperature should be high enough to decompose the silver precurser, typically silver nitrate, but low enough so that the silver oxide does not decompose. Aerosol temperatures in the furnace of from about 300° C. to about 400° C. are preferred. Frequently, however, the cathode will be made with silver powder that is then electroformed to prepare the silver oxide for the charged cell. The silver-containing powder of the present invention may be mixed with other cathode materials to make the cathode 482. For example, carbon powder, such as of graphite or carbon black, may be mixed with the silver-containing powder of the present invention. Alternatively, other cathode materials could be provided in multi-phase particles along with the silver, such as composite particles of silver and carbon.

With continued reference to FIG. 56, the anode 484 usually comprises powdered zinc mixed with the electrolyte. Other materials that could be used for the electrode include cadmium and iron. The separator 486 is a semipermeable material, such as cellophane.

Figure 57:
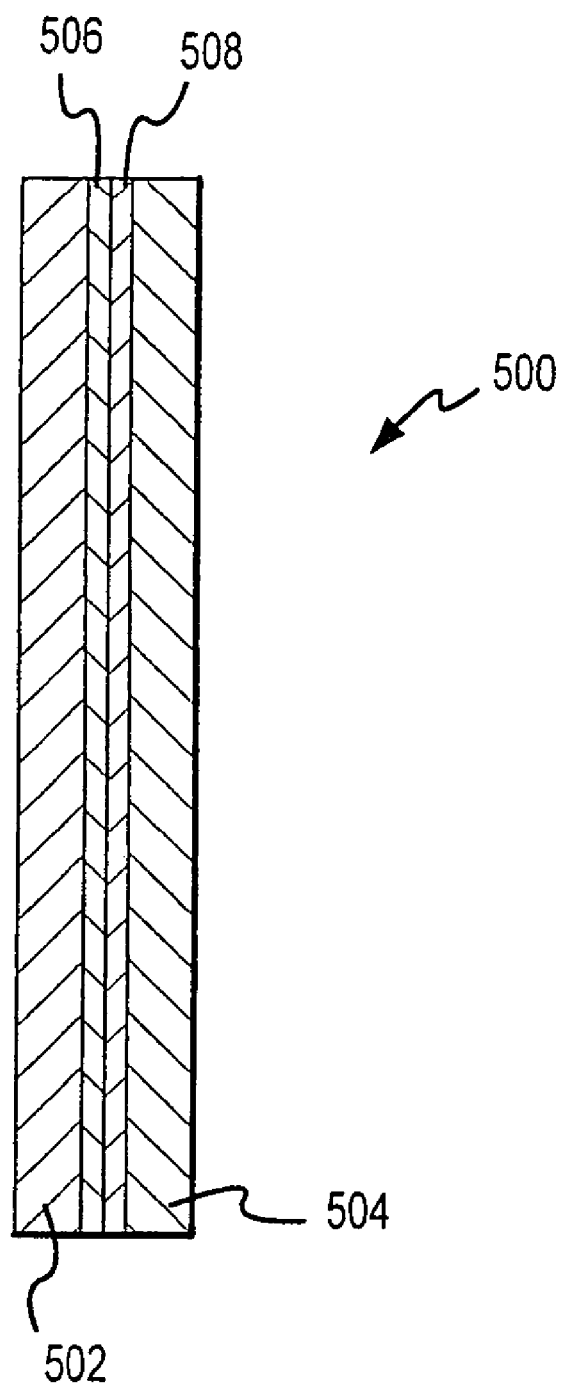
FIG. 57 is a side view in cross-section showing the structure of a plate cell including a cathode make using powder of the present invention.

Referring now to FIG. 57, one embodiment of an electrochemical cell arrangement is shown that would be suitable for use in preparing a storage battery including a plurality of cells. As shown in FIG. 57, an electrochemical cell 500 includes an anode 502 and a cathode 504. The anode 502 and the cathode 504 are separated by a first separator layer 506 and a second separator layer 508.

The first separator layer 506 is typically a semipermeable membrane, such as of cellophane. The second separator layer 508 is typically a nonwoven synthetic fiber mesh which is saturated with electrolyte solution (e.g., aqueous solution of potassium hydroxide) to assure adequate contact of the anode 502 and the cathode 504 with the electrolyte. The anode 502 is typically made by pasting or pressing zinc powder or zinc oxide onto a grid or by electroplating zinc to form a spongy zinc deposit. The cathode 504 includes silver oxide and is made using silver-containing powder of the present invention. The cathode 504 may be prepared by applying silver or silver oxide powder to a metallic grid. The grid may be of silver, copper, nickel or another convenient material. The silver or silver oxide powder is pressed or sintered to the grid to form plates. The plates are then electroformed in alkaline solution to assure that the cathode 504 is in a fully charged state. Other techniques for producing cathodes including silver are also known. Also, the cell may be in any form, including a flexible rolled form or a rigid plate form. Also, these cells may be incorporated into a primary or a secondary battery as is known in the art.

One use for silver-containing powder of the present invention is for electrode material for zinc-air cells and for fuel cells. In a zinc-air cell, the cathode material generally includes a primary cathode material, such as carbon, along with a smaller amount of a metal, such as silver, as a catalyst to catalyze the cathode reaction. The cathode material is often in powdered form mixed with electrolyte. The cathode reactant is oxygen that is supplied by diffusion from the air. The anode material is zinc and the electrolyte is typically an aqueous alkaline solution, such as of sodium hydroxide or potassium hydroxide. Carbon powder and silver powder of the present invention may be mixed and processed to form the cathode. Preferably, however, the silver and the carbon are provided in multi-phase particles of the present invention. The composite particles may have any relative quantities of silver and carbon, but silver content or from about 5 to about 10 weight percent is preferred, with about 7 weight percent being more preferred. One preferred embodiment for a zinc-air cell is a miniature cell. Such a miniature cell would have a design similar to the miniature alkaline cell shown in FIG. 56, except the volume in the cell devoted to the anode material is much larger because the cathode volume is significantly reduced. The cathode side of the cell must, however, have holes or other passageways to permit oxygen to enter the cathode volume for use as the cathode reactant.

In a fuel cell, active anode material is hydrogen and active cathode material is oxygen. Carbon/silver anode material similar to that described for the cathode material in the zinc-air cell may also be used in a fuel cell, and preferably as cathode material in the fuel cell.

Another use of silver-containing powder of the present invention as electrode material is for powder electrodes in oxygen sensors. For example, the reference and working electrodes in a yttria-stabilized zirconia sensor may be made using silver powder of the present invention.

When used as an electrode material, the silver-containing powder of the present invention preferably has a weight average size of from about 0.5 micron to about 3 microns.

Another important application for silver-containing powder of the present invention is in the manufacture of flat panel displays, and particularly to make address electrodes for addressing a pixel area in the display. The pixel area may be a whole pixel, such as would typically be the case in a monochrome display, or the pixel area may be a subpixel of one component color of a whole pixel, such as would typically be the case in a color display. Although the description provided here is exemplified primarily with a discussion of monochrome flat panel displays, the principles discussed apply equally to color flat panel displays. Plasma flat panel displays are particularly preferred for use of silver-containing address electrodes made using powder of the present invention. For making address electrodes in flat panel displays, the silver-containing powder preferably has a weight average particle size of from about 1 micron to about 2.5 microns, more preferably from about 1.5 microns to about 2 microns.

Figure 58:
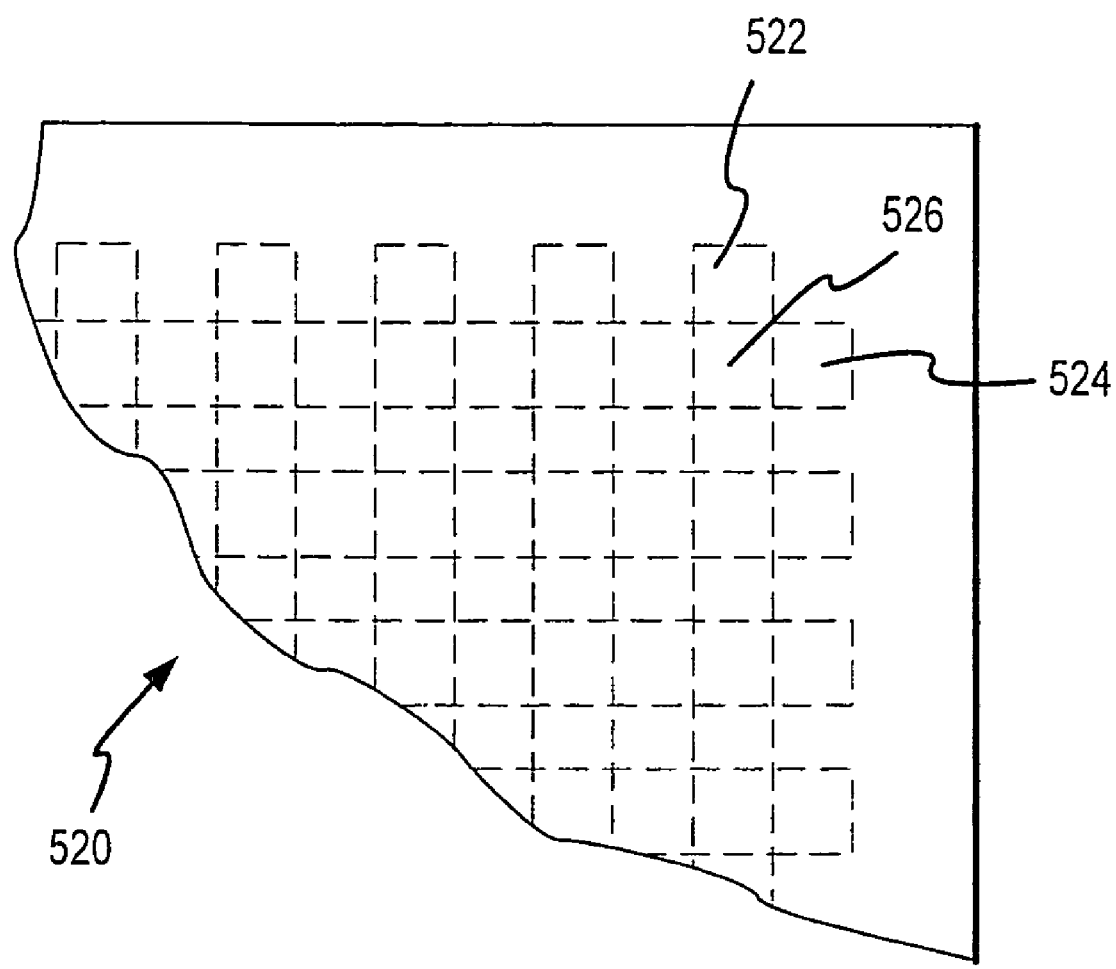
FIG. 58 is a partial top view showing a flat panel display including address electrodes made using powder of the present invention.

Referring now to FIG. 58, one embodiment of a flat panel display 520 is shown. The flat panel display 520 includes a plurality of display electrodes 522 and a plurality of address electrodes 524. The area of overlap between a display electrode 522 and an address electrode 524 defines a pixel area 526. During operation of the display panel 520, when a voltage is applied between a display electrode 522 and the corresponding address electrode 524, then the pixel area 526 to which the voltage is applied is energized to illuminate phosphor material located in the pixel area 526.

With continued reference to FIG. 58, the display electrodes 522 are often called front electrodes because they are on the front side of the flat bed display that faces the viewer during use. Therefore, the display electrode is typically made of a transparent material, such indium tin oxide. The address electrodes 524 are often called back electrodes because they are on the side of the flat panel display 520 that faces away from the viewer during use. The address electrodes 524 are advantageously made using silver-containing powder of the present invention.

Figure 59:
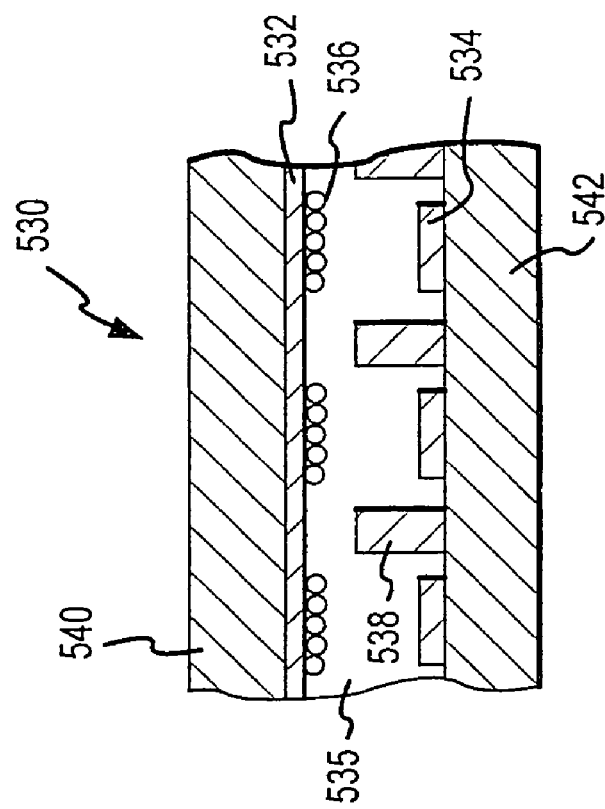
FIG. 59 is a partial side view in cross-section showing a DC plasma display including an address electrode made using powder of the present invention.

One preferred flat panel display for manufacture using silver-containing powder of the present invention are plasma flat panel displays. Plasma flat panel displays illuminate through the activation of phosphor materials by an ionic plasma, typically a plasma of neon or another noble gas. Referring now to FIG. 59, one embodiment of a DC plasma flat panel display 530 is shown. The DC plasma flat panel display 530 includes display electrodes 532 and address electrodes 534 with a vapor space 535 being located between the display electrodes 532 and the address electrodes 534. Inside the vapor space 535 is a gas, such as argon, which will form the ionic plasma when energized. The DC plasma flat panel display 530 also includes phosphor material 536 in pixel areas adjacent the display electrodes 532 and opposite the address electrodes 534. The address electrodes 534 are separated by dielectric ribs 538. The display electrodes 532 and the phosphor material 536 are supported on a transparent, dielectric front substrate 540, commonly glass. The address electrodes 534 and the ribs 538 are supported on a back substrate 542, such as of glass or a ceramic material. The display electrodes 534 are made using silver-containing powder of the present invention.

With continued reference to FIG. 59, when the DC plasma flat panel display 530 is in operation, a circuit will be completed in an area of overlap between one of the display electrodes 532 and one of the address electrodes 534 corresponding with the pixel area in which phosphor material 536 is to be illuminated through the creation of a plasma in the vapor space 535 corresponding with the pixel area. The ribs 538 provide some protection against inadvertent illumination of adjacent pixel areas.

Figure 60:
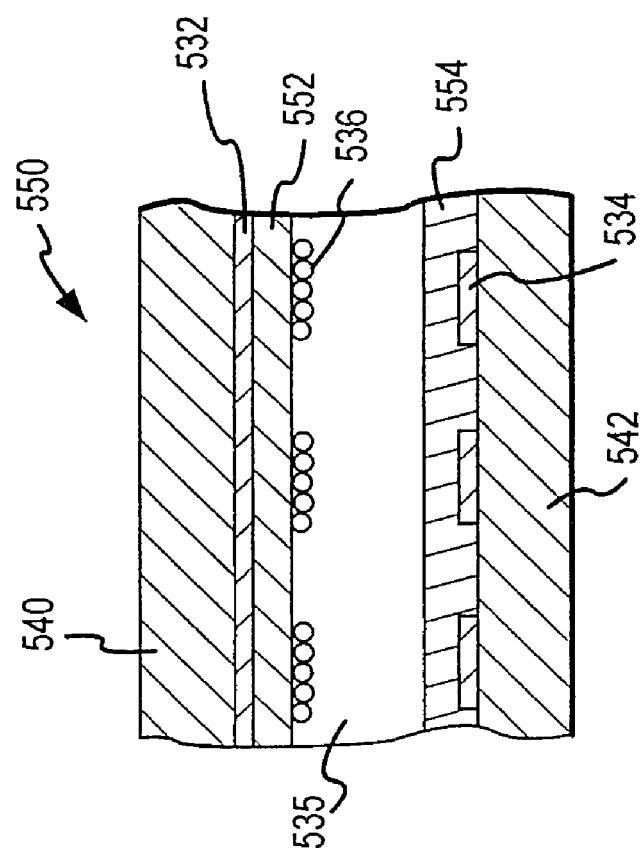
FIG. 60 is a partial side view in cross-section showing an AC plasma display including an address electrode made using powder of the present invention.

Referring now to FIG. 60, one embodiment of an AC plasma flat panel display 550 is shown. The design is similar to that shown for the DC flat panel plasma display shown in FIG. 59 and the reference numerals in FIG. 60 refer to the same elements as discussed with respect to FIG. 59 the DC plasma display 530, except as noted. As shown in FIG. 60, the AC plasma flat panel display 550 does not include ribs or other barrier partitions to separate the address electrodes 534. The AC plasma display panel 550 does, however, include a front dielectric layer 552, which protects the display electrodes 532, and a back dielectric layer 554, which protects the address electrode layers 534. In color display applications, it would generally be advisable even in AC devices to include some type of barrier partition between the address electrodes 534 to prevent inadvertent illumination of an adjacent sub-pixel of a color that is not desired. Several configurations are known for both DC and AC devices and for monochrome and color devices, all of which are within the scope of the present invention. The examples shown in FIGS. 59 and 60 are illustrative only.

The applications discussed above use silver-containing powder of the present invention to make a current carrying feature for use in an electrical circuit. Use of the silver-containing powders of the present invention, however, is not limited to features used in an electrical circuit. For example, one use of powder of the present invention is to make silver-containing films for electromagnetic shielding to prevent detrimental interference between electronic components. Such shielding is important in many communications and computer products in which the operation of electronic components in close proximity could detrimentally affect each other if shielding between the components is not provided. For example, in cellular telephones, shielding is important to prevent fields induced by operating electronic components from distorting or otherwise corrupting radio signals being received, transmitted or processed by the device. A film made from silver-containing powder of the present invention may be interposed between the receiver and/or transmitter and other electronic components. To provide the shielding, a divider including a silver-containing film on an electrically insulating substrate is placed between components to be isolated. The dielectric substrate may be of any suitable material, and is frequently made of a ceramic material or a plastic material. Preferred powder for use in making film for electromagnetic shielding has a weight average particle size of from about 0.5 micron to about 2 microns.

Another application for the silver-containing powder of the present invention is to make thermally conductive films to assist in the cooling of electronic components that generate significant amounts of heat during operation. Typically, the thermally conductive film is placed on the external surface of the electrical component to conduct heat away from the electrical component to the air or to a substrate on which the component is mounted. The thermally conductive film is often applied as a thermally conductive adhesive, and may act as an adhesive between the component and a board or other substrate on which the component is mounted. Preferred powder for making thermally conductive films has a weight average particle size from about 0.5 micron to about 2 microns.

Another application for silver-containing powder of the present invention is to make light reflecting surfaces. For example, a light reflecting surface is often used to provide back lighting in a liquid crystal display panel. The powder typically includes pure silver. A preferred powder has a weight average particle size of from about 0.5 micron to about 2 microns.

Yet another application for the silver-containing powder is as a filler material in polymer compositions to impart electrical or thermal conducting properties. One preferred composition is an epoxy adhesive filled with the silver-containing powder. The powder is preferably pure silver and has a weight average particle size of from about 0.5 micron to about 3 microns.

Many of the applications just described include one or more silver-containing films made using silver-containing powder of the present invention. The film may extend over a large area, such as would be the case, for example, for internal electrodes of multi-layer capacitors, metallized terminations and films providing electromagnetic shielding, thermal conduction or light reflection. Alternatively, the film may be in the form of a narrow line, or pattern of lines, such as would be the case, for example, for conductive lines in multi-chip modules, serpentine resistor circuits, spiral inductors, antennas in cellular telephones, window defoggers/deicers, photovoltaic grid electrodes, flat panel display electrodes and membrane switches.

The silver-containing films are typically made by a thick film deposition technique. Thick film deposition techniques generally involve application of a layer of a slurry, or paste, including the silver-containing powder on a substrate. The slurry is often in the form of a thick paste. The slurry may be applied by any technique, such as by screen printing, doctor blading, dip coating, spray coating or other technique for applying a uniform layer. Screen printing is generally preferred for making thinner films and for making lines, or another film pattern. The applied layer is eventually fired, or cured, at temperatures typically higher than about 300° C., to remove residual organic components and to sinter/densify the material of the silver-containing particles to form a dense, silver-containing film on the substrate. For some applications firing temperatures may be 1000° C. or more. In some applications, the silver-containing film will be cofired with other layers. For example, a multi-layer capacitor is manufactured by forming a stack of multiple alternating layers of ceramic substrate (often based on a titanate, such as barium titanate or neodymium titanate) and solid residue of the thick film paste. The entire stack is then fired together in a single firing. Some processes use high firing temperatures (generally above about 800° C.) and some processes use low firing temperatures (generally below about 700° C.). Also, the ceramic substrates for firing are most often low temperature cofire ceramics.

The thick film slurry, or paste, typically includes the particles of the silver-containing powder dispersed in a liquid vehicle, which acts as a carrier liquid and is often referred to as a solvent. Paste compositions are well known in the art and can have a reasonably complex chemistry, including solvents, binders and other additives to aid in the dispersion and flow properties of the paste. The silver-containing powder of the present invention may be substituted for silver-containing particles currently used in thick film paste compositions, without significant modification of the paste formulation. Pastes manufactured with the silver-containing powder of the present invention will, however, exhibit improved performance due to the superior properties of the powder, as discussed previously. In addition to silver-containing powder, and a solvent, the pastes of the present invention typically include a binder, a thickener or resin, a stabilizing agent and a wetting agent. The relative quantities of binders, thickeners, solvents, stabilizing agents and wetting agents are known in the art and will vary depending upon the specific application. The binder can be, for example, a glass frit which controls the sintering characteristics of the film. The thickener imparts a desired viscosity to the paste and also acts as a binding agent in the unfired film. Examples of thickeners include ethyl cellulose and polyvinyl acetates. The liquid carrier/solvent assists in mixing or the components into a homogenous paste and evaporates rapidly upon application of the film. Usually the solvent is a volatile liquid such as methanol, ethanol, other alcohols or the like. The stabilizing agents prevent oxidation and degradation, stabilize the viscosity or buffer the pH of the paste.

The silver-containing powder of the present invention exhibits good dispersibility of particles in a paste due to the narrow particle size distribution, a low degree of particle agglomeration and spheroidal particle shape. Improved dispersion in the paste results in smoother prints, having fewer lump counts, and sharper print edges. The dispersibility and flowability may be further improved, however, if desired. One method for improving the dispersibility is to include in the particles a second material phase, as previously discussed, such as a metal oxide, that improves the dispersibility/flowability of the particles in a paste. Also, silver-containing particles can advantageously be coated with an organic layer to provide improved dispersibility. The organic layer can advantageously be placed, for example, onto a previously formed oxide coating over silver-containing metallic cores. For example, an appropriate organic group could be bonded to a silica coating, or to another oxide coating, through the use or a silane coupling agent. Examples of silanes that could be used as such a coupling agent include halo, amido and alkoxy silanes.

The use of the silver-containing powder of the present invention for thick film applications is particularly preferred for these thick film applications because of ability of the powder to make a high performance thick film with the use of a smaller quantity of silver than with silver-containing powders currently used in thick film applications. This is because of the extremely high quality of the powder of the present invention, as previously described. This result is even more surprising when it is considered that the powder of the present invention can often be made less expensively than powders in current use, resulting in significant cost savings for applications using large quantities of silver. This significant cost savings is particularly surprising considering the higher performance characteristics of the powder.

One significant performance advantage of the silver-containing powder of the present invention is that it can be used to make a very thin thick film with highly definable edges. This is particularly important when reducing device thickness, such as with multi-layer capacitors, or providing an increased density of conductive lines, such as in multi-chip modules, is desirable. In that regard, the thick films made with the present invention, after firing, may be made with a thickness of smaller than about 10 microns, preferably smaller than about 8 microns, more preferably smaller than about 6 microns, and most preferably smaller than about 4 microns.

Furthermore, when making thick film electrically conductive lines, the lines may be made with a sharp edge definition, due to the characteristics of the powder. Lines of a narrow width may be made and with a very close pitch. Lines may be made with a width of smaller than about 55 microns, preferably smaller than about 25 microns, and more preferably smaller than about 15 microns. Line pitch may be smaller than about 100 microns, more preferably smaller than about 50 microns, and most preferably smaller than about 30 microns. The line pitch is the center-to-center spacing of the lines.

To make extremely narrow lines with a small pitch, it is frequently desirable to first deposit lines by thick film techniques and then trim the lines for better edge definition. Trimming may be accomplished by known methods, such as for example laser trimming. A preferred method for obtaining the desired edge definition, however, is to use a photolithographic technique, such as the FODEL™ process of DuPont. For example, the powder may be mixed with a photocurable polymer to permit photolithographic patterning using a mask. Undeveloped areas are removed by use of a solvent. The remaining polymer is then removed when the film is fired.

Another major advantage of the silver-containing powders of the present invention is that they can be made substantially free of organic contaminants, such as surfactants, which are a problem with powders made by liquid precipitation. Because of the absence of such organic contaminants in the particles of the powder, a conductive film of very high conductivity may be prepared, even when the film is in the form of a thin, narrow conductive line as previously described. The high electrical conductivity is further enhanced because of the highly crystalline morphology of silver that may be made with the present invention. Preferably, when maximum conductivity is desired, the film made using silver-containing powder of the present invention has an electrical conductivity of at least about 80%, more preferably at least about 85%, and most preferably at least about 90% of the bulk electrical conductivity of the metallic phase of the film, which may be of pure silver or of silver and one or more other metal, such as in a silver-based alloy. Preferred alloys for conductive lines include palladium or platinum. Such high conductivity lines are particularly important in some devices, such as, for example, cellular telephones and other high frequency applications.

Another significant advantage of using the silver-containing powder of the present invention is that multi-phase particles may be used to alter densification, sintering and other characteristics for improved compatibility with another layer. For example, sintering of a silver-containing metallic phase in the powders may be delayed, and/or adhesion to a substrate improved, by incorporation of one or more other phases. For example, the powder may include multi-phase particles having an intimate mixture of a silver-containing metallic phase and a second phase including silica or another ceramic material. Also, the particles may include a surface coating of a material, such as silica, that delays sintering of a core of a silver-containing metallic phase and also provides enhanced adhesion to a substrate. As one example, the top dielectric layer of multi-chip modules is often a glass layer. Using silver for conductive lines or other features adjoining the glass layer is problematic because at the high sintering temperature of the glass, the silver is highly mobile and will diffuse into the glass. This problem can be somewhat reduced by mixing in some palladium particles with the silver particles, but silver migration is still a problem. The mobility or silver can be significantly reduced if the silver is alloyed with palladium, but the alloy generally does not adhere well to the glass dielectric, which could cause delaminations to occur. With the powder of the present invention, the silver could be in multi-phase particles having a coating or intimate mixture of silica or another adhesion promoting material that also delays sintering of the silver to reduce mobility of silver.

EXAMPLES

The following examples are provided to aid in understanding of the present invention, and are not intended to in any way limit the scope of the present invention.

Example 1

This example demonstrates the preparation of silver-containing particles in which the silver is present in an alloy with palladium.

An aqueous solution is prepared including dissolved palladium and silver as nitrates. The total amount of palladium and silver in the solution is 5 weight percent, with the relative proportions of palladium/silver being 70/30 on a weight basis, so that, if the silver and the palladium fully alloy, a 70/30 Pd/Ag alloy will be obtained in the particles. An aerosol is generated from a single transducer ultrasonic generator operating at a frequency of 1.6 MHz using a carrier gas of nitrogen. Generated aerosols are sent to a furnace to prepare the palladium-containing particles. Reactor temperatures are varied from 900° C. to 1400° C. The samples are cooled and collected.

Several particle samples are subjected to TGA testing in air to evaluate the weight gain of the particles as an indication of susceptibility to palladium oxidation. Also, several particle samples are subjected to atomic absorption spectroscopy (AAS) to estimate the alloy composition. TGA and AAS results are shown in Table 1. The high TGA weight gains indicate that a significant portion of the palladium is susceptible to oxidation, indicating that a significant amount of the palladium is not adequately alloyed with silver. Furthermore, the AAS results indicate that a significant amount of silver does not alloy with the palladium in the particles manufactured at higher temperatures. The TGA information also indicates, however, that oxidation resistance of palladium is very high for particles manufactured at 1000° C. and 1100° C. cases, and is particularly good for the 1000° C. case, indicating the formation of a good alloy between the silver and the palladium. For example, for the particles manufactured at 1000° C., only about 13% of the palladium appears to be susceptible to oxidation, based on the TGA, assuming that all weight gain during the TGA is attributable to palladium oxidation. Also, the AAS data indicates that for the particles manufactured at the lower temperatures, a greater proportion of the available silver alloys with the palladium.

TABLE 1

Example 1
70/30 Pd/Ag Feed

| Reactor Temp. (° C.) | TGA Max. Weight Gain (% of original Pd wt.) | Est. Alloy Composition[1] (Wt. % Ag) |
|---|---|---|
| 900 | 30 | 27.6 |
| 1000 | 13 | |
| 1100 | 25 | 21.3 |
| 1400 | 33 | 15.9 |

[1]Atomic absorption spectroscopy

Figure 61:
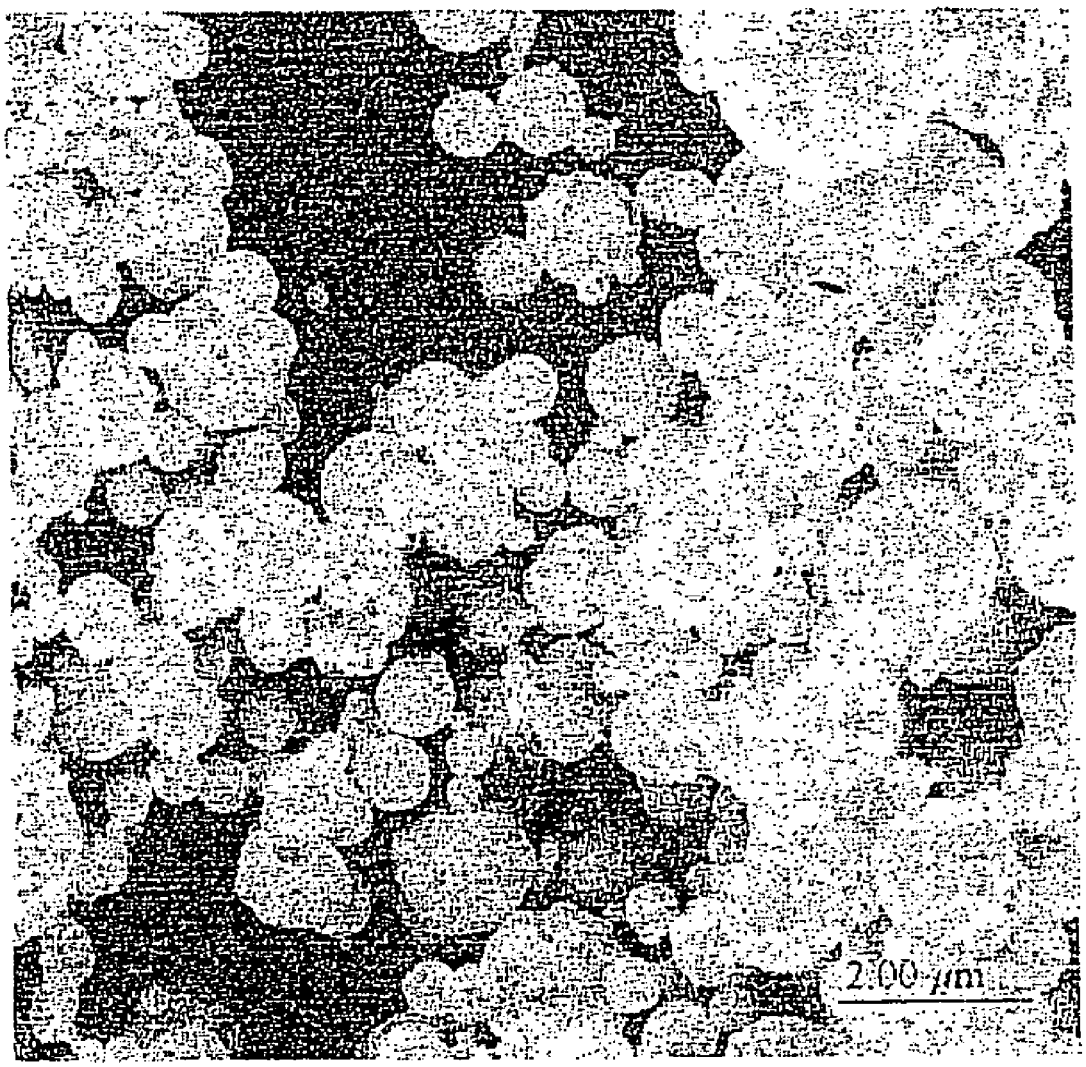
FIG. 61 is a photomicrograph showing palladium/silver alloy particles manufactured at a reactor temperature of 900° C.
Figure 62:
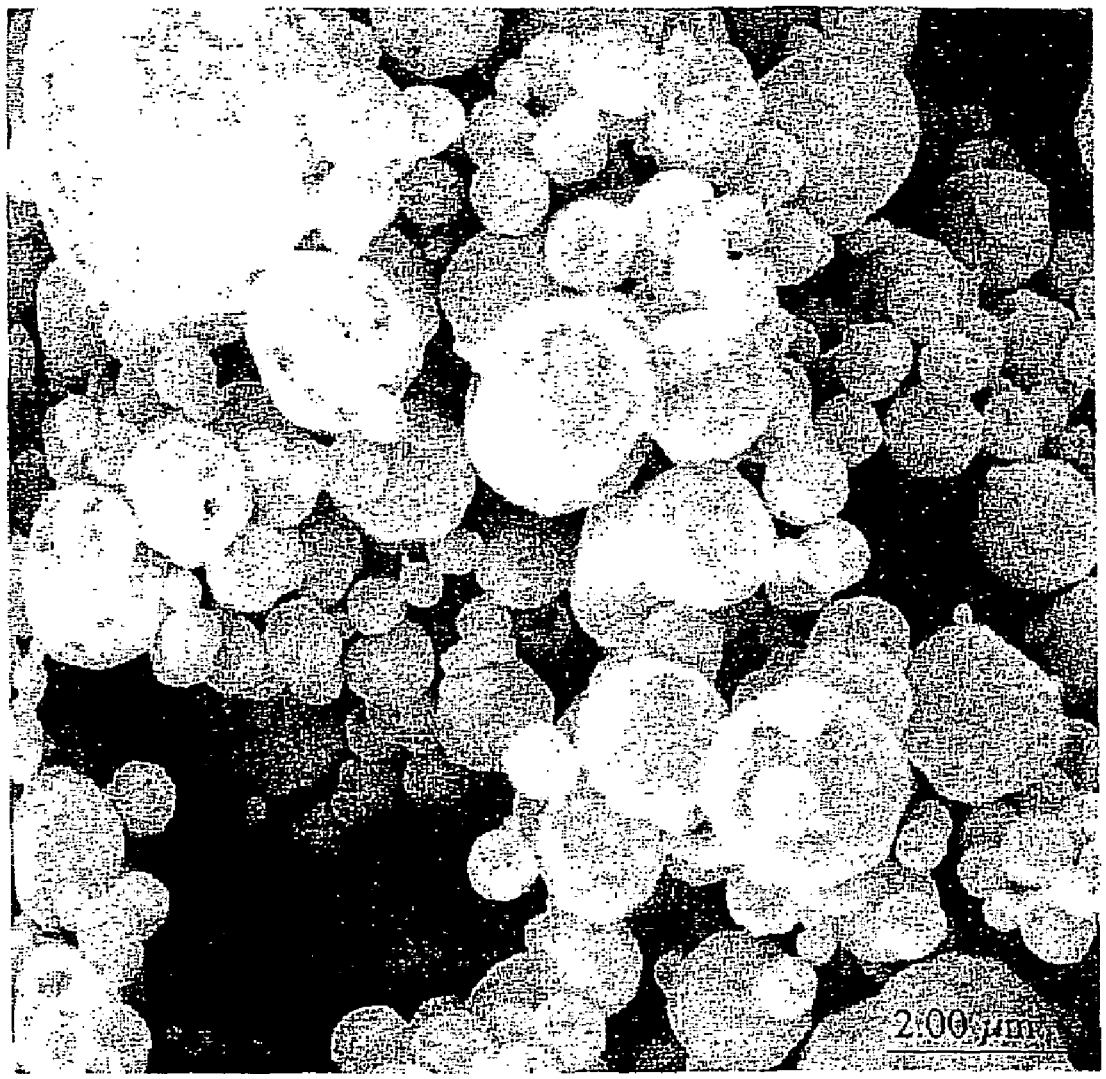
FIG. 62 is a photomicrograph showing palladium/silver alloy particles manufactured at a reactor temperature of 1000° C.
Figure 63:
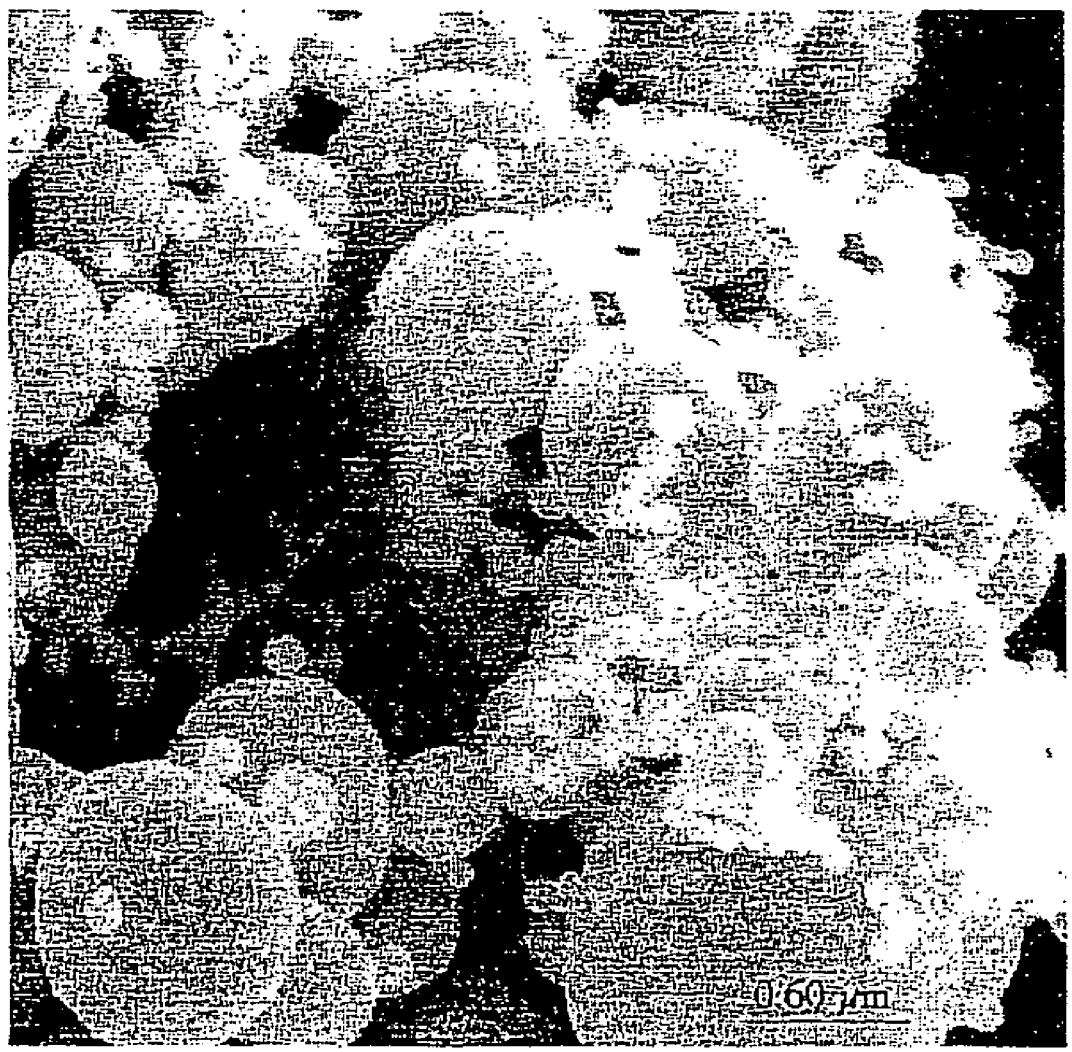
FIG. 63 is a photomicrograph showing palladium/silver alloy particles manufactured at a reactor temperature of 1400° C.

Referring now to FIG. 61, an SEM photomicrograph is shown of the particles produced at 900° C. As seen in FIG. 61, there is significant porosity that appears in the particles, accounting for the low resistance to palladium oxidation indicated by the TGA results at that temperature. FIG. 62 is an SEM photomicrograph showing particles prepared at 1000° C. These particles are significantly more dense and, accordingly, do not exhibit the same susceptibility to oxidation of palladium as samples at 900° C. As the manufacturing temperature increases, a significant amount of ultrafine silver particles is found. These ultrafine silver particles (typically 30-50 nanometers in size) are believed to be formed from the significant quantities of silver that vaporize at higher manufacturing temperatures. This accounts for the low levels of silver found in the palladium/silver alloys, as previously noted for higher manufacturing temperatures. FIG. 63 is an SEM photomicrograph of particles prepared at 1400° C. in which the appearance of significant quantities of the ultrafine particles can clearly be seen. Generally, the loss of silver from the alloy increases with increasing temperature, especially as the temperature approaches the melting range for the desired alloy. In that regard, the melting range for a 70/30 palladium/silver alloy is about 1374.5° C. to about 1431.5° C.

Example 2

This example demonstrates the detrimental effect on palladium oxidation resistance or using air as a carrier gas in the manufacture of particles with a palladium/silver alloy.

Palladium/silver alloy particles are made according to the procedure of Example 1, including a 70/30 Pd/Ag weight ratio in the liquid feed, except that air is used as the carrier gas instead of nitrogen. The particles are manufactured with a reactor temperature of 1000° C.

Based on TGA testing of the particles in air, assuming all weight gain is attributable to palladium oxidation, about 26 percent of the palladium is susceptible to oxidation, or about twice as much as shown in Example 1 when nitrogen is used as the carrier gas.

Example 3

This example demonstrates the addition of calcium to a 70/30 Pd/Ag alloy.

Particles are prepared according to the procedure of Example 1, except that 0.25 weight percent calcium relative to palladium is added in nitrate form to the liquid feed. Particles are produced at a reactor temperature of 1000° C. TGA indicates that about 18 percent of the palladium in the particles is susceptible to oxidation, indicating that the calcium addition has not improved oxidation resistance relative to processing at 1000° C. in the absence of calcium, as shown in Example 1. This result is particularly surprising considering the teachings of U.S. Pat. No. 5,402,305 by Asada describing the beneficial effects of adding calcium to palladium powders.

Example 4

Particles are prepared according to the procedure of Example 1, except that palladium and silver in the feed solution are in a weight ratio of 30/70 Pd/Ag. Particles are prepared at reactor temperatures of 900° C., 1000° C., 1100° C., 1225° C., 1300° C., 1400° C., and 1500° C.

Similar to the results obtained for 70/30 Pd/Ag tests, the 30/70 Pd/Ag test results show that appreciable amounts of silver vaporize during manufacture at higher particle manufacture temperatures, and particularly for those of 1300° C. and above. Again, the segregation of silver becomes a larger problem as the manufacture temperature approaches or exceeds the melting range for the desired alloy. The melting range for an alloy of 30/70 Pd/Ag is from 1164.5° C. to 1209.5° C. This segregation of silver is particularly detrimental for microelectronic thick film applications, because the unalloyed silver is significantly more mobile than alloyed silver and can significantly impair the operation of many microelectronic devices.

Furthermore, for particles prepared significantly below 1000° C., the particles can exhibit significant porosity, which is undesirable. Temperatures or from about 900° C. to 1200° C. are preferred, with temperatures of from about 950° C. to 1100° C. being more preferred for 30/70 Pd/Ag compositions.

Example 5

This example demonstrates preparation of particles made with only silver.

Figure 64:
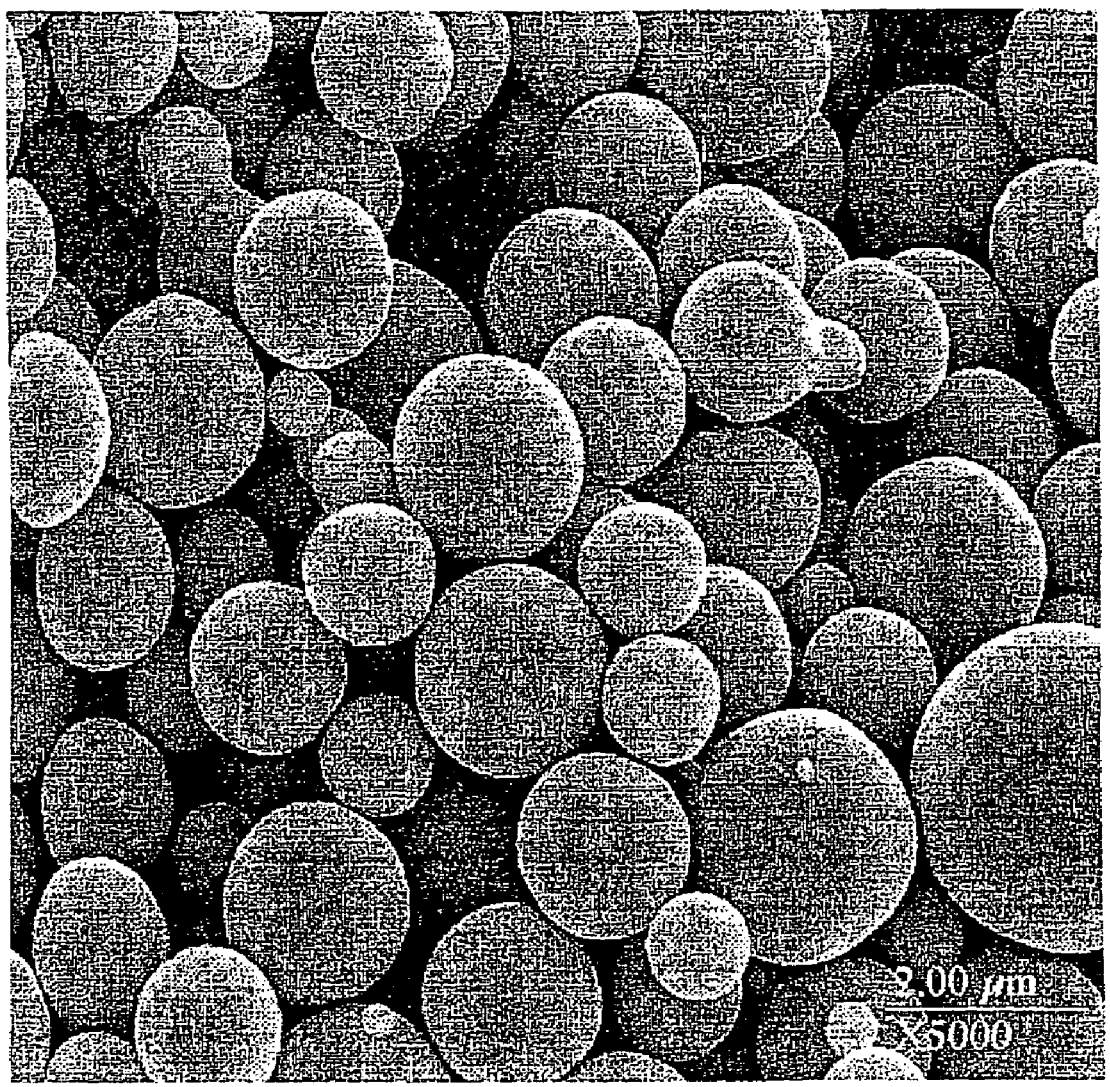
FIG. 64 is a photomicrograph showing silver particles made at a reactor temperature of 1000° C.

Solutions of silver nitrate including 30 weight percent silver by weight are prepared. Aerosols of the solution are generated with an ultrasonic aerosol generator having a single ultrasonic transducer operating at 1.6 MHz and using air as a carrier gas. The aerosols pass through an impactor to remove excessively large droplets and the classified aerosol exiting the impactor is then sent to a hot-wall tubular reactor. Reactor temperatures are varied from 1000° C. to 1400° C. in increments of 100° C. FIG. 64 shows a photomicrograph of particles made at a reactor temperature of 1000° C.

Example 6

This example further demonstrates the preparation of particles including only silver.

Figure 65:
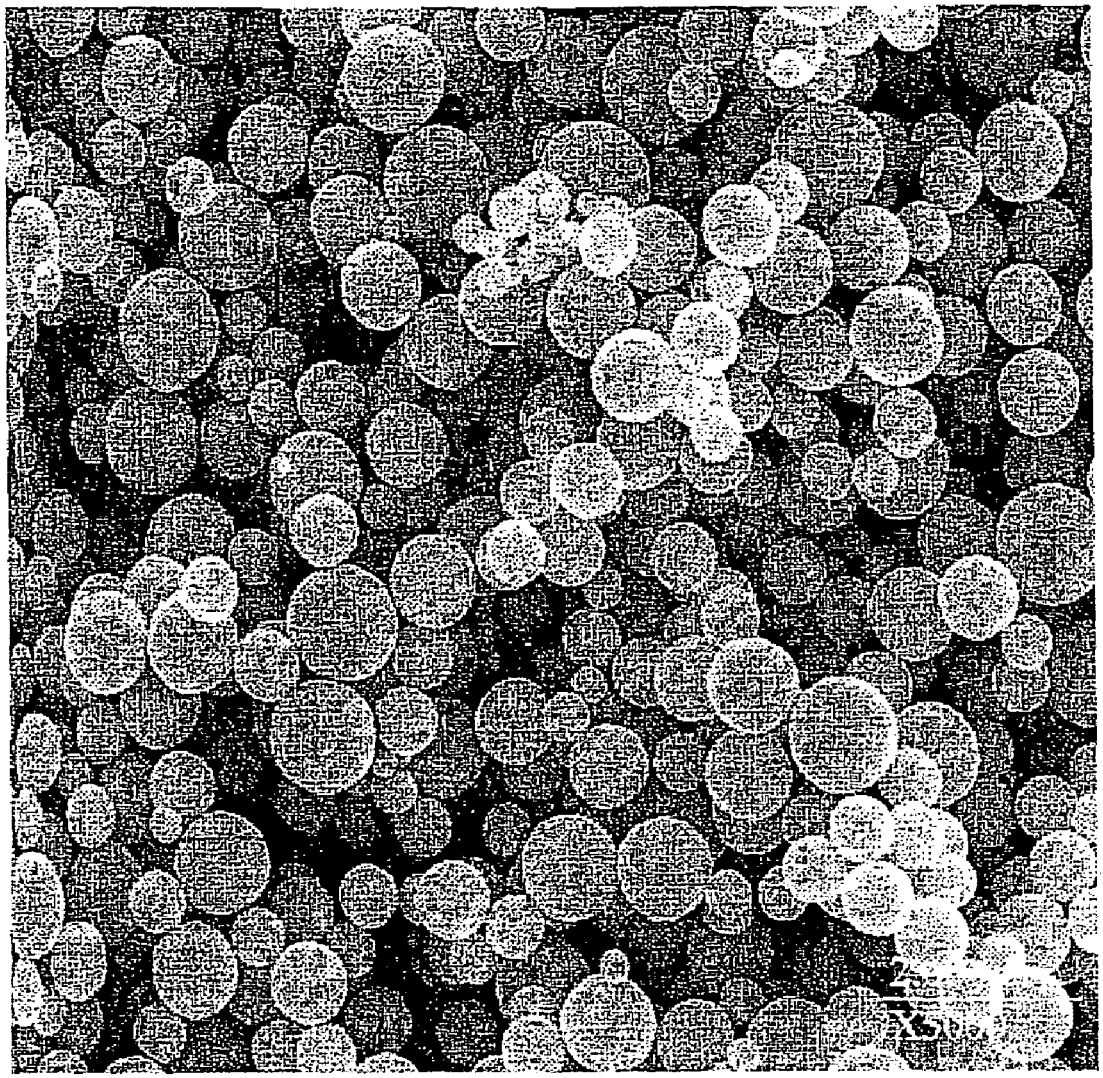
FIG. 65 is a photomicrograph showing silver particles made at a reactor temperature of 1100° C., with a lower concentration of silver in the solution from which the aerosol is made.
Figure 66:
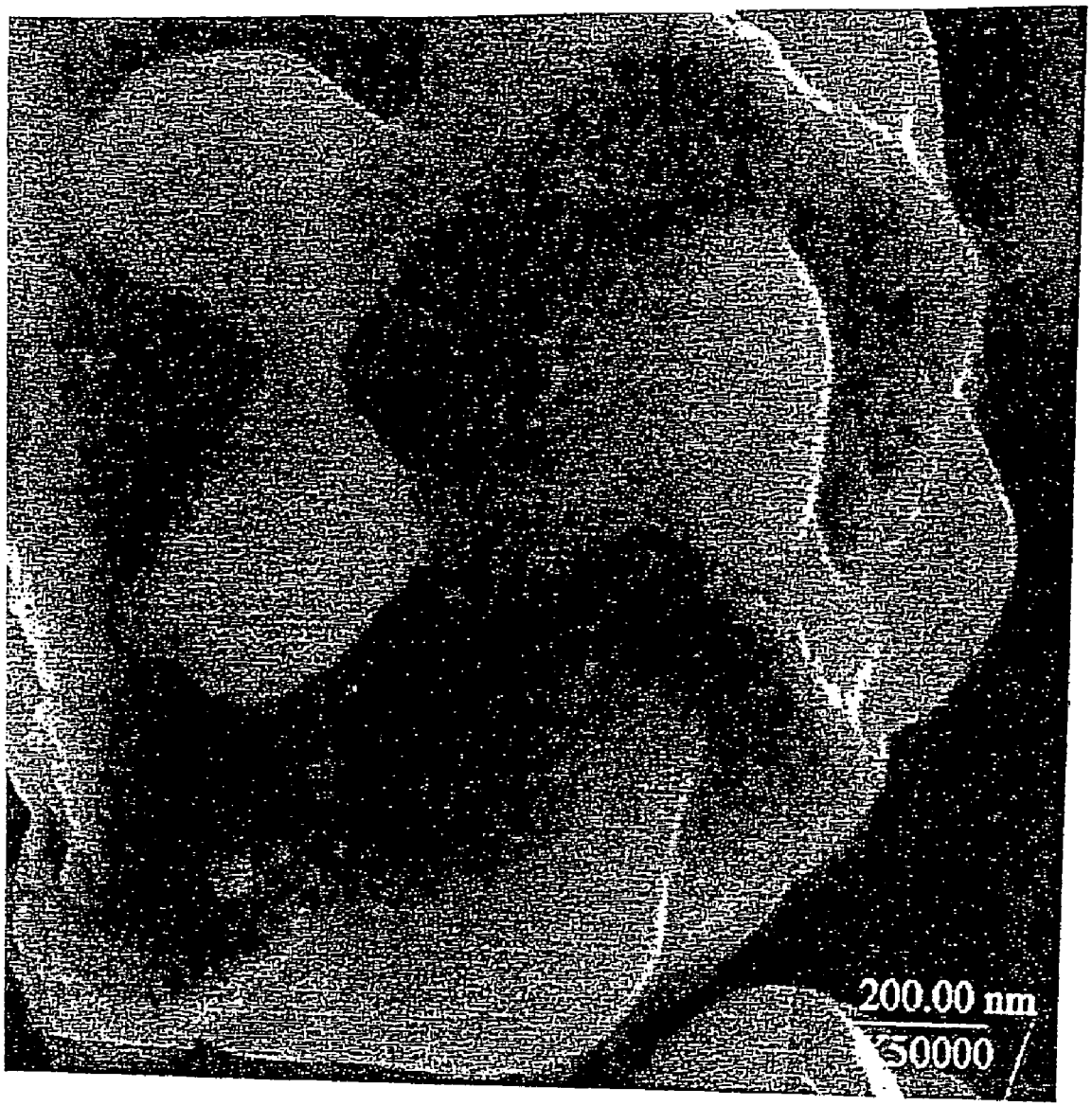
FIG. 66 is a SEM photomicrograph showing a composite particle including 20 weight percent barium titanate and 80 weight percent of a 30:70 Pd:Ag alloy made at a reactor temperature of 1000° C.
Figure 67:
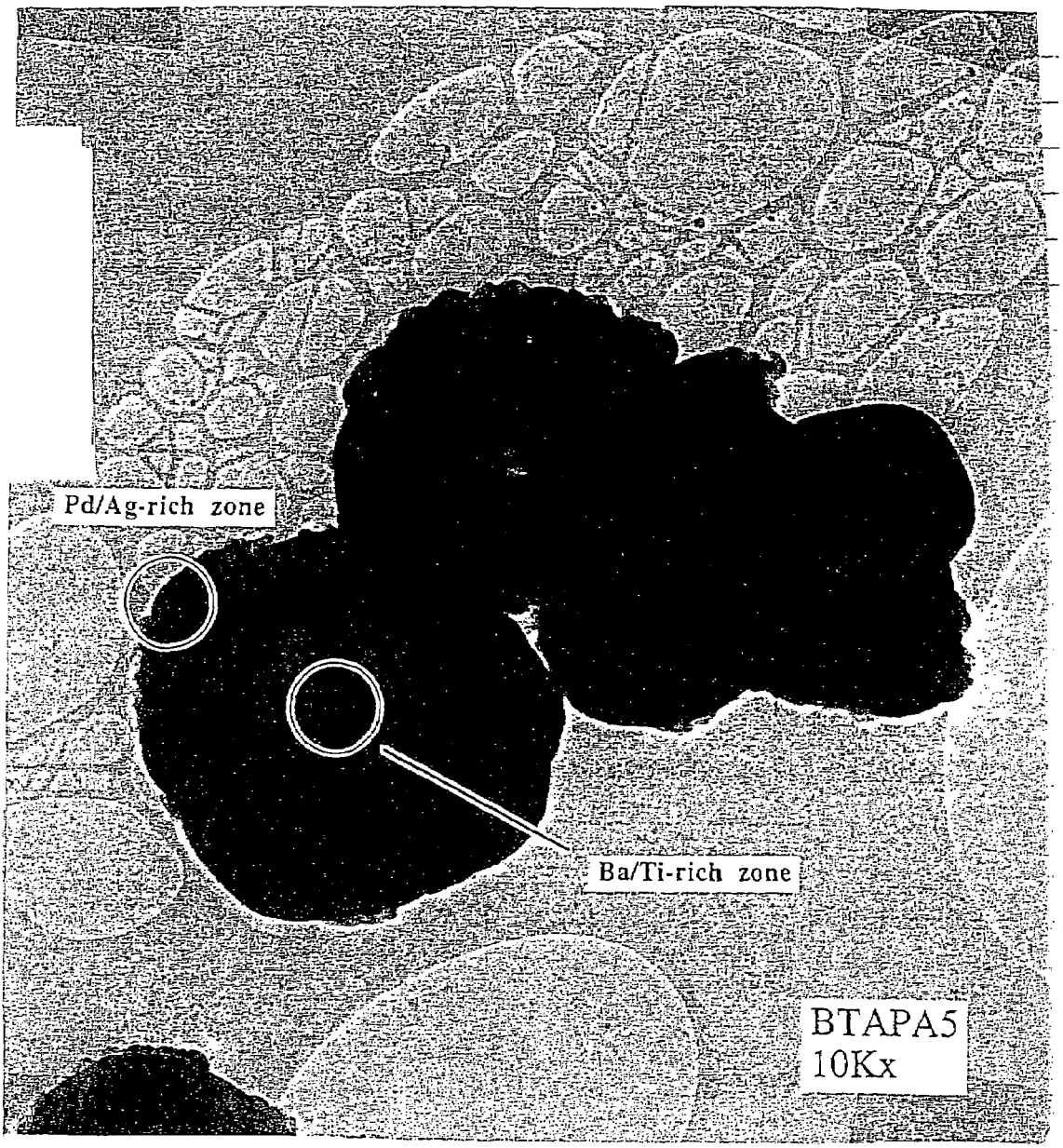
FIG. 67 is a TEM photomicrograph showing composite particles including 20 weight percent barium titanate and 80 weight percent of a 30:70 Pd:Ag alloy made at a reactor temperature of 1000° C.
Figure 68:
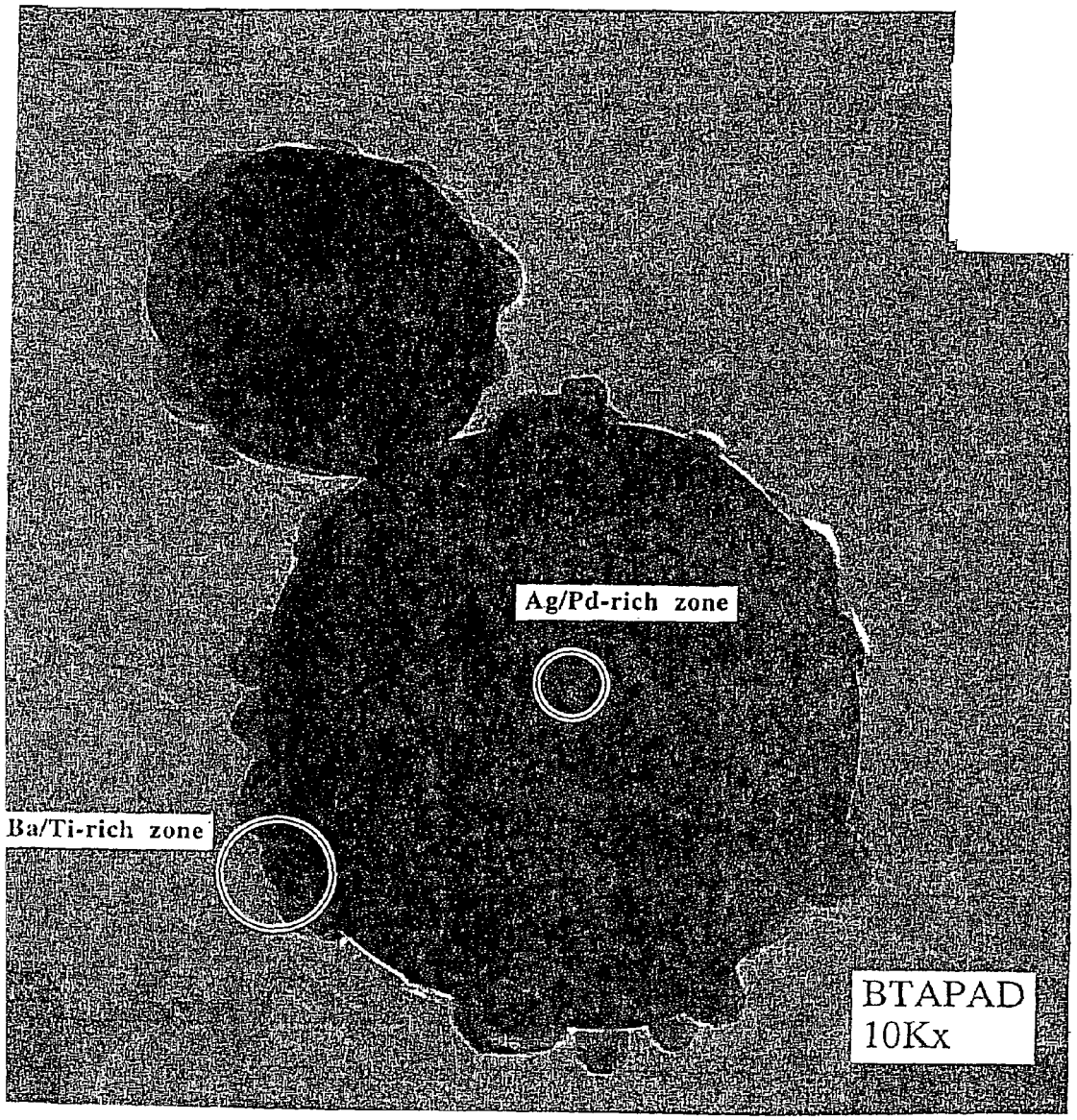
FIG. 68 is a TEM photomicrograph showing composite particles including 5 weight percent barium titanate and 95 weight percent of a 30:70 Pd:Ag alloy made at a reactor temperature of 1000° C.
Figure 69:
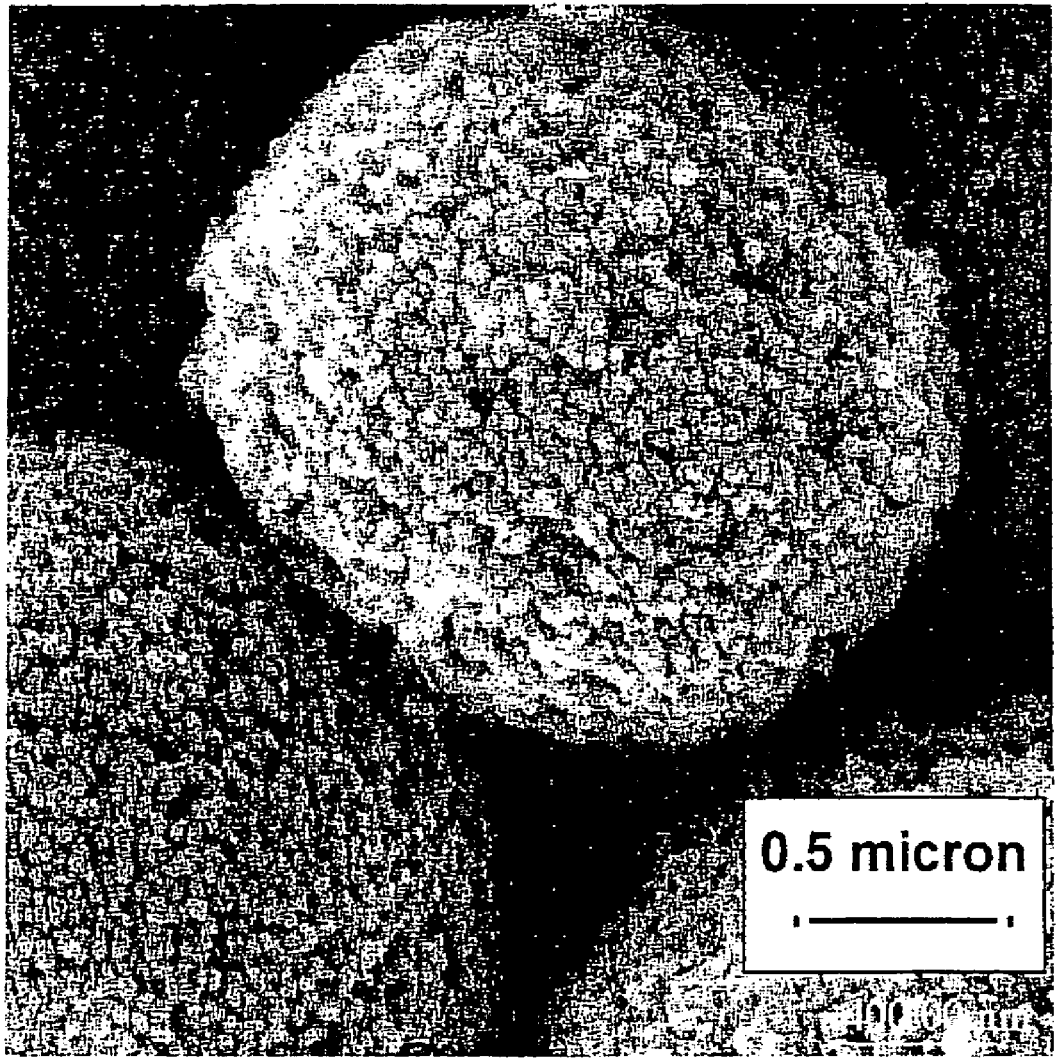
FIG. 69 is an SEM photomicrograph showing composite particles including 93 weight percent carbon and 7 weight percent silver.

The procedure of Example 5 is repeated except that the solution includes silver in an amount of only 3 weight percent. FIG. 65 shows a photomicrograph of particles made at a reactor temperature of 1100° C. Due to the lower concentration of silver in the solution, the particles shown in FIG. 65 are of a substantially smaller weight average particle size than those produced in Example 5. The particles do, however, retain a very desirable, narrow size distribution.

Example 7

This example demonstrates preparation of multi-phase particles including barium titanate and a 30/70 Pd/Ag alloy.

A barium titanate precursor solution is prepared by dissolving 2.8 grams or barium nitrate in 50 milliliters of titanium tetraisopropoxide, with rapid stirring, and finally adding 2 milliliters of concentrated nitric acid.

A Pd/Ag alloy precursor solution is prepared with 2.5 weight percent palladium and silver in a weight ratio of Pd:Ag of 30:70, with the palladium and silver in the form of dissolved nitrates.

Various mixtures are prepared or the barium titanate precursor solution and the Pd/Ag alloy solution for preparation of particles with different relative quantities of the alloy and barium titanate. Compositions include those with from 10 weight percent to 90 weight percent barium titanate in 10 weight percent increments and also a composition including only 5 weight percent barium titanate.

Aerosols are prepared using an ultrasonic aerosol generator including a single ultrasonic transducer operating at 1.6 MHz and with an impactor prior to entry of the aerosol into a furnace reactor where the particles are made. The particles are characterized by powder x-ray diffraction, scanning electron microscopy (SEM), energy dispersive spectroscopy (EDS), thermogravimetric analysis (TGA) and helium pycnometry (for density). Maximum stream temperatures in the furnace are varied from 600° C. to 1100° C. Air is used as a carrier gas.

FIG. 66 shows an SEM photomicrograph of a composite particle including 20 weight percent barium titanate made at 1000° C.

FIG. 67 shows a TEM photomicrograph of composite particles including 20 weight percent barium titanate, made at 1000° C., showing areas indicated by EDS to be rich in the Pd/Ag alloy and areas rich in the barium titanate. FIG. 68 shows a TEM photomicrograph of composite particles including 5 weight percent barium titanate made at 1000° C., showing areas indicated by EDS to be rich in the Pd/Ag alloy and rich in the barium titanate.

Example 8

This example demonstrates preparation of multi-phase particles including silver metal and carbon.

In 20 milliliters of distilled water is dissolved 0.47 gram of silver nitrate, followed by the addition of 20 milliliters of a suspension including 20 weight percent of nano-size carbon black particles in water (Cab-o-Jet™ from Cabot Corp.). The resulting mixture was converted to a aerosol by ultrasonic generation at 1.6 MHz using nitrogen as a carrier gas. The aerosol is processed in a furnace at a temperature of about 500° C. A black powder including silver/carbon black composite particles with an average size of 2 to 3 microns is obtained, as shown in the SEM photomicrograph shown in FIG. 69. Furthermore, the particles include significant porosity, which is preferred for use as an electrode material in an electrochemical cell.

While various specific embodiments of the process of the present invention and the apparatus or the present invention for preparing silver-containing particles are described in detail, it should be recognized that the features described with respect to each embodiment may be combined, in any combination, with features described in any other embodiment, to the extent that the features are compatible. For example, any or all of the aerosol concentrator, aerosol classifier, particle cooler, particle coater, particle modifier and addition of dry gas may be incorporated into the apparatus and/or process of the present invention. Also, additional apparatus and/or process steps may be incorporated to the extent they do not substantially interfere with operation of the process of the present invention or the apparatus useful therefore. For example, to further control the size distribution of particles produced accordingly to the process of the present invention, a particle classifier could be used after particle cooling and before particle collection. Other modifications will become apparent to those skilled in the art. All such modifications are intended to be within the scope of the present invention.

Also, while various embodiments of the present invention have been described in detail, it is apparent that modifications and adaptations of those embodiments will occur to those skilled in the art. It is to be expressly understood, however, that such modifications and adaptations are within the scope of the present invention, as set forth in the claims below. Further, it should be recognized that any feature of any embodiment disclosed herein can be combined with any other feature of any other embodiment in any combination.

What is claimed is:

1. A method for making coated silver-containing particles, the method comprising:

preparing particles comprising a silver-containing material, as prepared the particles are dispersed in a flowing aerosol stream; and after the preparing and while the particles are in the aerosol stream, processing the particles;

wherein the processing comprises forming a coating on the particles, the coating comprising a coating material that is substantially free of silver.

2. The method of claim 1, wherein the coating comprises forming the coating material on the silver-containing particles to a thickness of smaller than 25 nanometers.

3. The method of claim 1, wherein the coating comprises forming the coating material on the silver-containing particles to a thickness of from 10 nanometers to 25 nanometers.

4. The method of claim 1, wherein the coating material comprises from 0.5 to 30 weight percent of the coated silver-containing particles.

5. The method of claim 1, wherein the silver-containing particles are made with a weight average particle size of from 0.1 micron to 5 microns.

6. The method of claim 1, wherein the silver-containing particles are made with a weight average particle size of from 0.1 micron to 2 microns.

7. The method of claim 1, wherein the coating material comprises nickel.

8. The method of claim 7, wherein the coating material is a nickel oxide.

9. The method of claim 7, wherein the coating material is metallic nickel.

10. The method of claim 1, wherein the coating material is an oxide material.

11. The method of claim 1, wherein the coating material is an oxide of a member selected from the group consisting of zinc, barium, molybdenum, manganese, vanadium, niobium, tantalum, tungsten, iron, chromium, cobalt, copper, iridium, beryllium, thorium and gadolinium.

12. The method of claim 1, wherein the coating material is selected from the group consisting of alumina, titania, zirconia, yttria, an oxide of copper, an oxide of bismuth, an oxide of neodymium, an oxide of calcium, an oxide of magnesium, an oxide of barium, an oxide of strontium and an oxide of tin.

13. The method of claim 1, wherein the coating material is selected from the group consisting of a silicate, a titanate, a zirconate, an aluminate, a borate, a niobate, a tantalate and combinations thereof.

14. The method of claim 1, wherein the coating material is a glass material.

15. The method of claim 1, wherein the coating material is a ceramic material.

16. The method of claim 15, wherein the ceramic material is a carbide.

17. The method of claim 15, wherein the ceramic material is a nitride.

18. The method of claim 17, wherein the nitride is silicon nitride.

19. The method of claim 1, wherein the preparing the silver-containing particles comprises heating the aerosol stream in a thermal reactor.

20. The method of claim 19, wherein the thermal reactor is a furnace reactor.

21. The method of claim 19, wherein the thermal reactor is a flame reactor.

22. The method of claim 19, wherein the thermal reactor is a plasma reactor.

23. The method of claim 1, wherein the coating comprises introducing a vapor phase precursor for the coating material into the aerosol stream.

24. The method of claim 1, wherein the coating comprises passing the aerosol stream through a perforated conduit while introducing a vapor phase precursor for the coating material into the conduit through openings in a wall of the perforated conduit.

25. The method of claim 24, wherein during the introducing, the vapor phase precursor enters into the perforated conduit in a radial direction around an entire periphery of the perforated conduit.

26. The method of claim 1, wherein the coating comprises forming a layer of the coating material on the silver-containing particles by physical vapor deposition.

27. The method of claim 26, wherein the coating material is an organic material.

28. The method of claim 26, wherein the coating material is an elemental metal.

29. The method of claim 28, wherein the elemental metal is selected from the group consisting of elemental gold and elemental copper.

30. The method of claim 1, wherein the coating comprises forming a layer of the coating material on the silver-containing particles by gas-to-particle conversion.

31. The method of claim 1, wherein the coating comprises forming a layer of the coating material on the silver-containing particles by chemical vapor deposition.

32. The method of claim 31, wherein the chemical vapor deposition comprises reacting a vapor phase, inorganic precursor.

33. The method of claim 31, wherein the chemical vapor deposition comprises reacting a vapor phase, metal organic precursor.

34. The method of claim 31, wherein the chemical vapor deposition comprises reacting a vapor phase, organometallic precursor.

35. The method of claim 31, wherein the chemical vapor deposition comprises reacting a vapor phase precursor selected from the group consisting of a metal formate, metal acetate, metal oxalate, metal carboxylate, metal alkyl, metal aryl, metal alkoxide, metal ketonate, metal amide, metal hydride, metal oxyhalide, metal halide and combinations thereof.

36. The method of claim 31, wherein the chemical vapor deposition comprises reacting a vapor phase precursor selected from the group consisting of a metal chloride, a metal bromide and combinations thereof.

37. The method of claim 31, wherein the chemical vapor deposition comprises reacting a vapor phase, metal beta-diketonate precursor.

38. The method of claim 31, wherein the coating material comprises silica and the chemical vapor deposition comprises reacting a vapor phase, silane precursor.

39. The method of claim 1, wherein the silver-containing particles comprise a silver-containing metallic phase and the coating material is nonmetallic.

40. The method of claim 39, wherein the silver-containing metallic phase is selected from the group consisting of silver metal and a silver-containing alloy.

41. The method of claim 39, wherein the silver-containing particles are single phase particles consisting essentially of the metallic phase.

42. The method of claim 39, wherein the silver-containing particles are multi-phase particles comprising the silver-containing metallic phase as a first material phase and also comprising a second material phase that is different than the first material phase.

43. The method of claim 42, comprising:
prior to the preparing, generating the aerosol stream, the generating comprising sweeping away with carrier gas droplets of a flowable medium as the droplets are released from a reservoir of the flowable medium ultrasonically energized by a plurality of ultrasonic transducers underlying the reservoir;
the flowable medium comprising liquid, a first precursor for the first material phase and a second precursor for the second material phase; and
the preparing comprising removing at least a portion of the liquid from the droplets by vaporization at elevated temperature and forming the silver-containing particles.

44. The method of claim 43, comprising:
after the forming, cooling the aerosol stream, the cooling comprising passing the aerosol stream through a perforated conduit while introducing a quench gas into the perforated conduit through openings in a wall of the perforated conduit.

45. A method of making a silver-containing product feature, the method comprising:
making the coated silver-containing particles according to the method of claim 1, and
after the making, processing the coated silver-containing particles to make a product feature comprising silver from the coated silver-containing particles.

46. The method of claim 45, wherein the processing comprises making a silver-containing film comprising silver from the coated silver-containing particles.

47. The method of claim 46, wherein the silver-containing film is electrically conductive.

48. The method of claim 45, wherein the processing comprises applying a slurry or paste including the coated silver-containing particles to a substrate.

49. The method of claim 45, wherein the product feature is a line of film having a thickness of smaller than 4 microns and a width of smaller than 15 microns.

50. The method of claim 45, wherein the product feature is a metalized termination on an electronic component.

51. The method of claim 45, wherein the product feature is a circuit interconnection on a circuit board.

52. The method of claim 45, wherein product feature is a resistive line of a surge resistor.

53. The method of claim 45, wherein the product feature is an electrode of an electrochemical cell.

54. The method of claim 45, wherein the product feature is an internal electrode of a multi-layer capacitor.

55. The method of claim 45, wherein the product feature is an address electrode of a flat panel display.

56. The method of claim 45, wherein the product feature is an electromagnetic shield to prevent interference between electronic components.

57. The method of claim 45, wherein the product feature is a thermally conductive film located adjacent an electronic component to assist in the cooling of the electronic component during operation.

58. The method of claim 45, wherein the product feature is a light reflecting surface.

59. The method of claim 45, wherein the product feature is a light reflecting surface to provide back-lighting in a liquid crystal display panel.

60. The method of claim 1, comprising:

prior to the preparing, generating the aerosol stream, the aerosol stream as generated comprising droplets of liquid, the liquid comprising a precursor for the silver-containing particles; and the preparing comprises removing at least a portion of the liquid from the droplets.

61. The method of claim 60, wherein during the generating, the droplets are formed by a spray nozzle.

62. The method of claim 60, wherein the precursor is dissolved in the liquid in the droplets.

63. The method of claim 62, wherein the precursor is a silver salt.

\* \* \* \* \*